United States Patent
Sasaki et al.

(10) Patent No.: US 8,426,947 B2
(45) Date of Patent: Apr. 23, 2013

(54) LAMINATED SEMICONDUCTOR WAFER, LAMINATED CHIP PACKAGE AND METHOD OF MANUFACTURING THE SAME

(75) Inventors: Yoshitaka Sasaki, Milpitas, CA (US); Hiroyuki Ito, Milpitas, CA (US); Atsushi Iijima, Hong Kong (CN)

(73) Assignees: Headway Technologies, Inc., Milpitas, CA (US); SAE Magentics (H.K.) Ltd., Hong Kong (CN)

( * ) Notice: Subject to any disclaimer, the term of this patent is extended or adjusted under 35 U.S.C. 154(b) by 235 days.

(21) Appl. No.: 12/848,569

(22) Filed: Aug. 2, 2010

(65) Prior Publication Data
US 2012/0025354 A1   Feb. 2, 2012

(51) Int. Cl.
*H01L 23/544*   (2006.01)

(52) U.S. Cl.
USPC ........... 257/620; 257/622; 257/684; 257/686; 257/E25.006; 257/E21.614; 438/455

(58) Field of Classification Search .................... 257/74, 257/618, 620, 622, 684, 686, 688, 692, 693, 257/723, 772, 777, E25.006, E25.013, E23.011, 257/E23.012, E23.039, E23.114, E21.614; 438/3, 26, 33, 42, 107, 109, 113, 455, 458, 438/460, 461, 462, 953
See application file for complete search history.

(56) References Cited

U.S. PATENT DOCUMENTS

| | | | |
|---|---|---|---|
| 5,953,588 A | 9/1999 | Camien et al. | |
| 7,127,807 B2 | 10/2006 | Yamaguchi et al. | |
| 7,192,805 B2 * | 3/2007 | Jobetto | 438/114 |
| 2004/0101993 A1 * | 5/2004 | Salmon | 438/107 |
| 2007/0018320 A1 * | 1/2007 | Tanida et al. | 257/737 |

FOREIGN PATENT DOCUMENTS

JP    A-2010-103574    5/2010

OTHER PUBLICATIONS

Gann, "Neo-Stacking Technology," HDI Magazine, Dec. 1999, Irvine Sensors Corporation.

* cited by examiner

*Primary Examiner* — Eduardo A Rodela
(74) *Attorney, Agent, or Firm* — Oliff & Berridge, PLC

(57) ABSTRACT

In a laminated semiconductor substrate, a plurality of semiconductor substrates are laminated. Each of the semiconductor substrate has a plurality of scribe-groove parts formed along scribe lines. Further, each of the semiconductor substrate has a plurality of device regions insulated from each other and has a semiconductor device formed therein. Further, an uppermost substrate and a lowermost substrate have an electromagnetic shielding layer formed using a ferromagnetic body. The electromagnetic shielding layer is formed in a shielding region except the extending zone. The extending zone is set a part which the wiring electrode crosses, in a peripheral edge part of the device region.

22 Claims, 43 Drawing Sheets

Fig.12
(A)
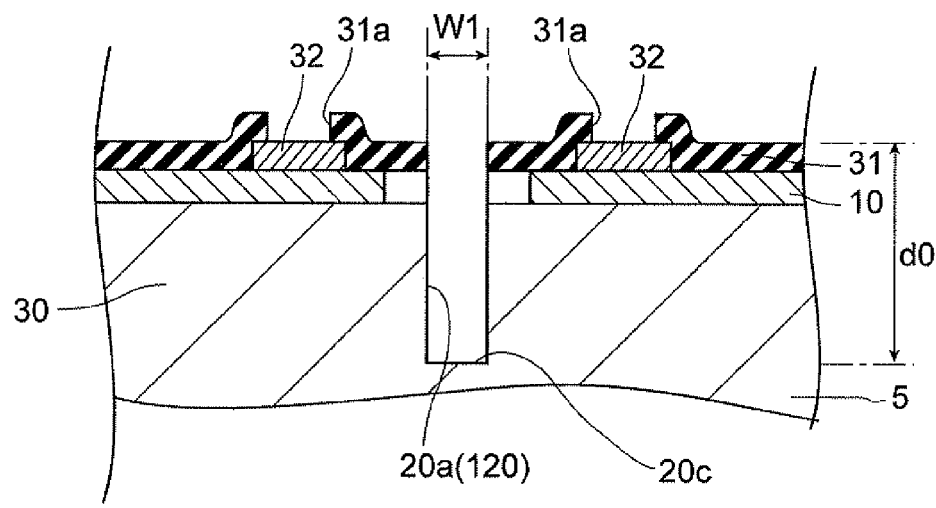
(B)
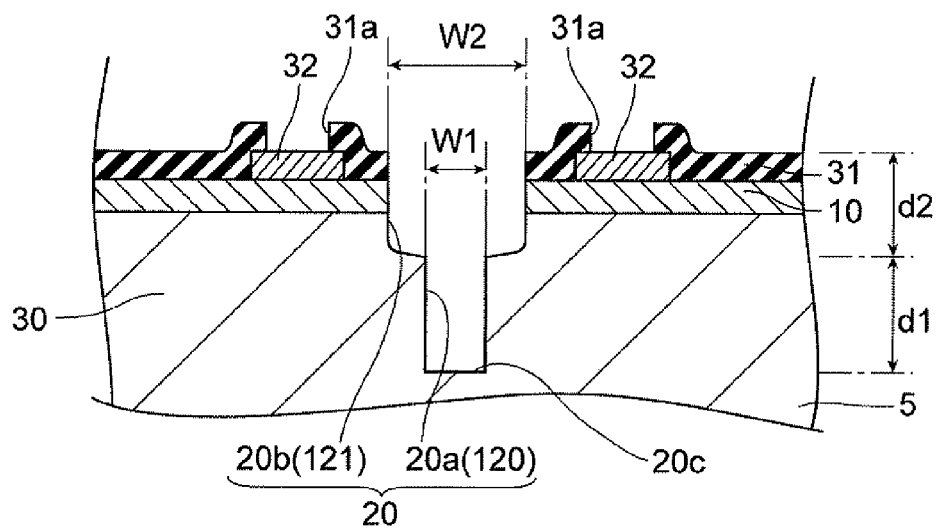

Fig.13
(A)
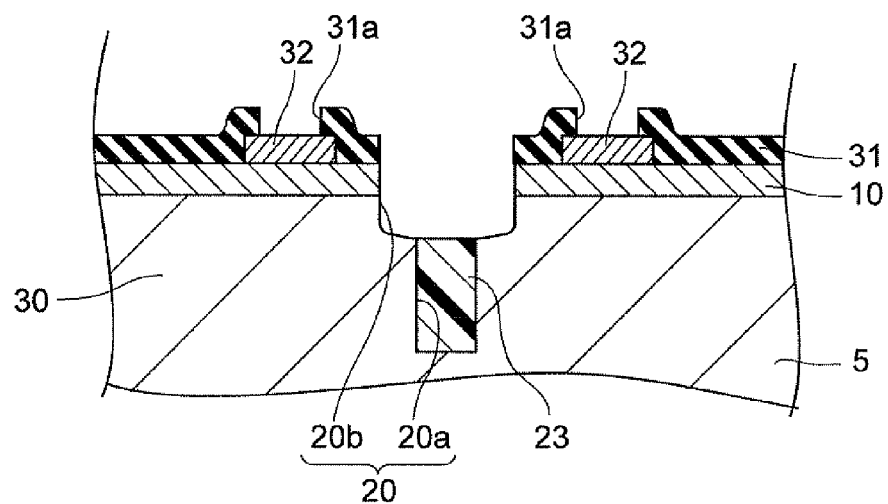
(B)
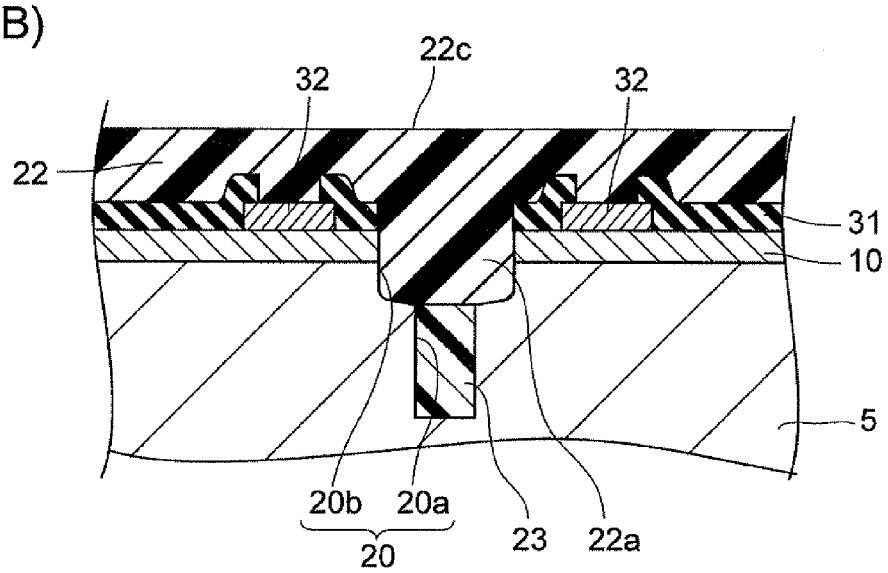

LAMINATED SEMICONDUCTOR WAFER, LAMINATED CHIP PACKAGE AND METHOD OF MANUFACTURING THE SAME

BACKGROUND

1. Field of the Invention

The present invention relates to a laminated semiconductor substrate for manufacturing a laminated chip package including a plurality of laminated semiconductor chips, a laminated chip package and a method of manufacturing the same.

2. Related Background Art

In recent years, electronic devices such as cellular phones and notebook personal computers need to be reduced in weight and improved in performance. With such needs, higher integration of electronic components used for the electronic devices has been required. Further, the higher integration of electronic components has been required also for increase in capacity of a semiconductor memory device.

Recently, System in Package (hereinafter referred to as a "SIP") has attracted attention as a highly integrated electronic component. The SIP is a device created by stacking a plurality of LSIs and mounting them in one package, and a SIP using the three-dimensional mounting technique of laminating a plurality of semiconductor chips has received attention recently. Known as such a SIP is a package having a plurality of laminated semiconductor chips, that is, a laminated chip package. The laminated chip package has an advantage that speed up of operation of circuits and reduction in stray capacitance of wiring become possible because the length of the wiring can be reduced as well as an advantage of capability of high integration.

Known as the three-dimensional mounting techniques for manufacturing the laminated chip package include a wire bonding system and a through electrode system. The wire bonding system is a system of laminating a plurality of semiconductor chips on a substrate and connecting a plurality of electrodes formed on each of the semiconductor chips and external connecting terminals formed on the substrate by wire bonding. The through electrode system is a system of forming a plurality of through electrodes in each of the laminated semiconductor chips and realizing wiring between the respective semiconductor chips by the through electrodes.

The wire bonding system has a problem of a difficulty in reducing the spaces between the electrodes in a manner that the wires are not in contact with each other, a problem of a difficulty in speeding up the operation of circuits because of a high resistance value of wires, and a problem of a difficulty in reducing the thickness.

Though the above-described problems in the wire bonding system are solved in the through electrode system, the through electrode system has a problem of increased cost of the laminated chip package because many processes are required for forming the through electrodes in each of the semiconductor chips.

Conventionally known methods of manufacturing the laminated chip package are those disclosed, for example, in U.S. Pat. No. 5,953,588 (referred also to as patent document 1) and U.S. Pat. No. 7,127,807 B2 (referred also to as patent document 2), for example. In the patent document 1, the following manufacturing method is described. In this manufacturing method, first, a plurality of semiconductor chips cut out of a wafer are embedded in an embedding resin. Then, a plurality of leads to be connected to the semiconductor chips are formed to create a structure called Neo-Wafer. Subsequently, the Neo-Wafer is cut to create a plurality of structures called Neo-chips each including the semiconductor chip, the resin surrounding the semiconductor chip, and the plurality of leads. In this event, end faces of the plurality of leads connected to the semiconductor chips are exposed on side surfaces of the Neo-chips. Then, a plurality of kinds of Neo-chips are laminated to create a laminated body. In this laminated body, the end faces of the plurality of leads connected to the semiconductor chips at the respective layers are exposed on the same side surface of the laminated body.

Keith D. Gann, "Neo-Stacking Technology", HDI Magazine, December, 1999 (referred also to as non-patent document 1) describes that a laminated body is formed by the same method as the manufacturing method described in Patent document 1 and wiring is formed on two side surfaces of the laminated body.

On the other hand, Patent document 2 discloses a multi-layer module which is configured by laminating a plurality of active layers made by forming one or more electronic elements and a plurality of conductive traces on a flexible polymer substrate.

SUMMARY OF THE INVENTION

Incidentally, the laminated chip package is manufactured by the following procedure. First, a semiconductor wafer having a plurality of devices formed therein is created by performing wafer process. Then, a plurality of groove parts along scribe lines are formed in the semiconductor wafer. Further, a resin such as an epoxy resin, a polyimide resin or the like is embedded in the groove parts to form insulating layers to thereby create a substrate with groove. Such substrate with groove are bonded together with an insulating adhesive to create a laminated semiconductor substrate. The laminated semiconductor substrate is cut along the groove parts to manufacture laminated chip packages.

Meanwhile, in the laminated chip package, a plurality of semiconductor chips are stacked one on the other. When the laminated semiconductor substrate is cut along the groove parts, the substrate with groove are also cut along the groove parts. Members in a plate shape formed by cutting the substrate with groove along the groove parts are the semiconductor chips.

For manufacturing the laminated chip package, many processes including a diffusing process, a semiconductor inspection process and so on need to be performed. In these processes, an enormous number of apparatuses such as the etching apparatus, the exposure apparatus, the inspection apparatus and so on are used. These apparatuses use electric power as the power source and thus radiate some electromagnetic waves to the outside.

For this reason, all of the semiconductor wafer being the material of the laminated chip package, the partially manufactured laminated semiconductor substrate, and the completed laminated chip package are placed under the external environment in which some electromagnetic waves exist, and the laminated chip package is manufactured under the external environment in which some electromagnetic waves exist.

However, in the laminated chip package disclosed in the above patent documents or in the above non-patent document, measures for avoiding the influence of the electromagnetic waves existing in the external environment are not implemented. Therefore, the influence of the electromagnetic waves existing in the external environment can be exerted on the completed laminated chip package.

Accordingly, any of the completed laminated chip package as well as the partially manufactured wafer and the individual semiconductor chip is likely to take the influence of the electromagnetic waves. The laminated chip package disclosed in the above patent documents or in the above non-patent document has a problem of being likely to take the influence of the electromagnetic waves for a long time. This may cause, for example, mixture of noise by the influence of the electromagnetic waves into the signal flowing through the wiring layer of each semiconductor chip. When the noise mixes into the signal flowing through the wiring layer, the waveform of the signal can vary to cause, for example, the effect that misjudgment will be made in the inspection process.

In this regard, there is an idea that the influence of the electromagnetic waves is avoided by a conductive film as in the semiconductor chip described in JP 2010-103574 (also referred to as the patent document 3). However, the conductive film disclosed in the patent document 3 has a structure covering substantially the whole semiconductor chip. Therefore, if the conductive film is formed on the above-described laminated chip package, the conductive film will be formed after a plurality of semiconductor chips are laminated. The conductive film can shield against the electromagnetic waves after the plurality of semiconductor chips are laminated, but cannot avoid the influence of the electromagnetic waves exerted on the individual semiconductor chips as well as the wafer at the pre-lamination stage.

Meanwhile, the patent document 3 discloses that a shielding metal film is formed on the entire single surface of a wafer before semiconductor chips are cut out of it. However, in a formation of such shielding metal film, there is a following problem.

As has been described, the laminated chip package is manufactured by cutting the laminated semiconductor substrate along the groove parts. In the laminated chip package, the semiconductor chips which are laminated one on the other have to be electrically connected to one another. To implement such connection, electrodes for connection (connection electrodes) may be formed on the side surface of the laminated chip package in some cases. Further, to connect the semiconductor chips by the connection electrodes, the electrodes (also referred to as wiring electrodes) provided in the respective semiconductor chips may be formed to appear at a cut surface when the laminated semiconductor substrate is cut along the groove part in some cases.

However, the laminated wafers are cut along the groove part when the laminated semiconductor substrate is cut along the groove part, so that if the shielding metal film is formed on the entire single surface of the wafer, the shielding metal film is also cut along the groove part. Therefore, the sections of the shielding metal films also appear together with the wiring electrodes at the cut surface. Thus, when connection electrodes are formed to connect the wiring electrodes, the shielding metal films are also connected to the connection electrodes. This results in that the connection electrodes are connected to each other via the shielding metal films, which is inconvenient in operating the laminated chip package.

Further, the conductive film described in the patent document 3 is formed by applying a conductive paint. Therefore, this conductive film could not sufficiently shield against the magnetic field. To avoid the influence of the electromagnetic waves, it is preferable to shield against not only the electric field but also the magnetic field. However, the conventional technique described in the patent document 3 could not shield against the magnetic field, and could not achieve a sufficient effect of shielding against the electromagnetic waves.

As described above, in the conventional techniques, it is very difficult to achieve a sufficient effect of shielding against the electromagnetic waves for a long time from the wafer stage to the post-completion stage of the laminated chip package which the connection electrodes formed on its side surface while avoiding the situation that the connection electrodes are electrically connected to the shielding layer for shielding against the electromagnetic waves.

The present invention is made to solve the above problem, and it is an object to achieve the effect of shielding against the electromagnetic waves for a long time from the wafer stage to the post-completion stage while avoiding the situation that connection electrode is electrically connected to a shielding layer to thereby enhance the shielding effect and sufficiently avoid the influence of the electromagnetic waves, in a laminated semiconductor substrate for manufacturing a laminated chip package which a connection electrode is formed on its side surface, a laminated chip packaged and manufacturing methods of the same.

To solve the above problem, the present invention is a laminated semiconductor substrate laminated a plurality of semiconductor substrates having a plurality of scribe-groove parts formed along scribe lines, the plurality of semiconductor substrates each including: a plurality of device regions insulated from each other, each of which is in contact with at least one of the plurality of scribe-groove parts and has a semiconductor device formed therein; a wiring electrode connected to the semiconductor device formed in each of the device regions and extending from the device region to the inside of the scribe-groove part, when a part, in a peripheral edge part of the device region along the scribe-groove part, which the wiring electrode crosses is an extending zone, each of an uppermost substrate laminated on the top side and a lowermost substrate laminated on the bottom side in the plurality of semiconductor substrates has an electromagnetic shielding layer formed using a ferromagnetic body, and the electromagnetic shielding layer is formed in a shielding region except the extending zone on a first surface, in surfaces of the semiconductor substrate, where the plurality of device regions are formed.

In this laminated semiconductor substrate, the electromagnetic shielding layer is formed in the shielding region, so that the electromagnetic shielding layer do not appear in a cut surface when the laminated semiconductor substrate is cut along the groove parts. Further, because the uppermost substrate and the lowermost substrate each have the electromagnetic shielding layer, at least these two substrates are shielded from the electromagnetic waves from the stage of the semiconductor substrates. Further, the electromagnetic shielding layers of the uppermost substrate and the lowermost substrate shield against the electromagnetic waves from the stage of the semiconductor substrate to the post-completion stage. The electromagnetic shielding layer is formed using a ferromagnetic body and thus makes lines of magnetic force likely to pass through it and the electromagnetic waves likely to detour round the electromagnetic shielding layer.

In the above-described laminated semiconductor substrate, it is preferable that the wiring electrode has an extended terminal part extending from the device region to the inside of the scribe-groove part, and an electrode pad wider in width than the extended terminal part disposed in the device region and formed at a part of the extended terminal part, and when a part, in the peripheral edge part, where the electrode pad is disposed is a pad zone, a region of the first surface except the extending zones and the pad zones are set to be the shielding regions.

In this laminated semiconductor substrate, the electromagnetic shielding layer is not formed on the electrode pad.

Further, in the above-described laminated semiconductor substrate, it is preferable that all of the plurality of semiconductor substrates including the uppermost substrate and the lowermost substrate each have the electromagnetic shielding layer, and in all of the plurality of semiconductor substrate, the electromagnetic shielding layer has individual structures individually covering all of the plurality of device regions from the outside and separated from one another.

In this laminated semiconductor substrate, all of the laminated semiconductor substrates are shielded from the electromagnetic waves from the stage of the semiconductor substrate, and the electromagnetic shielding layers of the respective semiconductor substrates more surely shield against the electromagnetic waves for the time from the stage of the semiconductor substrate to the post-completion stage. Furthermore, the device region in each semiconductor substrate is sandwiched between the two upper and lower electromagnetic shielding layers. Further, the individual electromagnetic shielding layers individually shield all of the plurality of device regions while keeping the respective insulating states. Besides, the electromagnetic shielding layer is formed at parts where the effect of electromagnetic shielding layer are effectively exhibited.

Further, the present invention provides a laminated semiconductor substrate laminated a plurality of semiconductor substrates having a plurality of scribe-groove parts formed along scribe lines, the plurality of semiconductor substrates each including: a plurality of device regions insulated from each other, each of which is in contact with at least one of the plurality of scribe-groove parts and has a semiconductor device formed therein; a wiring electrode connected to the semiconductor device formed in each of the device regions and extending from the device region to the inside of the scribe-groove part, each of an uppermost substrate laminated on the top side and a lowermost substrate laminated on the bottom side in the plurality of semiconductor substrates has an electromagnetic shielding layer formed using a ferromagnetic body, and the electromagnetic shielding layer is formed at corresponding positions respectively corresponding to the plurality of device regions in a second surface in surfaces of the semiconductor substrate, the second surface is a surface of the rear surface side of a first surface where the plurality of device regions are formed.

Further, in the above-described laminated semiconductor substrate, it is preferable that the plurality of scribe-groove parts have a wide-port structure in which a wide width part wider in width than a groove lower part including a bottom part is formed at an inlet port thereof.

In the above-described laminated semiconductor substrate, it is possible that the plurality of scribe-groove parts have a wide-port structure in which a wide width part wider in width than a groove lower part including a bottom part is formed at an inlet port thereof, the plurality of semiconductor substrates each including: an insulating layer formed by filling the plurality of scribe-groove parts with a resin with no space, wherein the insulating layer has a double-layer structure in which a lower insulating layer formed inside the groove lower part and an upper insulating layer formed inside the wide width part are laminated, and the lower insulating layer is formed using a low-viscosity resin lower in viscosity than the resin forming the upper insulating layer.

In the above-described laminated semiconductor substrate, it is possible that the electromagnetic shielding layer has a size according to the respective plurality of device regions and is formed in regions other than corresponding parts of the second surface, the corresponding parts is corresponding to the wide width parts of the scribe-groove parts.

Further, in the above-described laminated semiconductor substrate, it is possible that the laminated semiconductor substrate further including: an added electromagnetic shielding layer formed using a ferromagnetic body on a second surface on the rear surface side of the first surface in the lowermost substrate.

Further, in case of the above-described laminated semiconductor substrate, it is preferable that the electromagnetic shielding layer is formed using a soft magnetic material.

Further, the present invention provides a laminated chip package laminated a plurality of semiconductor chips having a semiconductor device, the plurality of semiconductor chips each including: a resin insulating layer made of an insulating resin formed to surround the semiconductor chip; a device region inside the resin insulating layer having the semiconductor device formed therein; and a wiring electrode connected to the semiconductor device and extending from the device region to the upside of the resin insulating layer, wherein when a part, in a peripheral edge part of the device region along the resin insulating layer, which the wiring electrode crosses is an extending zone, each of an uppermost chip laminated on the top side and a lowermost chip laminated on the bottom side of the plurality of semiconductor chips has an electromagnetic shielding layer formed using a ferromagnetic body, and the electromagnetic shielding layer is formed in a shielding region except the extending zone on a first surface, in surfaces of the semiconductor chip, where the device region is formed.

In the above-described laminated chip package, it is preferable that the wiring electrode has an extended terminal part extending from the device region to the inside of the scribe-groove part, and an electrode pad wider in width than the extended terminal part disposed in the device region and formed at a part of the extended terminal part, and wherein when a part, in the peripheral edge part, where the electrode pad is disposed is a pad zone, a region on the first surface except the extending zones and the pad zones are set to be the shielding regions.

In the above-described laminated chip package, it is preferable that all of the plurality of semiconductor chips including the uppermost chip and the lowermost chip each have the electromagnetic shielding layer, and in all of the plurality of semiconductor chip, the electromagnetic shielding layer has individual structures individually covering all of the plurality of device regions from the outside and separated from one another.

Further, the present invention provides a laminated chip package laminated a plurality of semiconductor chips having a semiconductor device, the plurality of semiconductor chips each including: a resin insulating layer made of an insulating resin formed to surround the semiconductor chip; a device region inside the resin insulating layer having the semiconductor device formed therein; and a wiring electrode connected to the semiconductor device and extending from the device region to the upside of the resin insulating layer, each of an uppermost chip laminated on the top side and a lowermost chip laminated on the bottom side of the plurality of semiconductor chips has an electromagnetic shielding layer formed using a ferromagnetic body, and the electromagnetic shielding layer is formed at a corresponding position respectively corresponding to the device region in a second surface in surfaces of the semiconductor chip, the second surface is a surface of the rear surface side of a first surface where the device region is formed.

Further, in the above-described laminated chip package, it is preferable that the resin insulating layer has a double-layer structure in which an upper insulating layer is laminated on a lower insulating layer, and the lower insulating layer is formed using a low-viscosity resin lower in viscosity than the resin forming the upper insulating layer.

Further, it is possible that the electromagnetic shielding layer has a size according to the device region and is formed in a region other than a corresponding part corresponding to the upper insulating layer on the second surface.

Further, in the above-described laminated chip package, it is preferable that all of the plurality of semiconductor chips are arranged such that the extending zones face at least one wiring side surface of a plurality of side surfaces, end faces of the extended terminal parts in all of the plurality of semiconductor chips are formed in the wiring side surface, and the laminated chip package further comprises a connection electrode connecting the end faces arranged in a laminated direction in which the plurality of semiconductor chips are laminated, across all of the plurality of semiconductor chips.

Further, in the above-described laminated chip package, it is preferable that end faces of the extended terminal parts in all of the plurality of semiconductor chips are formed in at least one wiring side surface of a plurality of side surfaces, and the laminated chip package further comprises a connection electrode connecting the end faces arranged in a laminated direction in which the plurality of semiconductor chips are laminated, across all of the plurality of semiconductor chips.

Further, the present invention provides a method of manufacturing a laminated semiconductor substrate, including: a groove part forming step of forming a plurality of scribe-groove parts along scribe lines in a first surface where semiconductor devices are formed, in all of a plurality of unprocessed substrates having the semiconductor devices formed thereon; a wiring electrode forming step of forming a wiring electrode connected to the semiconductor device and extending from the device region in contact with at least one of the plurality of scribe-groove parts to the inside of the scribe-groove part; an electromagnetic shielding layer forming step of forming, when a part, in a peripheral edge part of the device region along the scribe-groove part, which the wiring electrode crosses is an extending zone, an electromagnetic shielding layer using a ferromagnetic body in shielding regions except the extending zones on the first surface, in surfaces of the unprocessed substrate, where the plurality of device regions are formed, in at least two of the plurality of unprocessed substrates; and a lamination step of laminating the plurality of unprocessed substrates such that substrates with shielding layer having the electromagnetic shielding layer in the unprocessed substrates are arranged on the top and the bottom respectively.

Further, it is preferable that in the wiring electrode forming step, the wiring electrode is formed such that an extended terminal part extending from the device region to the inside of the scribe-groove part and an electrode pad wider in width than the extended terminal part are arranged within the device region, and wherein in the electromagnetic shielding layer forming step, the electromagnetic shielding layer is formed so that a region except a pad zone and the extending zone, the pad zone is a part of the peripheral edge part where the electrode pad is formed, is set the shielding regions.

Further, the present invention provides a method of manufacturing a laminated semiconductor substrate, including: a groove part forming step of forming a plurality of scribe-groove parts along scribe lines in a first surface where semiconductor devices are formed, in all of a plurality of unprocessed substrates having the semiconductor devices formed thereon; a wiring electrode forming step of forming a wiring electrode connected to the semiconductor device and extending from the device region in contact with at least one of the plurality of scribe-groove parts to the inside of the scribe-groove part; an electromagnetic shielding layer forming step of polishing a second surface on the rear surface side of the first surface where the device regions are formed until the scribe-groove parts appear, and then forming an electromagnetic shielding layer using a ferromagnetic body at corresponding positions respectively corresponding to the plurality of device regions in the second surface, in at least two of the plurality of unprocessed substrates; and a lamination step of laminating the plurality of unprocessed substrates such that substrates with shielding layer having the electromagnetic shielding layer in the plurality of unprocessed substrates are arranged on the top and the bottom respectively.

Further, it is possible that in the groove part forming step, when the plurality of scribe-groove parts are formed, a plurality of first groove parts each having a first width and a first depth are formed along the scribe lines, and then a second groove parts each having a second width larger than the first width and a second depth smaller than the first depth are formed at inlet ports of the plurality of first groove parts.

Further, the present invention provides a method of manufacturing a laminated chip package, including: a cutting step of cutting the laminated semiconductor substrate manufactured by the above-described manufacturing method along the scribe-groove parts to cause resin insulating layers made of an insulating resin and the wiring electrode to appear in a cut surface; and a connection electrode forming step of forming a connection electrode connecting the wiring electrodes arranged in a laminated direction in which the plurality of unprocessed substrates are laminated, across all of the plurality of unprocessed substrates.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 12 is a sectional view of the semiconductor wafer mainly illustrating a groove part, in which (A) shows a state in which a first groove part forming step has been executed, and (B) shows a state in which a second groove part forming step has been executed;

FIG. 13 is a sectional view of the semiconductor wafer subsequent to that in FIG. 12, in which (A) shows a state in which a lower insulating layer has been formed and (B) shows a state in which an upper insulating layer and a surface insulating layer have been formed;

DETAILED DESCRIPTION OF THE EMBODIMENTS

In the following, embodiments of the present invention will be described with reference to the drawings. Note that the same components will be referred to with the same numerals or letters, while omitting their overlapping descriptions.

First Embodiment (Structures of Semiconductor Wafer)

To begin with, the structure of a laminated semiconductor wafer 98 will be described with reference to FIG. 1 to FIG. 3, FIG. 5 to FIG. 6, FIG. 22 and so on. The laminated semiconductor wafer 98 is manufactured using a semiconductor wafer 1 illustrated in FIG. 1. The laminated semiconductor wafer 98 is a laminated semiconductor substrate according to a first embodiment of the present invention. In the laminated semiconductor wafer 98, a plurality of semiconductor wafers 1 are laminated. In the laminated semiconductor wafer 98 illustrated in FIG. 22, eight semiconductor wafers 1, 1A to 1G are laminated. Since it is sufficient that a plurality of semiconductor substrates are laminated in the laminated semiconductor substrate according to the present invention, the number of the semiconductor wafers 1 which are laminated within the laminated semiconductor wafer is not limited to eight.

Figure 1:
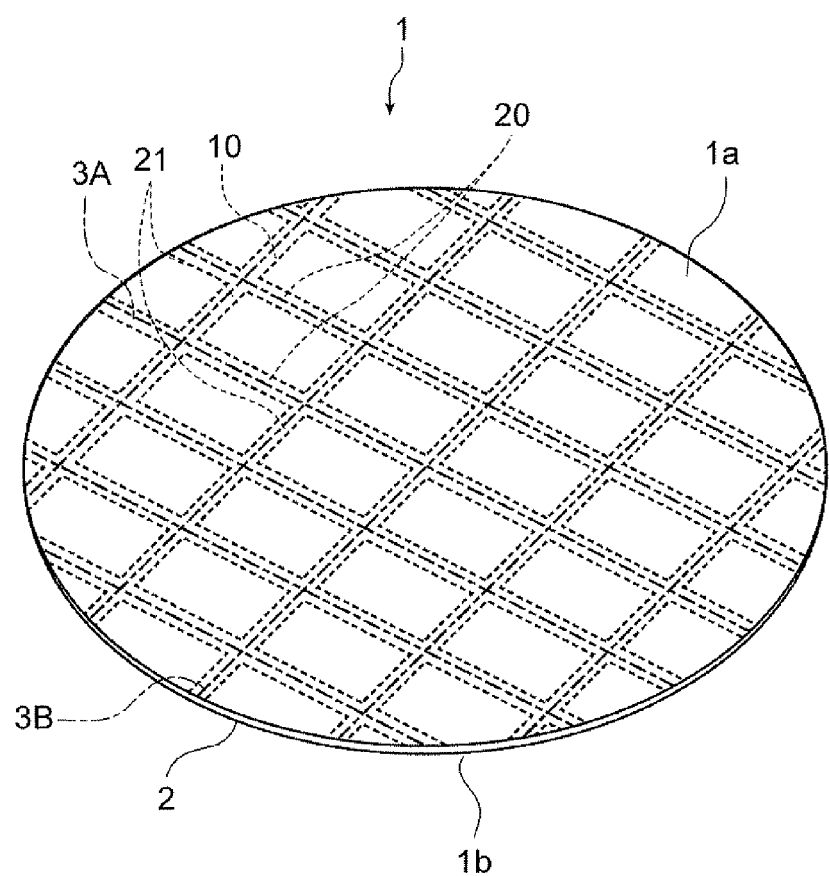
FIG. 1 is a perspective view illustrating the entire semiconductor wafer constituting a laminated semiconductor wafer according to a first embodiment of the present invention.
Figure 2:
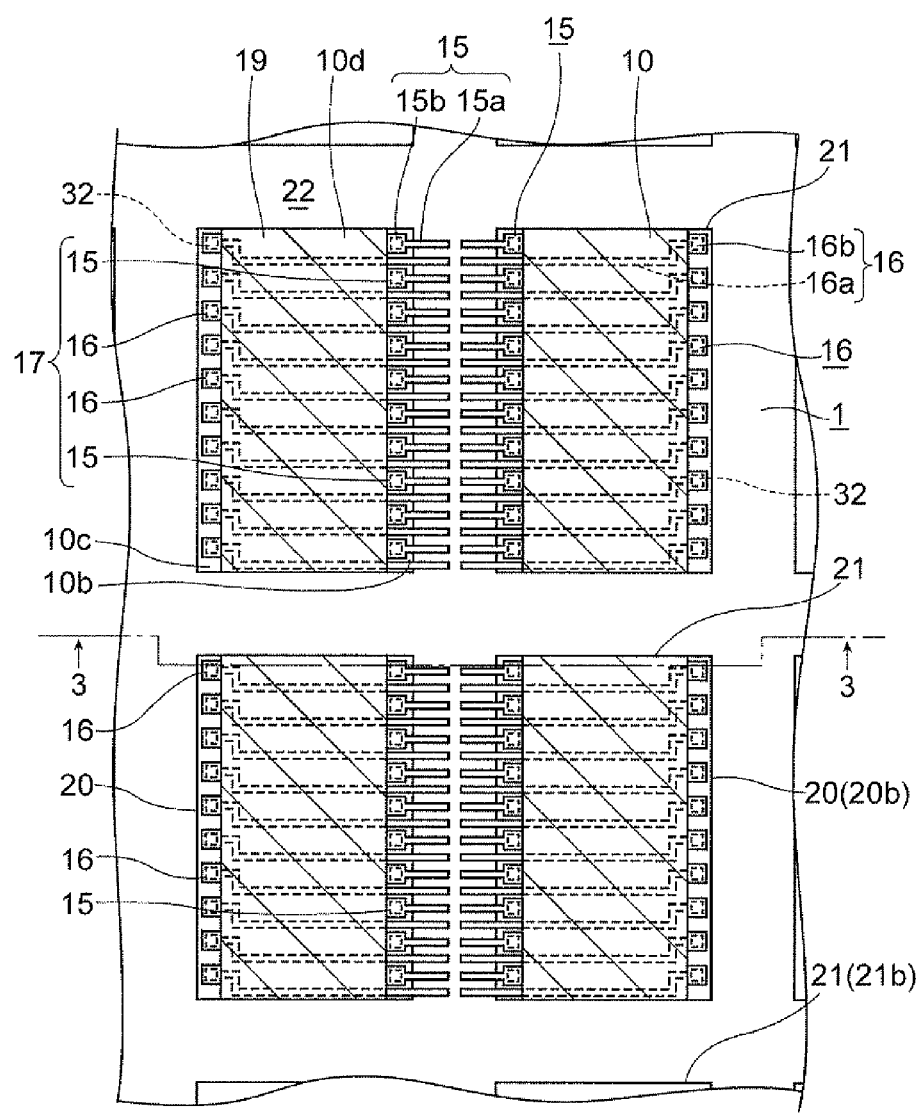
FIG. 2 is a plan view illustrating a device region and a region surrounding it formed in the semiconductor wafer in FIG. 1.
Figure 3:
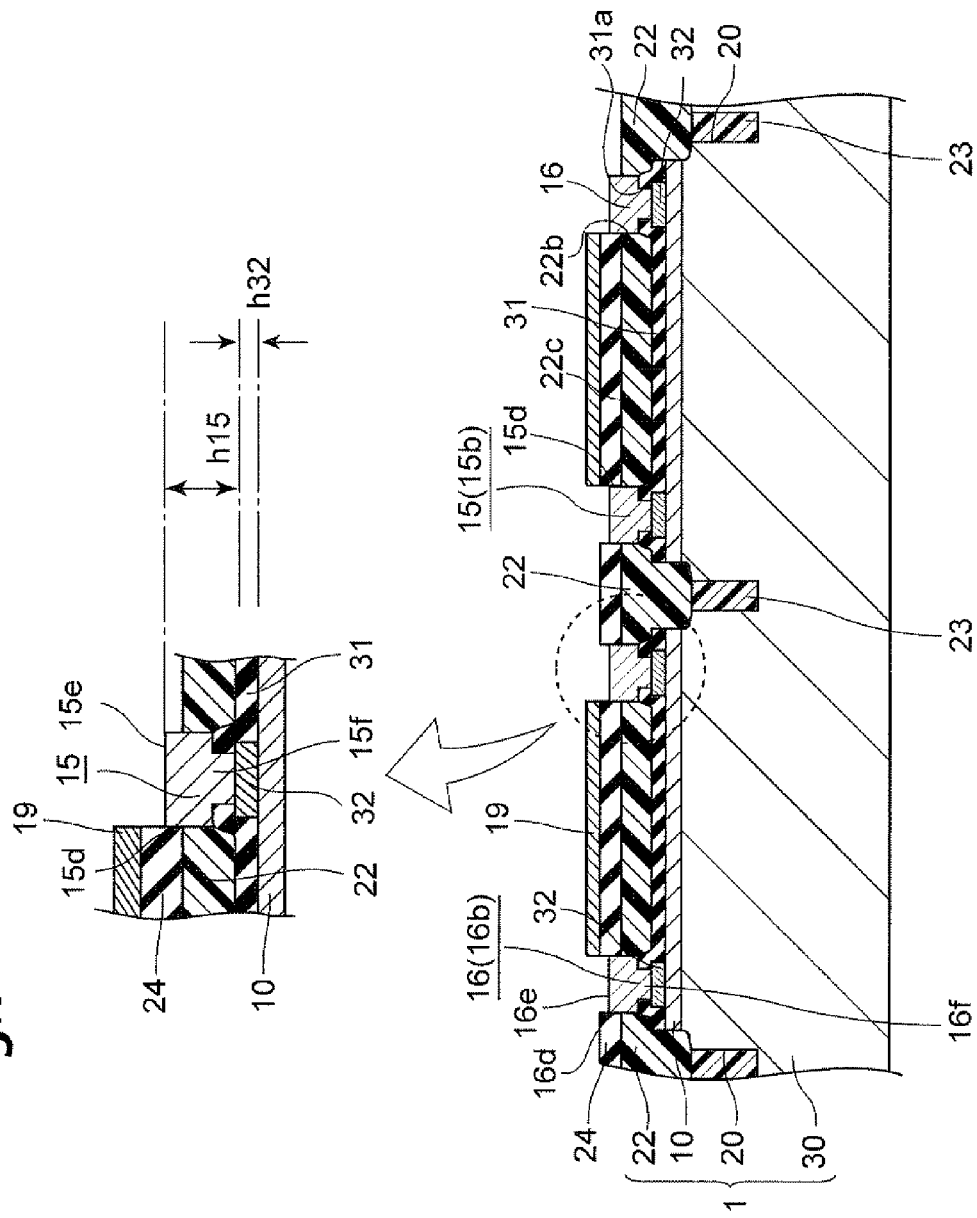
FIG. 3 is a sectional view taken along the line 3-3 in FIG. 2.
Figure 5:
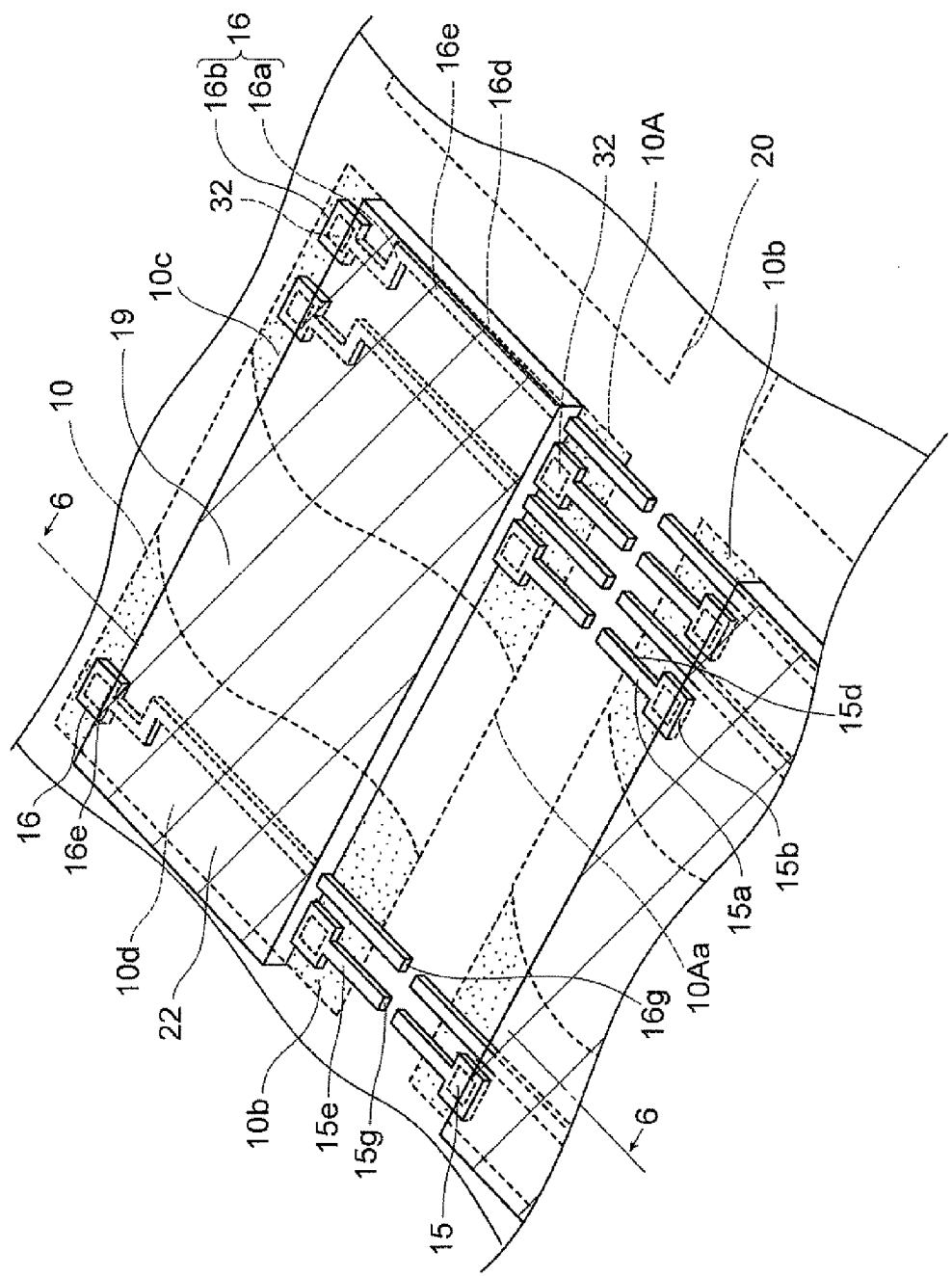
FIG. 5 is a perspective view illustrating a principal part of the semiconductor wafer in FIG. 1 with a part thereof omitted.
Figure 6:
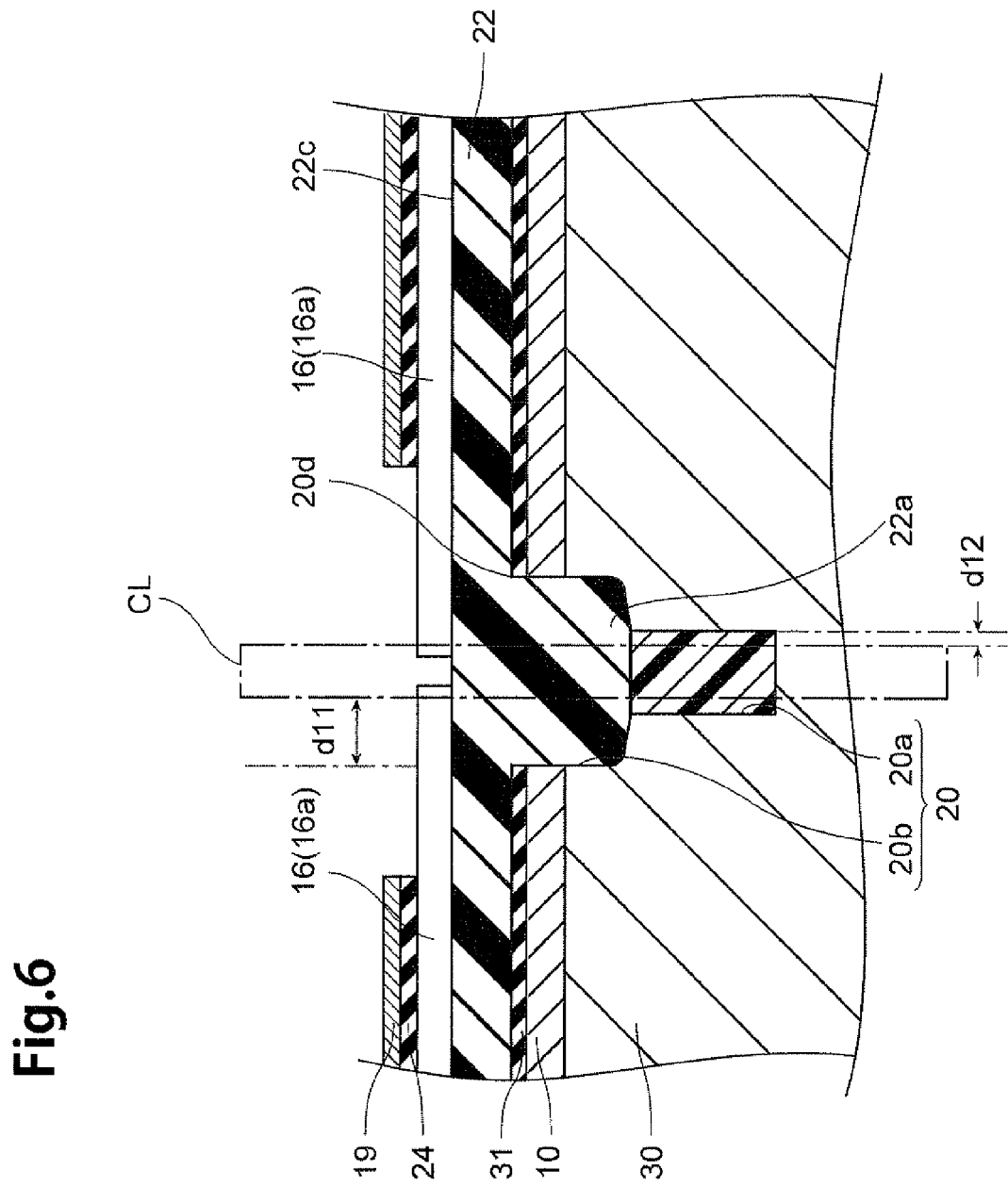
FIG. 6 is a sectional view taken along the line 6-6 in FIG. 5.

Here, FIG. 1 is a perspective view illustrating the entire semiconductor wafer 1. FIG. 2 is a plan view illustrating a device region 10 and a region surrounding it formed in the semiconductor wafer 1, and FIG. 3 is a sectional view taken along the line 3-3 in FIG. 2. FIG. 5 is a perspective view illustrating a principal part of the semiconductor wafer 1 with a part thereof omitted, and FIG. 6 is a sectional view taken along the line 6-6 in FIG. 5. Note that in FIG. 1, later-described device regions 10, groove parts 20, 21 and so on are enlarged for convenience of illustration.

The semiconductor wafer 1 is composed using a silicon wafer 2. The semiconductor wafer 1 has, as illustrated in FIG. 1, scribe lines 3A and 3B formed on a first surface 1a of the silicon wafer 2 (the rear surface side of the first surface 1a is a second surface 1b). A plurality of each of the scribe lines 3A and 3B are formed on the first surface 1a and formed on straight lines at predetermined intervals along certain directions, respectively. The scribe lines 3A are orthogonal to the scribe lines 3B.

The semiconductor wafer 1 further has groove parts 20 and 21 formed in the first surface 1a. Since the groove parts 20, 21 are formed along the scribe lines 3A and 3B, the groove parts 20, 21 have a constitution as a scribe-groove parts of the present invention. The later-described device region 10 is formed within a rectangular region surrounded by the adjacent groove parts 20, 20 and groove parts 21, 21.

The groove part 20 has a groove lower part 20a and a wide width part 20b and is formed in a direction almost orthogonal to the first surface 1a as illustrated in FIG. 6 in detail.

The groove lower part 20a is a part including a bottom part 20c of the groove part 20 and having a certain height from the bottom part 20c (see FIG. 12, FIG. 13 about the bottom part 20c). The groove lower part 20a is a lower part of the groove part 20 which a resin relatively hardly enters, and has a width w1 (about 60 μm to about 80 μm) and a depth d1 (about 10 μm to about 40 μm) as illustrated in FIG. 12(A), (B). Inside of the groove lower part 20a, a later-described lower insulating layer 23 is formed as illustrated in FIG. 3.

The wide width part 20b is a part arranged on the upper side of the groove lower part 20a in the groove part 20, which is a part including an inlet port 20d of the groove part 20 and having a certain depth from the inlet port 20d. The wide width part 20b is formed wider than the groove lower part 20a and is formed over the entire length direction of the inlet port 20d of the groove part 20. In other words, as illustrate in FIG. 12(A), (B), a width w2 of the wide width part 20b is larger than the width w1 of the groove lower part 20a (w2>w1). The width w2 of the wide width part 20b is about 80 μm to about 120 μm, and a depth d2 of the wide width part 20b is about 10 μm to about 40 μm. Further, a later-described upper insulating layer 22a is formed inside the wide width part 20b.

Figure 8:
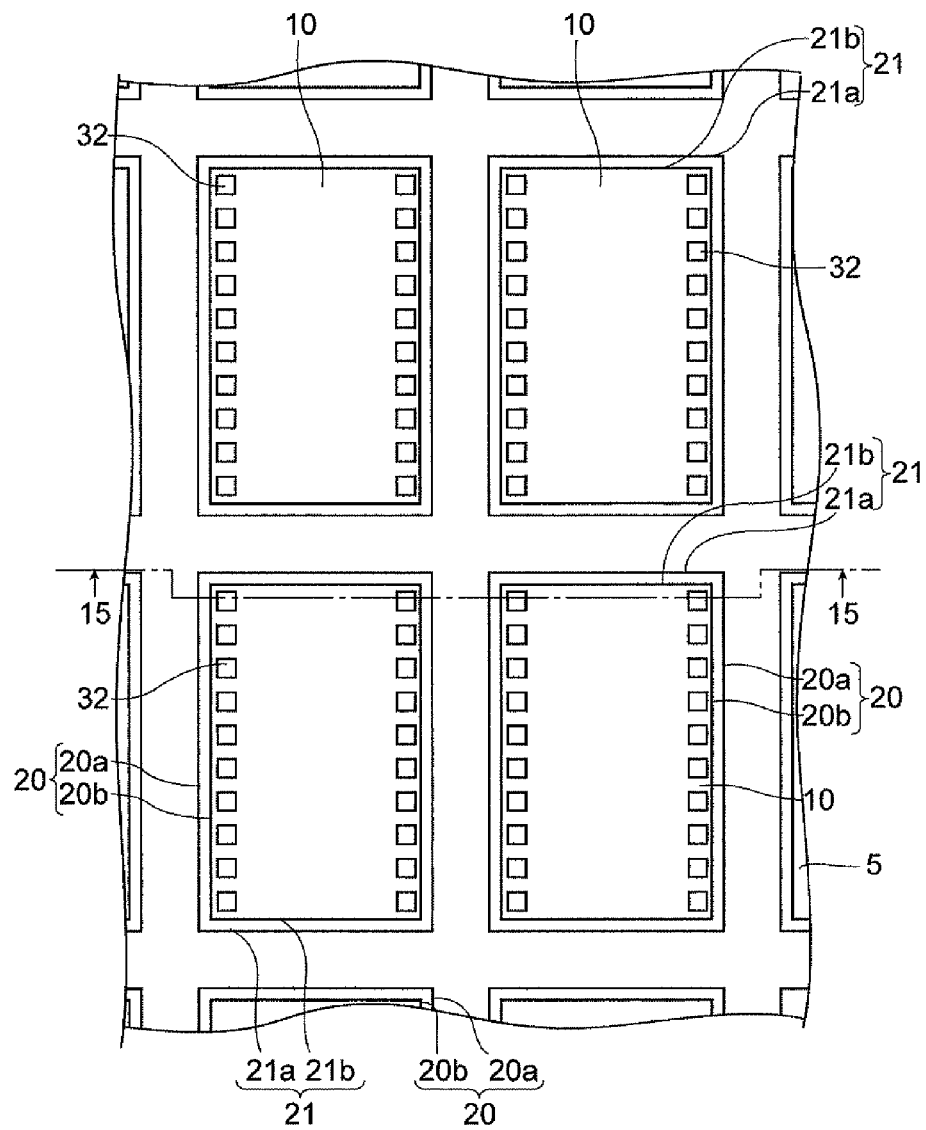
FIG. 8 is a plan view similar to FIG. 2, illustrating the semiconductor wafer subsequent to that in FIG. 7.

The groove part 21 has a groove lower part 21a and a wide width part 21b and is formed in a direction almost orthogonal to the first surface 1a, as illustrated in FIG. 8 and so on. The groove lower part 21a is a part having a certain height from a bottom part similarly to the groove lower part 20a, and has the same width and depth as those of the groove lower part 20a. Inside the groove lower part 21a, a lower insulating layer 23 is formed as in the groove lower part 20a. The wide width part 21b is a part arranged on the upper side of the groove lower part 21a. The wide width part 21b is formed wider than the groove lower part 21a and has the width and the depth similar to those of the wide width part 20b. An upper insulating layer 22a is formed inside the wide width part 21b as in the wide width part 20b.

As described above, the groove parts 20 and 21 have a wide-port structure in which the wide width part 20b and the wide width part 21b wider than the groove lower parts 20a and 21a are formed at the respective inlet ports. In addition, the insulating layer having a double-layer structure in which the upper insulating layer 22a is laminated on the lower insulating layer 23 is formed inside the groove parts 20 and 21.

The semiconductor wafer 1 has a surface insulating layer 22 as illustrated in detail in FIG. 3. The surface insulting layer 22 is formed to cover the device region 10, and thus the surface insulting layer 22 covers almost the whole first surface 1a of the semiconductor wafer 1 to constitute a surface layer of the semiconductor wafer 1. The surface insulating layer 22 has a larger thickness than that of a later-described protecting insulating layer 31 and has a surface 22c formed flat.

Further, the surface insulating layer 22 is structured integrally with an upper insulating layer 22a formed inside the groove parts 20 and 21, and is thus formed in one body without joints between the upper insulating layer 22a and other portions. The surface insulating layer 22 is formed with a plurality of contact holes 22b, and one wiring electrode 15 or one wiring electrode 16 is formed in each of the contact holes 22b.

The surface insulating layer 22 can be formed using a resin such as an epoxy resin or a polyimide resin, or an insulating material made of silicon silicate glass (SOG) or the like. In this embodiment, a case using a resin for the surface insulating layer 22 is discussed. It is especially preferable to form the surface insulating layer 22 using a resin having a low thermal expansion coefficient. This ensures that when the semiconductor wafer 1 is cut along the groove parts 20 and 21 by a dicing saw, the cutting can be easily performed.

The lower insulating layer 23 is formed also using a resin similarly to the surface insulating layer 22. The lower insulating layer 23, however, is formed using a low-viscosity resin having a lower viscosity than that of the resin forming the surface insulating layer 22.

The semiconductor wafer 1 has a silicon substrate 30 composed of the silicon wafer 2, and upper portions thereof are the device regions 10. A plurality of connecting pads 32 are formed on the surface of the device region 10, and a part other than the connecting pads 32 is covered with the protecting insulating layer 31.

The protecting insulating layer 31 is disposed under the surface insulating layer 22 and formed to cover the device region 10. The protecting insulating layer 31 is made of silicon dioxide ($SiO_2$) or the like, and has connecting holes 31a formed at positions where the connecting pads 32 are to be formed. The connecting holes 31a are formed to expose the connecting pads 32 so as to connect the later-described wiring electrodes 15 and 16 to the connecting pads 32. The connecting pads 32 are connected to the semiconductor device in the device region 10 (see FIG. 4 for details).

The device region 10 is a rectangular region surrounded by the adjacent groove parts 20 and 20 and the groove parts 21 and 21 as illustrated in detail in FIG. 2. A plurality of the device regions 10 are formed on the first surface 1a, and each of them is a unit region divided from adjacent regions by the groove parts 20 and 21. The respective device regions 10 are in contact with both of the groove parts 20 and groove parts 21.

Each of the device regions 10 has the memory part formed on the first surface 1a by performing wafer process, and a plurality of wiring electrodes 15 and 16 are formed. Note that the wafer process means a manufacturing process of forming a semiconductor element and an integrated circuit on the wafer such as the silicon wafer 2 or the like.

In addition to the memory part, an integrated circuit and a semiconductor element such as a CPU, a sensor, a drive circuit for the sensor may be formed as the semiconductor devices within the device region 10. Further, a memory part and an integrated circuit constituting a controller for controlling the memory part may be formed in the device region 10.

Next, a wiring electrode 15, 16 will be described. The wiring electrode 15 is made of a conductive material such as Cu or the like. The wiring electrode 15 has an extended terminal part 15a and a rectangular electrode pad 15b having wider width than the extended terminal part 15a, and the extended terminal part 15a and the rectangular electrode pad 15b have, as a whole, a protruding structure rising above the surface 22c of the surface insulating layer 22 into a three-dimensional shape.

The extended terminal part 15a has a part disposed on the device region 10 and a part extending from the device region 10 to the inside of the groove parts 20. The electrode pad 15b is formed on a part of the extended terminal part 15a disposed on the device region 10. The entire part of the electrode pad 15b is disposed on the device region 10. The electrode pad 15b is disposed on the top of a connecting pad 32, as illustrated in FIG. 3.

Figure 23:
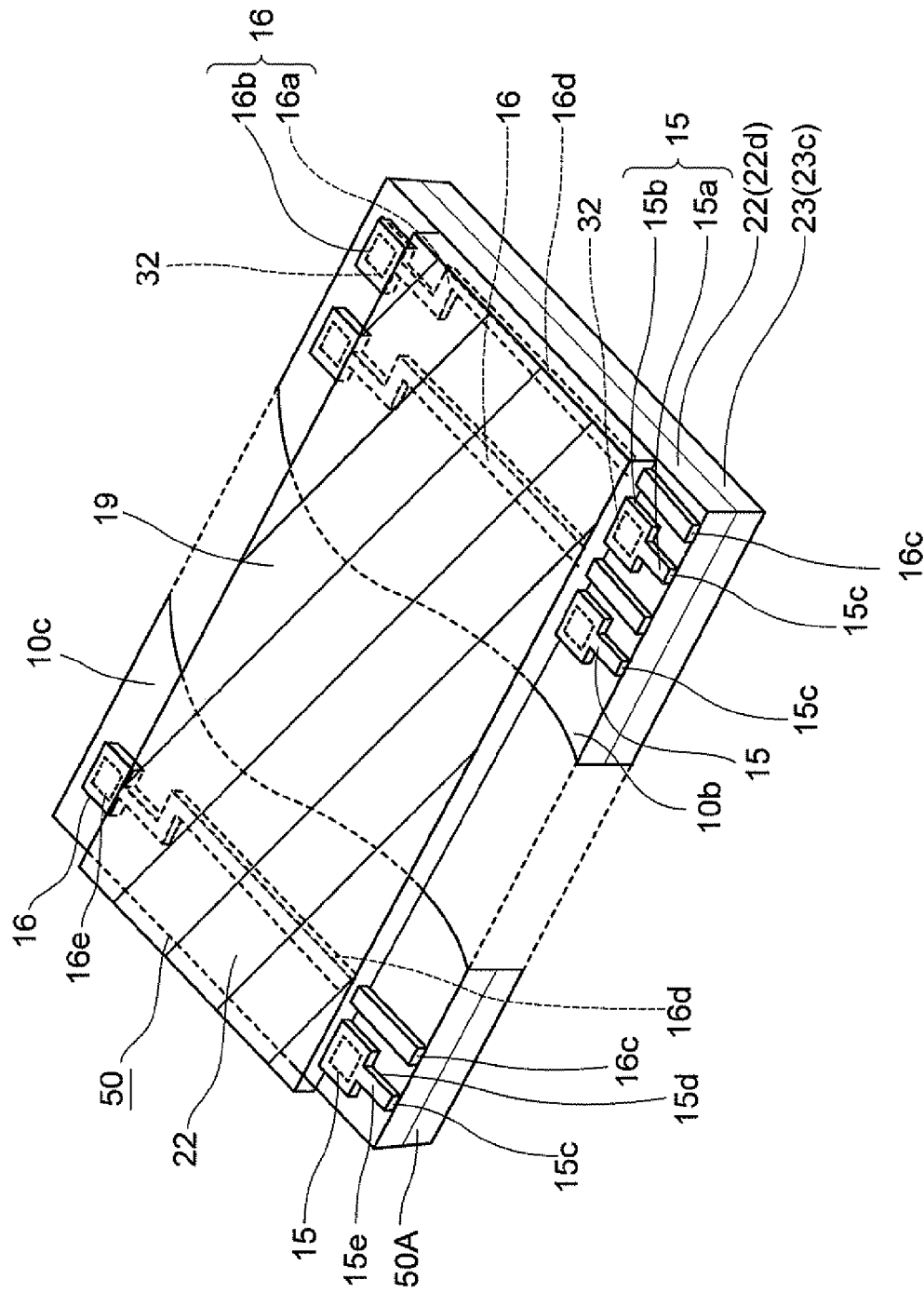
FIG. 23 is a perspective view illustrating an example of a semiconductor chip constituting the laminated chip package.

The wiring electrode 15 is illustrated in detail in FIG. 5 and FIG. 23 in addition to FIG. 3. An end face 15g of the extended terminal part 15a of the wiring electrode 15 is a projecting end face projecting outward from the surface 22c of the surface insulating layer 22. Further, the wiring electrode 15 has a cross side surface 15d, a top end face 15e, and an embedded part 15f.

The cross side surface 15d is a side surface part projecting outward from the surface 22c of the surface insulating layer 22 and crossing with the surface 22c to rise up from (almost intersecting to) the surface 22c. The top end face 15e is connected to the cross side surface 15d and projects outward from the surface 22c, and further has a rectangular part disposed in a direction along the surface 22c and a band-shaped part extending from the rectangular part in a direction along the surface 22c toward the groove part 20. The embedded part 15f is a part embedded inward from the surface 22c to connect to the connecting pad 32.

The electrode pad 15b is composed of the cross side surface 15d, the top end face 15e, and the embedded part 15f, and the extended terminal part 15a is composed of the cross side surface 15d and the top end face 15e.

The electrode pad 15b is connected to the connecting pad 32 via the contact hole 22b and the connecting hole 31a which are arranged to be stacked one on the other, and has a depth reaching the connecting pad 32. More specifically, the electrode pad 15b has a height (an expanded height) h15 expanded from the top end face 15e outer than the surface 22c to the connecting pad 32 via the contact hole 22b and the connecting hole 31a. The expanded height h15 is larger than a height h32 of the connecting pad 32 (h15>h32). For example, h15 is about 2 to 6 μm, and h32 is about 0.5 to 1 μm.

The wiring electrode 16 is also made of a conductive material such as Cu or the like. The wiring electrode 16 has an extended terminal part 16a and a rectangular electrode pad 16b, and the extended terminal part 16a and the electrode pad 16b have, as a whole, a protruding structure like the wiring electrode 15. An end face 16g of the extended terminal part 16a of the wiring electrode 16 is a projecting end face projecting outward from the surface 22c.

The extended terminal part 16a has a part disposed on the device region 10 and a part extending from the device region 10 to the inside of the groove parts 20. The electrode pad 16b is formed on a part of the extended terminal part 16a disposed on the device region 10. The entire part of the electrode pad 16b is disposed on the device region 10. The electrode pad 16b is disposed on the top of a connecting pad 32, as illustrated in FIG. 3.

Further, the wiring electrode 16 has a cross side surface 16d, a top end face 16e, and an embedded part 16f. The cross side surface 16d is a side surface part crossing with the surface 22c, like the cross side surface 15d. The top end face 16e has a rectangular part disposed in a direction along the surface 22c and a band-shaped part extending from the rectangular part in a direction along the surface 22c toward the groove part 20, like the top end face 15e. The embedded part 16f is a part embedded inward from the surface 22c and connected to the connecting pad 32, like the embedded part 15f. Further, the electrode pad 16b is composed of the cross side surface 16d, the top end face 16e, and the embedded part 16f, and the extended terminal part 16a is composed of the cross side surface 16d and the top end face 16e. The electrode pad 16b also has an expanded height like the electrode pad 15b.

The extended terminal parts 15a and the electrode pads 15b of the wiring electrodes 15 are formed along a part of the outer periphery of the device region 10, whereas the extended terminal parts 16a of the wiring electrodes 16 are formed across the device region 10. Further, the electrode pads 16b are disposed along a part of the outer periphery of the device region 10 to be opposed to the electrode pads 15b.

Respective parts of the extended terminal parts 15a and the extended terminal parts 16a extend from the device region 10 into the groove part 20. More specifically, the extended terminal parts 15a and the extended terminal parts 16a are formed such that their respective parts on their tip sides apart from the electrode pads 15b and 16b bulge out from an edge part (the above-described inlet port 20d) of the groove part 20 and stay inside the groove part 20 in the width direction. Further, the extended terminal parts 15a and the extended terminal parts 16a are formed such that their respective parts extending out from the device region 10 are in a protruding shape rising above the surface 22c of the surface insulating layer 22.

Further, as illustrated in FIG. 2, FIG. 5, and FIG. 6, the extended terminal parts 15a and the extended terminal parts 16a bulge out from both sides in the width direction of the groove part 20 such that the end faces 15g are opposed to each other with slight separation therebetween and the end faces 16g are opposed to each other with slight separation therebetween, near the middle in the width direction of the groove part 20.

The semiconductor wafer 1 has the extended terminal parts 15a and the extended terminal parts 16a. Therefore, in the cut surfaces when the semiconductor wafer 1 is cut along the groove parts 20, the later-described end faces 15c and 16c appear projecting outward from the surface 22c.

Further, a number of the wiring electrodes 15 and 16 are alternately arranged along the groove part 20. These wiring electrodes 15 and 16 are united together to form a wiring electrode group 17. Further, in the wiring electrodes 15 and 16, the extended terminal parts 15a and 16a are extended only to the groove part 20 on the left side or the right side that is a part of the four groove parts which are all of the groove parts surrounding and contacting with the device region 10, that is, the adjacent two groove parts 20 and 20 and two groove parts 21 and 21. The wiring electrode group 17 has an unevenly distributed structure by such an unevenly distributed arrangement of the extended terminal parts 15a and 16a.

Next, an electromagnetic shielding layer 19 and an electrode insulating layer 24 will be described. As illustrated in FIG. 3, the semiconductor wafer 1 has the electromagnetic shielding layer 19 and the electrode insulating layer 24. The electromagnetic shielding layer 19 and the electrode insulating layer 24 are formed on the first surface 1a of the semiconductor wafer 1. The electromagnetic shielding layer 19 is illustrated also in FIG. 2, and parts with hatchings indicate the surface of the electromagnetic shielding layer 19

The electromagnetic shielding layer 19, which is the electromagnetic shielding layer in the present invention, is formed to shield against electromagnetic waves existing under the external environment and protect the laminated semiconductor wafer 98 from the electromagnetic waves. The electromagnetic shielding layer 19 is formed on the electrode insulating layer 24. The electromagnetic shielding layer 19 has a thickness of about 1 to 5 μm. The illustrated electromagnetic shielding layer 19 and electrode insulating layer 24 are formed in a shielding region 10d in the first surface 1a. The electromagnetic shielding layer 19 and the electrode insulating layer 24 are not formed in an extending zone 10b and a pad-zone 10c.

In the semiconductor wafer 1, the shielding region 10d is set to be a region except the extending zone 10b and the pad-zone 10c in the device regions 10. The extending zone 10b and the pad-zone 10c will be described in detail with reference to FIG. 5 and FIG. 33 as follows.

Each device region 10 is in contact with two groove parts 20 and two groove parts 21 which are adjacent to the respective device region 10. Therefore, the device region 10 can be supposed to include a peripheral edge part 10A along the groove parts 20, 20, 21, 21 therein. Since each device region 10 is formed in a rectangular shape, the peripheral edge part 10A is formed in a rectangular ring shape. The peripheral edge part 10A is a part including the boundary between the device region 10 and the groove parts 20, 20, 21, 21 and obtained by securing a certain width from the boundary, and is thus formed in a ring shape bordering the device region 10.

As has been described, the extended terminal part 15a and the extended terminal part 16a extend from the device region 10 toward the groove part 20, so that a boundary (hereinafter, referred to as a "cross boundary") 10Aa which the extended terminal part 15a and the extended terminal part 16a cross exists in the boundary between the device region 10 and the groove parts 20, 20, 21, 21. A part of the peripheral edge part 10A including the cross boundary 10Aa is the extending zone 10b. In the semiconductor wafer 1, a band-shaped part along a long side of the device region 10 where the electrode pads 15b are arranged is the extending zone 10b.

Figure 33:
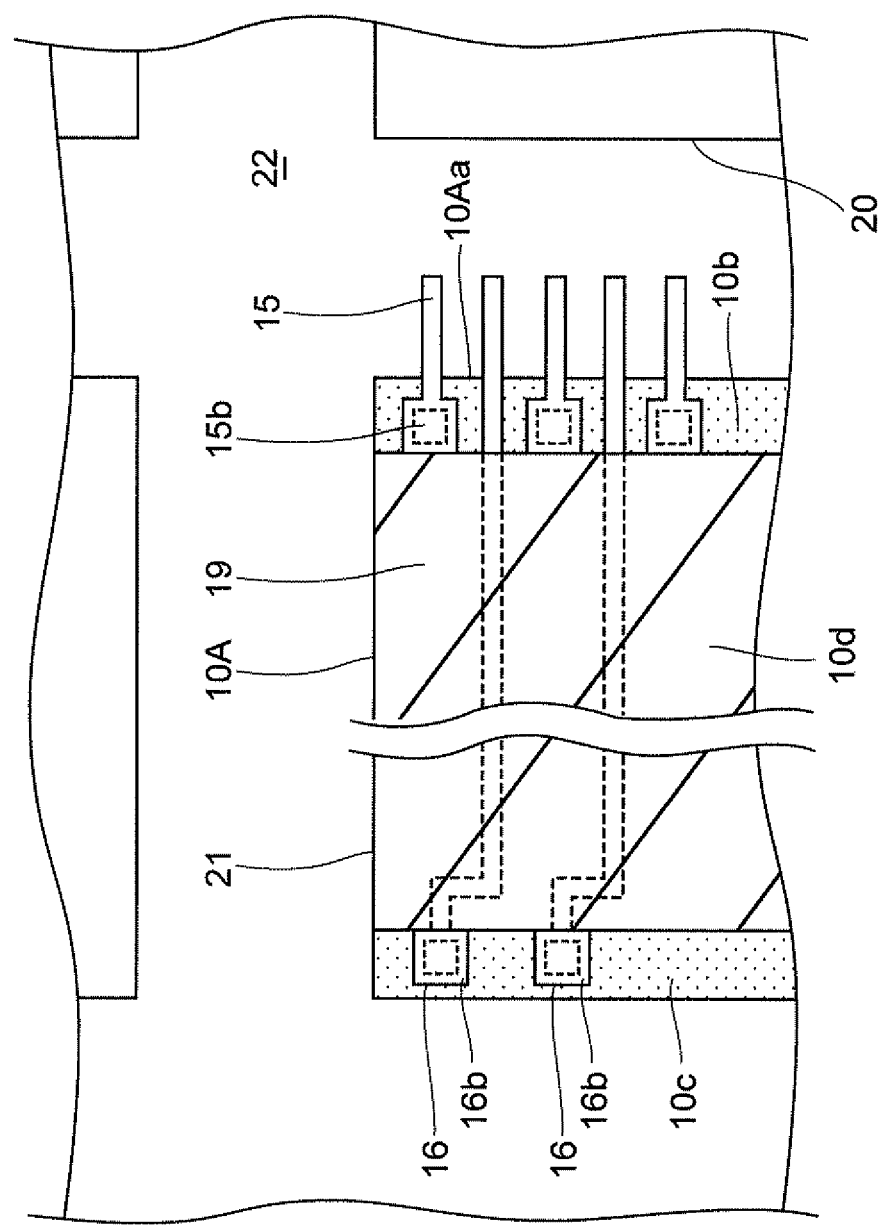
FIG. 33 is a plan view illustrating an enlarged principal part in FIG. 2.

Besides, a part of the peripheral edge part 10A where the electrode pads 16b are arranged side by side is the pad zone 10c. The pad zone 10c is a band-shaped part along a long side where the wiring electrodes 16 are arranged, and is located opposite to the extending zone 10b. In FIG. 5 and FIG. 33, the extending zone 10b and the pad zone 10c are provided with dots.

The illustrated extending zone 10b is set to be a region with a large width (the width in the direction along the groove part 21) including the electrode pads 15b, but may be set to be a region with a small width excluding the electrode pads 15b. However, since the electrode pad 15b is located at the root of the extended terminal part 15a, the extending zone 10b is set to have the large width including the electrode pad 15b. The pad zone 10c is set to be a region according to the width of the electrode pad 16b.

The electromagnetic shielding layer 19 individually covers all of the device regions 10. The individual electromagnetic shielding layer 19 are arranged in the direction along the groove part 21 (the right-left direction in FIG. 2) with a space larger than the groove part 20 therebetween. Further, the individual electromagnetic shielding layers 19 are arranged in the direction along the groove part 20 (the up-down direction in FIG. 2) with a space according to the groove part 21 therebetween.

Further, the respective electromagnetic shielding layers 19 are separated from one another. Therefore, the adjacent individual electromagnetic shielding layers 19 are not in contact with but insulated from one another. The structures of the electromagnetic shielding layer 19 which individually cover all of the device regions 10 and are separated from one another are called individual structures. The electromagnetic shielding layers 19 have the individual structures, and are formed in a thin film form, as a whole, covering all of the plurality of device regions 10 from the outside.

The electromagnetic shielding layer 19 is formed using a ferromagnetic body. The ferromagnetic body is a material exhibiting the ferromagnetism. In the ferromagnetic body, magnetic atoms or free electrons of metal bring magnetic moments in parallel lines to thereby form spontaneous magnetization. Further, the ferromagnetic body has adjacent spins lining up in parallel in the same direction and has a large magnetic moment as a whole, and is thus able to have spontaneous magnetization without external magnetic field. The ferromagnetic body has a property of allowing lines of magnetic force to easily pass therethrough as compared to paramagnetic material such as aluminum and copper.

Examples of the ferromagnetic body include a soft magnetic material and a hard magnetic material. It is preferable to form the electromagnetic shielding layer 19 using the soft magnetic material. This is because the soft magnetic material has a higher magnetic permeability than that of the hard magnetic material and thus allows lines of magnetic force to pass therethrough more easily. Examples of the soft magnetic material include metal materials such as permalloy (an alloy of Ni—Fe), permendur (an alloy of Co—Fe) and so on and ceramic materials such as ferrite and so on. It is preferable to form the electromagnetic shielding layer 19 using a metal material. This is because the metal material has a remarkably low resistivity so that electric current flows therethrough much more easily than through the silicon substrate 30. For example, the volume resistivity of permalloy is about $16 \times 10^{-8}$ Ω·m and the volume resistivity of iron (Fe) is about $10 \times 10^{-8}$ Ω·m, whereas the volume resistivity of silicon is about $3.97 \times 10^{3}$ Ω·m and the volume resistivity of epoxy resin is about $1 \times 10^{12}$ Ω·m. Further, the magnetic permeability of permalloy is about 10000, whereas the magnetic permeability of aluminum is about 1.

In this embodiment, the electromagnetic shielding layer 19 is formed using the soft magnetic material made of metal such as permalloy or permendur. For forming the electromagnetic shielding layer 19, for example, PB permalloy (Ni—Fe), PC permalloy (Cu—Mo—Ni—Fe) or the like can be used. Alternatively, the magnetic material such as CoNiFe or the like can also be used.

The electrode insulating layer 24 is formed in the shielding regions 10d similarly to the electromagnetic shielding layer 19 and is formed on the respective device regions 10. The electrode insulating layer 24 can be formed using an insulating resin such as epoxy resin or polyimide resin. The electrode insulating layer 24 enters the space between the adjacent extended terminal part 16a and directly covers the side surfaces and the upper surface of a part of the extended terminal part 16a existing on the shielding regions 10d. In this manner, the electrode insulating layer 24 insulates each extended terminal part 16a. The upper surface of the electrode insulating layer 24 is formed flat.

Figure 22:
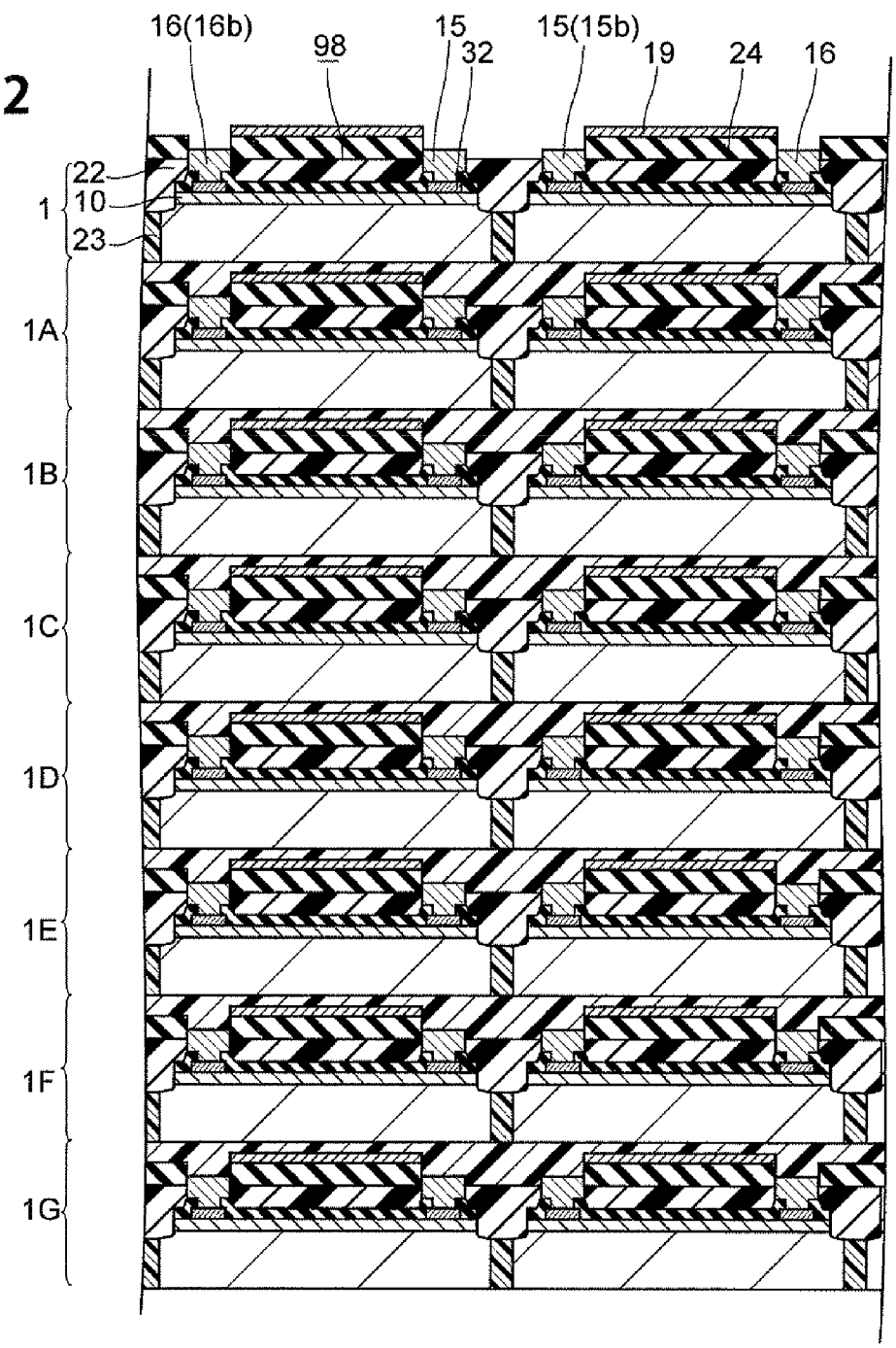
FIG. 22 is a sectional view similar to FIG. 3 illustrating a laminated semiconductor wafer according to a first embodiment of the present invention.

The laminated semiconductor wafer 98 has a structure such that the above-described semiconductor wafers 1 are bonded together with an insulating adhesive to be laminated one on the other. In the laminated semiconductor wafer 98, as illustrated in FIG. 22, eight identical semiconductor wafers 1,1A, 1B, 1C, 1D, . . . , and 1G are laminated.

Further, in the laminated semiconductor wafer 98, all of the eight semiconductor wafers 1, 1A to 1G has the electromagnetic shielding layer 19 and electrode insulating layer 24 respectively. The laminated semiconductor wafer 98 has a multilayer structure in which a plurality of electromagnetic shielding layers 19 are laminated in a direction which the semiconductor wafers 1, 1A and so on are laminated (hereinafter referred to as a "laminated direction"). In each of the eight semiconductor wafers 1,1A to 1G, the electromagnetic shielding layer 19 is formed on the first surface 1a. Among the eight semiconductor wafers 1,1A to 1G, the semiconductor wafer 1 is laminated on the top side, and therefore the semiconductor wafer 1 has the configuration as the uppermost substrate in the present invention. Besides, the semiconductor wafer 1G is laminated on the bottom, and therefore the semiconductor wafer 1G has the configuration as the lowermost substrate in the present invention.

Figure 4:
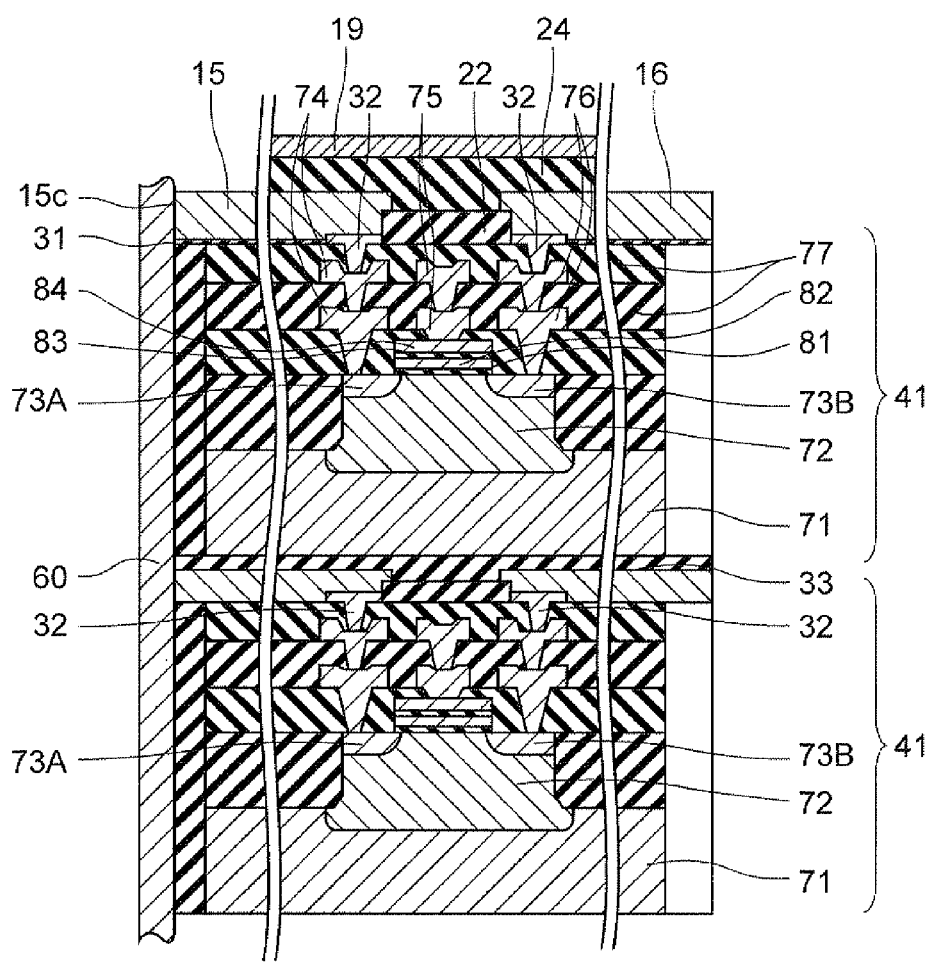
FIG. 4 is a sectional view mainly illustrating memory cells of a laminated chip package using two semiconductor wafers.

Meanwhile, in the memory part of the device region 10, a number of memory cells 41 as the semiconductor devices are formed. The memory cell 41 has a structure as illustrated in FIG. 4. FIG. 4 is a sectional view mainly illustrating memory cells 41 of a later-described laminated chip package 100 using two semiconductor wafers 1.

To the memory cell 41, the wiring electrodes 15 and 16 are connected via the connecting pads 32. The memory cell 41 is formed on the surface of an N-type substrate 71 constituting the semiconductor wafer 1. In FIG. 4, two memory cells 41 are laminated one on the other via an adhesive layer 33. The adhesive layer 33 is formed by an adhesive used when the semiconductor wafers 1 are bonded together.

Each of the memory cells 41 constitutes a flash memory and is formed on a P-type well 72 which is formed on the surface of the N-type substrate 71. The memory cell 41 has a source 73A and a drain 73B, insulating layers 77, an insulating film 81, a floating gate 82, an insulating film 83 and a control gate 84. The memory cell 41 further has a source electrode 74, a drain electrode 76 and a gate electrode 75.

Both of the source 73A and the drain 73B are N-type regions and connected with the source electrode 74 and the drain electrode 76, respectively. The insulating layers 77 are formed with contact holes for connecting the connecting pads 32 to the source electrode 74 and the drain electrode 76, respectively. The source electrode 74, the gate electrode 75, and the drain electrode 76 are connected to the source 73A, the control gate 84 and the drain 73B via the corresponding contact holes, respectively.

(Method of Manufacturing Laminated Semiconductor Wafer)

Figure 7:
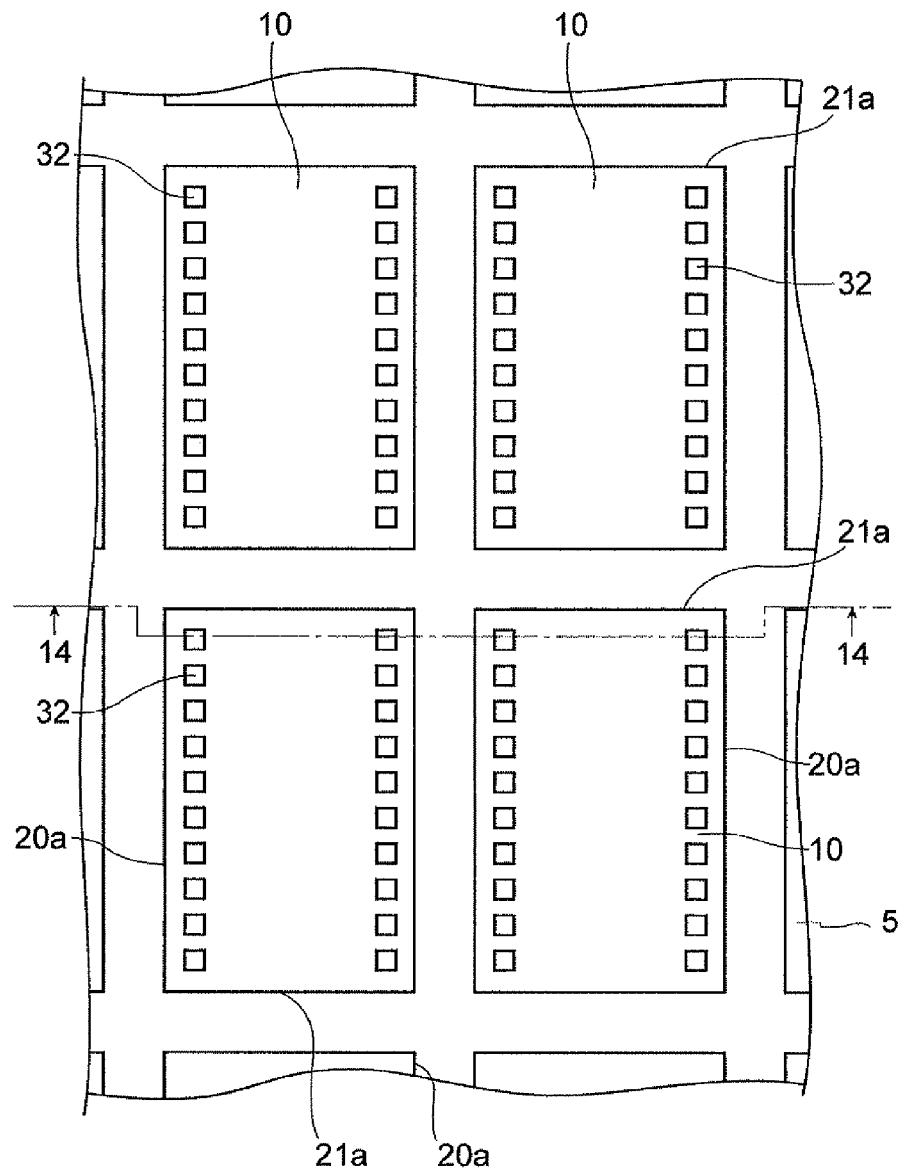
FIG. 7 is a plan view similar to FIG. 2, illustrating the partially manufactured semiconductor.
Figure 9:
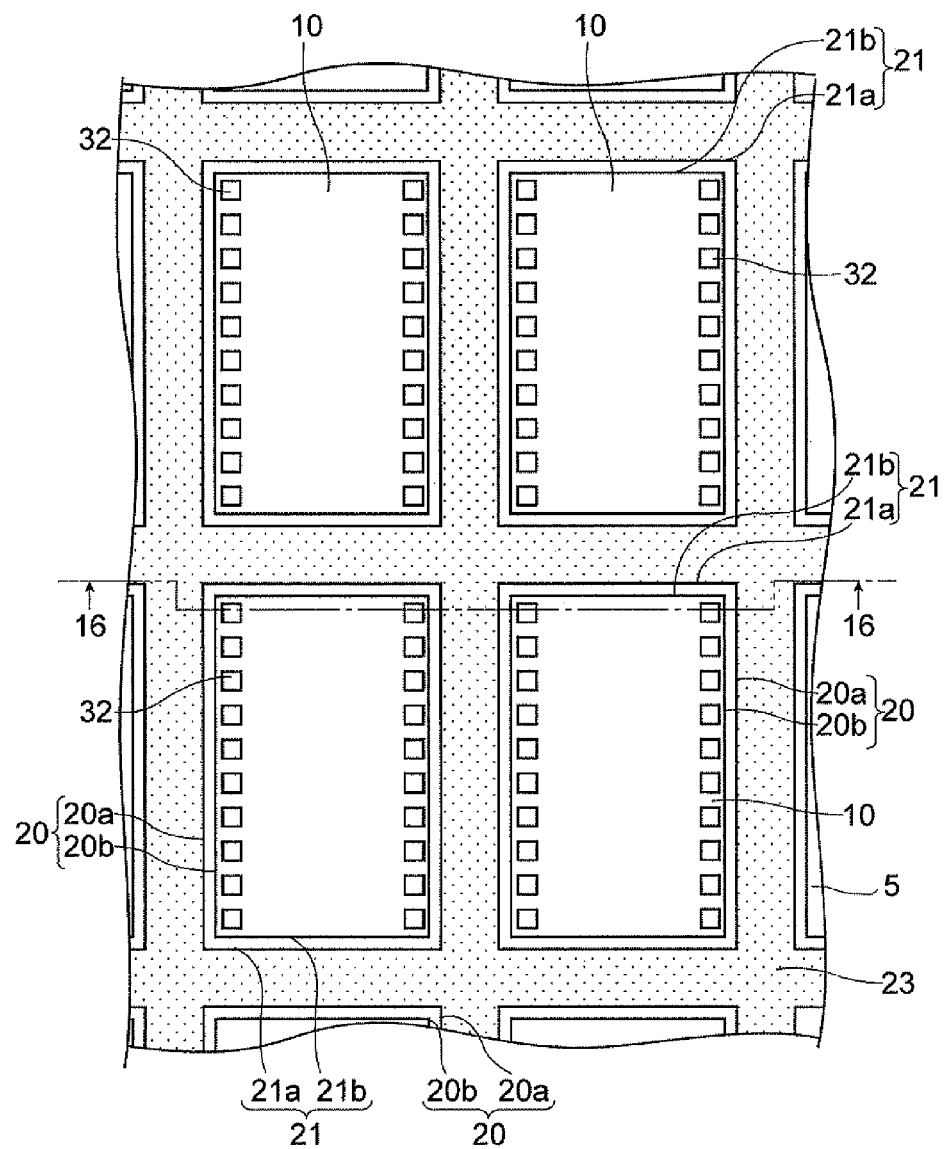
FIG. 9 is a plan view similar to FIG. 2, illustrating the semiconductor wafer subsequent to that in FIG. 8.
Figure 10:
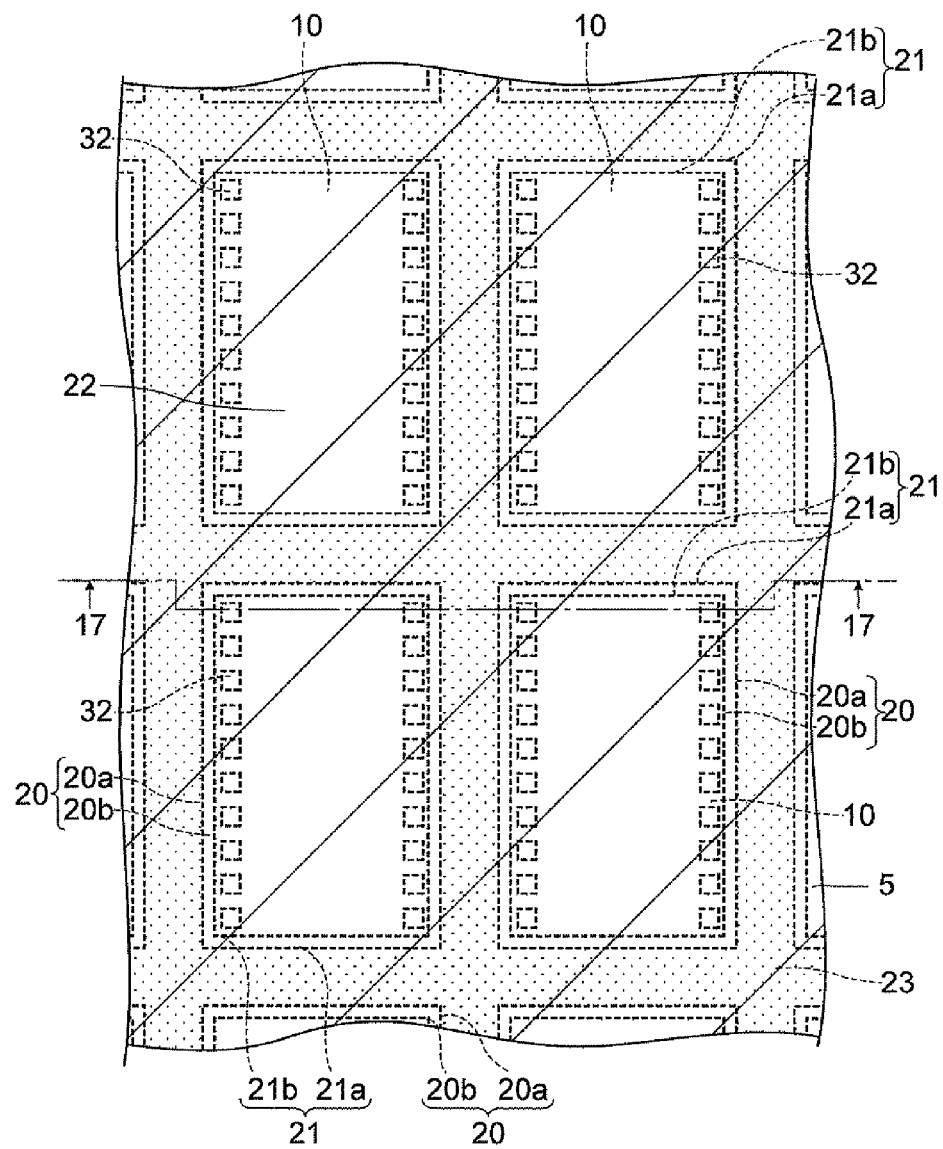
FIG. 10 is a plan view similar to FIG. 2, illustrating the semiconductor wafer subsequent to that in FIG. 9.
Figure 11:
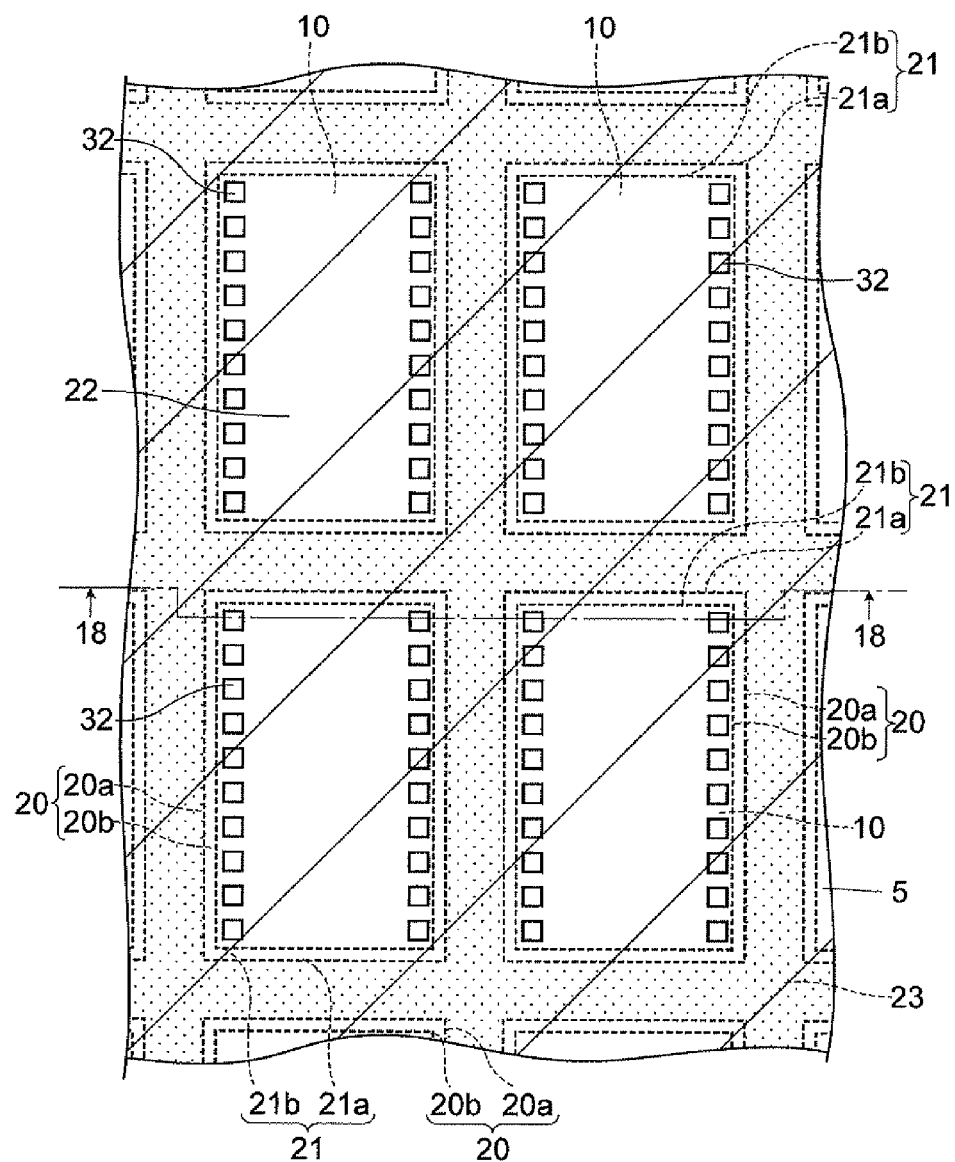
FIG. 11 is a plan view similar to FIG. 2, illustrating the semiconductor wafer subsequent to that in FIG. 10.
Figure 14:
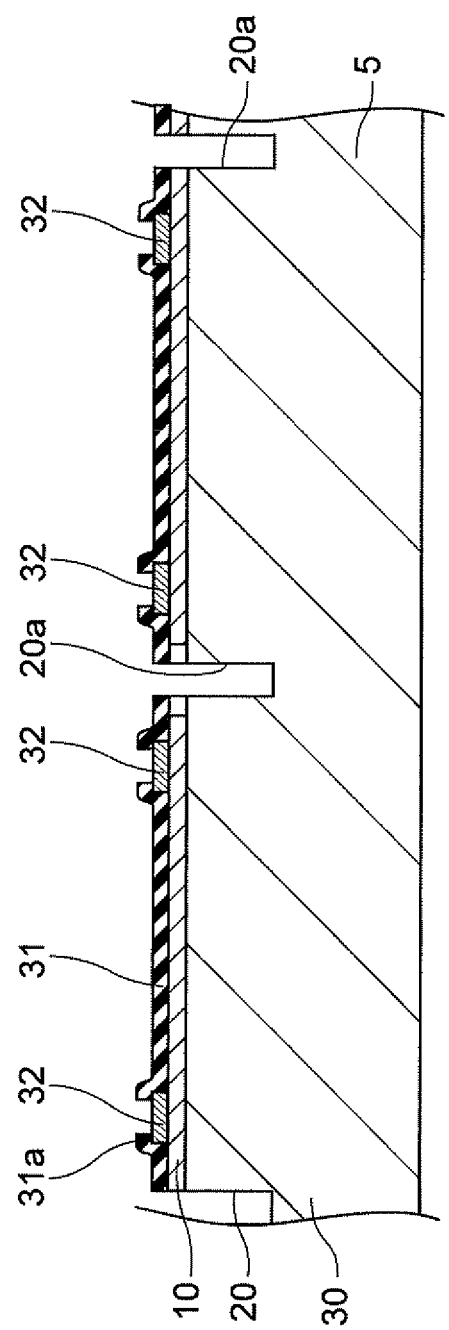
FIG. 14 is a sectional view taken along the line 14-14 in FIG. 7.
Figure 19:
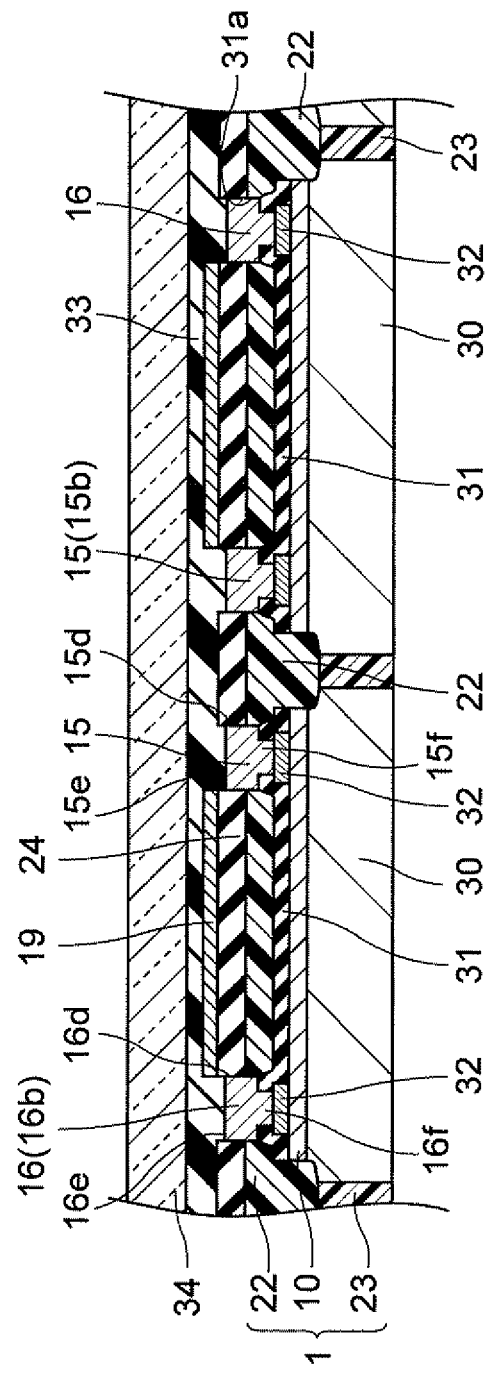
FIG. 19 is a sectional view similar to FIG. 14, illustrating the partially manufactured laminated semiconductor wafer and a base.
Figure 20:
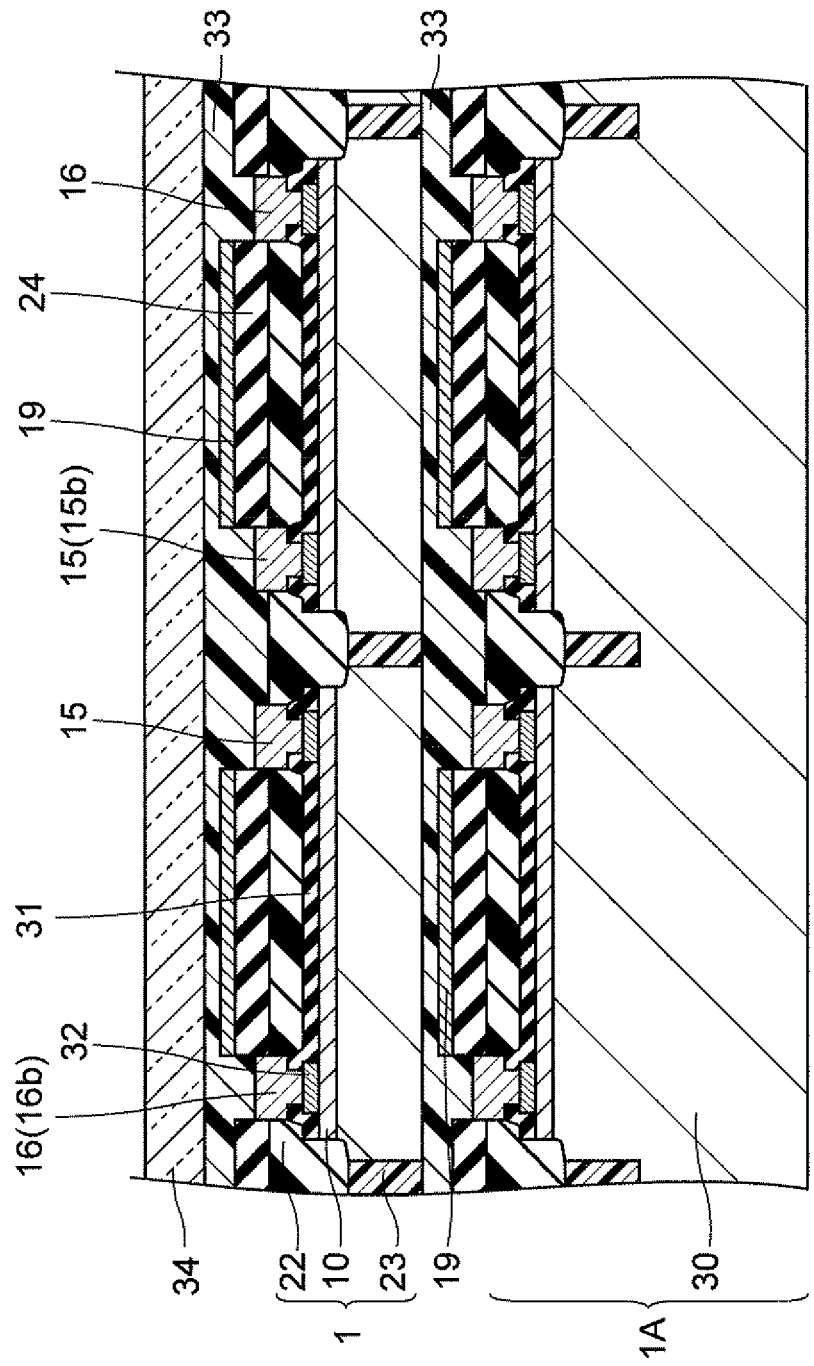
FIG. 20 is a sectional view similar to FIG. 14, illustrating the process subsequent to that in FIG. 19.
Figure 21:
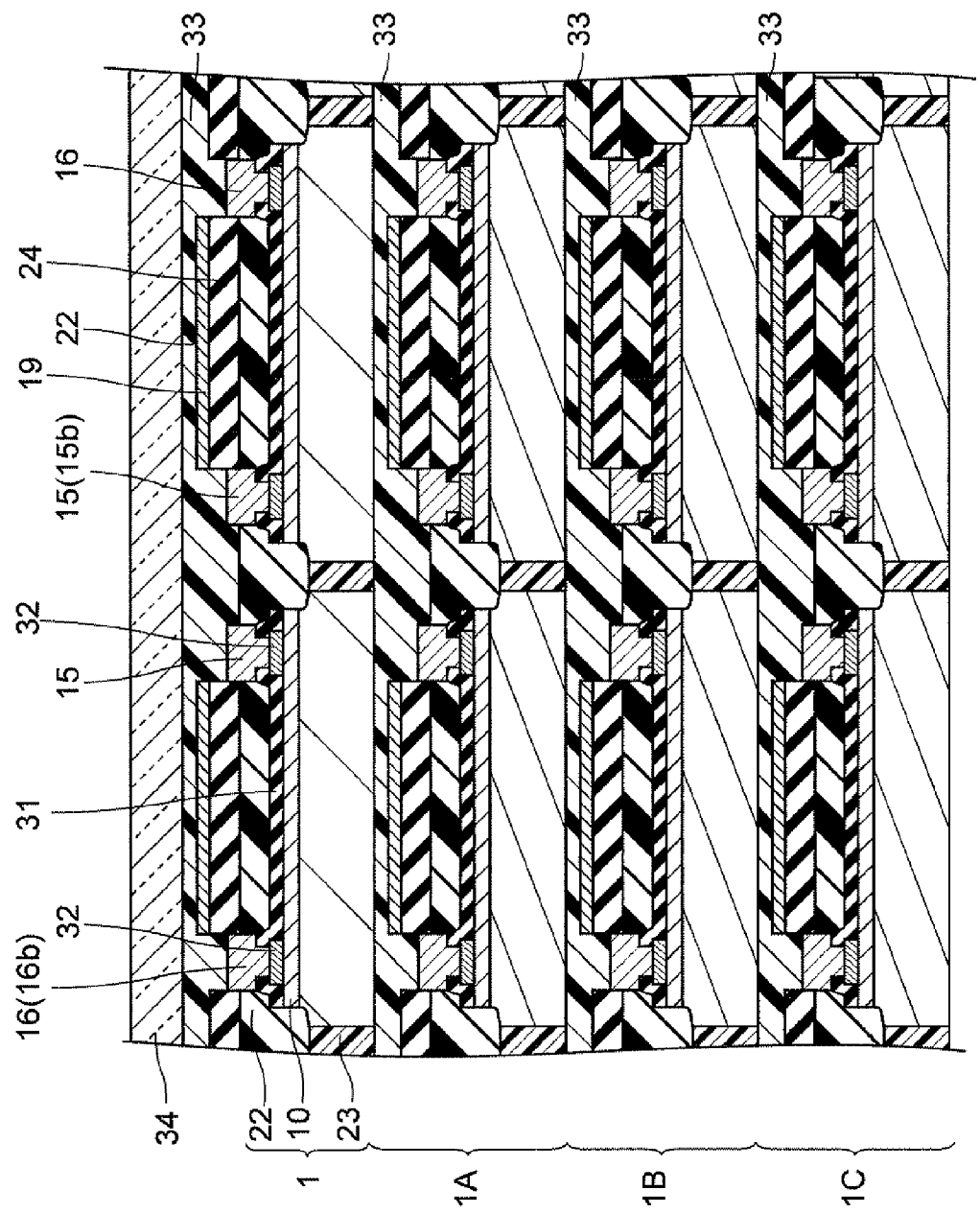
FIG. 21 is a sectional view similar to FIG. 14, illustrating the process subsequent to that in FIG. 20.

Subsequently, the method of manufacturing the laminated semiconductor wafer 98 having the above-described structure will be described with reference to FIG. 7 to FIG. 21. Here, FIG. 7 is a plan view similar to FIG. 2, illustrating the partially manufactured laminated semiconductor wafer, and FIG. 8 is a plan view similar to FIG. 2, illustrating the laminated semiconductor wafer subsequent to that in FIG. 7. FIG. 9 to FIG. 11 is a plan view similar to FIG. 2, illustrating the laminated semiconductor wafer subsequent to that in the order. FIG. 12 is a sectional view of the laminated semiconductor wafer mainly illustrating the groove part, in which (A) shows a state in which a first groove part forming step has been executed, and (B) shows a state in which a second groove part forming step has been executed. FIG. 13 is a sectional view of the laminated semiconductor wafer subsequent to that in FIG. 12, in which (A) shows a state in which the lower insulating layer has been formed and (B) shows a state in which the upper insulating layer and the surface insulating layer have been formed. FIG. 14 to FIG. 18 is a sectional view taken along the line 14-14, the line 15-15, the line 16-16, the line 17-17, the line 18-18 in FIG. 7 to FIG. 11, respectively. FIG. 19 to FIG. 21 is a sectional view similar to FIG. 14, illustrating the laminated semiconductor wafer subsequent to that in the order. Note that hatching is given to the surface insulating layer 22 in FIG. 10 and FIG. 11 for convenience of illustration.

For manufacturing the laminated semiconductor wafer 98, to begin with, a groove part forming process is performed. In the groove part forming process, eight wafers (unprocessed wafers) 5 are prepared which has memory parts and a plurality of connecting pads 32 formed in the device regions 10 by performing wafer process. Then, the protecting insulating layer 31 is formed on the first surface 1a for the respective unprocessed wafer 5, and then the connecting holes 31a are formed at the locations in the protecting insulating layer 31 where the connecting pads 32 are to be formed, as illustrated in FIG. 14. The first surface 1a is a surface of the unprocessed wafer 5 at the side where the device regions 10 are formed. Next, the groove parts 20 and 21 are formed along the scribe lines 3A and 3B. The groove parts 20 and 21 are able to be formed by the dicing saw, and may be formed by etching such as the reactive ion etching or the like.

When forming the groove parts 20 and 21, the following first groove part forming step and second groove part forming step are sequentially executed.

In the first groove part forming step, as illustrated in FIG. 7, FIG. 12(A), and FIG. 14, groove parts (first groove parts 120) having a first width and a first depth are formed in the first surface 1a along the scribe lines 3A and 3B using a not-shown first blade (cutting blade). In the first groove part 120, a part having a certain height from its bottom part will form the groove lower part 20a or the groove lower part 21a afterward. Here, the first width, which is the above-described width w1, is about 60 μm to about 80 μm, and the first depth, which is the depth d0 illustrated in FIG. 12(A), is about 40 μm to about 80 μm.

Figure 15:
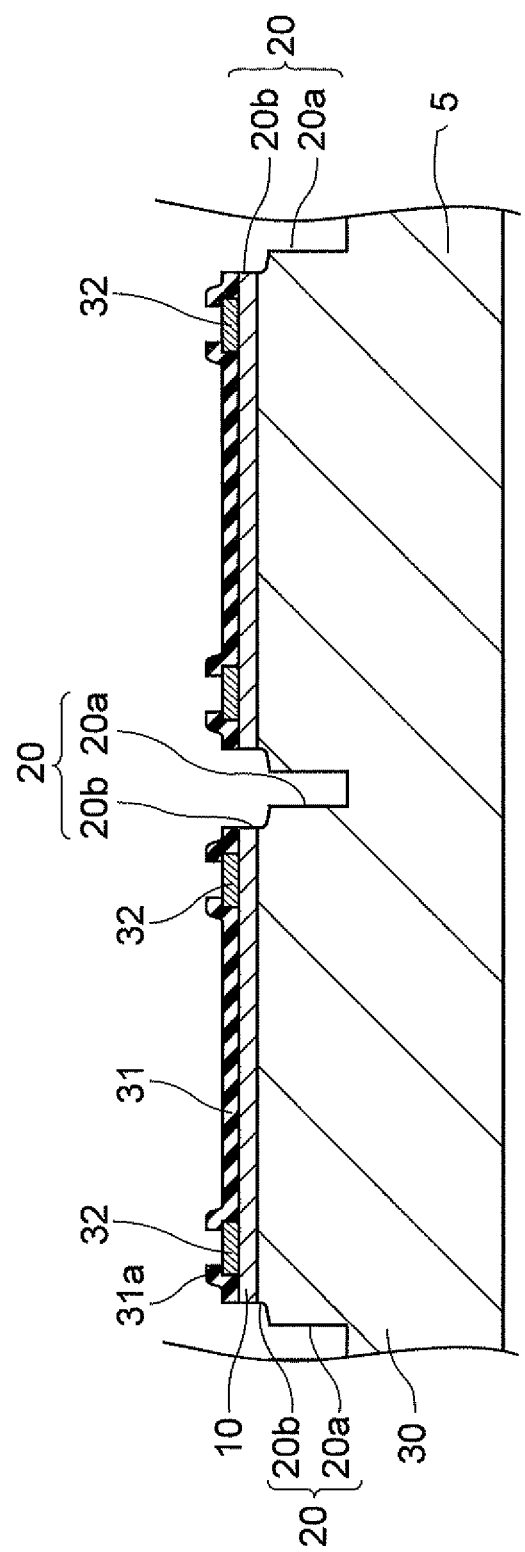
FIG. 15 is a sectional view taken along the line 15-15 in FIG. 8.

Subsequently, the second groove part forming step is executed. In the second groove part forming step, as illustrated in FIG. 8, FIG. 12(B), and FIG. 15, second groove parts 121 are formed at the inlet ports of the first groove parts 120 along the entire length direction of the first groove parts 120 using a not-shown second blade. The second groove part 121 has a second width and a second depth. The second width, which is the above-described width w2, is about 80 μm to about 120 μm, and the second depth, which is the above-described depth d2, is about 10 μm to about 40 μm. The second width is larger than the first width, and the second depth d2 is shallower than the first depth d0 (d0>d2). By forming the second groove parts 121, parts having a certain height from the bottom parts of the first groove parts 120 form the groove lower parts 20a and the groove lower parts 21a, and parts on the upper side of the groove lower parts 20a and the groove lower parts 21a form the wide width parts 20b and the wide width parts 21b, respectively.

By forming a plurality of each of the groove parts 20, 21 in the above-described manner, the unprocessed wafer 5 including the plurality of device regions 10 is formed.

Then, an insulating layer forming step is executed. In the insulating layer forming step, prior to application of a resin for forming the surface insulating layer 22 (referred also to as a resin for surface layer), a low-viscosity resin having a viscosity lower than that of the resin for surface layer is applied to the first surface 1a. Then, the low-viscosity resin is uniformly spread over the first surface 1a using a not-shown spin coater. The low-viscosity resin has a high flowability because it is purling due to its low viscosity. Therefore, the low-viscosity resin surely enters the inside of the groove lower parts 20a and the groove lower parts 21a which a resin relatively hardly enters. In addition, due to the formation of the wide width parts 20b and 21b on the upper side of the groove lower parts 20a and the groove lower parts 21a respectively, the low-viscosity resin more easily enter the inside of the groove lower parts 20a and the groove lower parts 21a.

Figure 16:
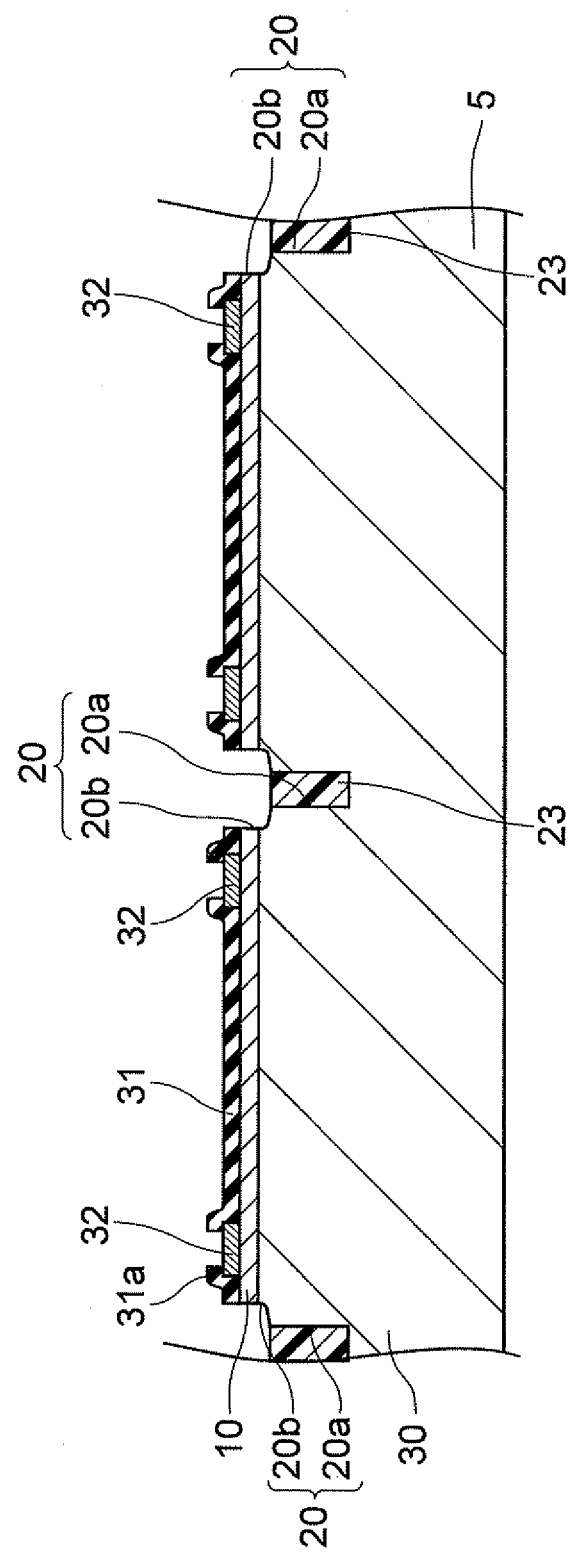
FIG. 16 is a sectional view taken along the line 16-16 in FIG. 9.

Thus, as illustrated in FIG. 9, FIG. 13(A), and FIG. 16, the low-viscosity resin remaining inside the groove lower parts 20a and the groove lower parts 21a forms the lower insulating layer 23. Note that the low-viscosity resin not only enters the inside of the groove parts 20 and 21 but also sometimes remains outside the groove parts 20 and 21 (for example, on the upper side of the protecting insulating layer 31) though illustration of the low-viscosity resin remaining outside the groove parts 20 and 21 is omitted.

Figure 17:
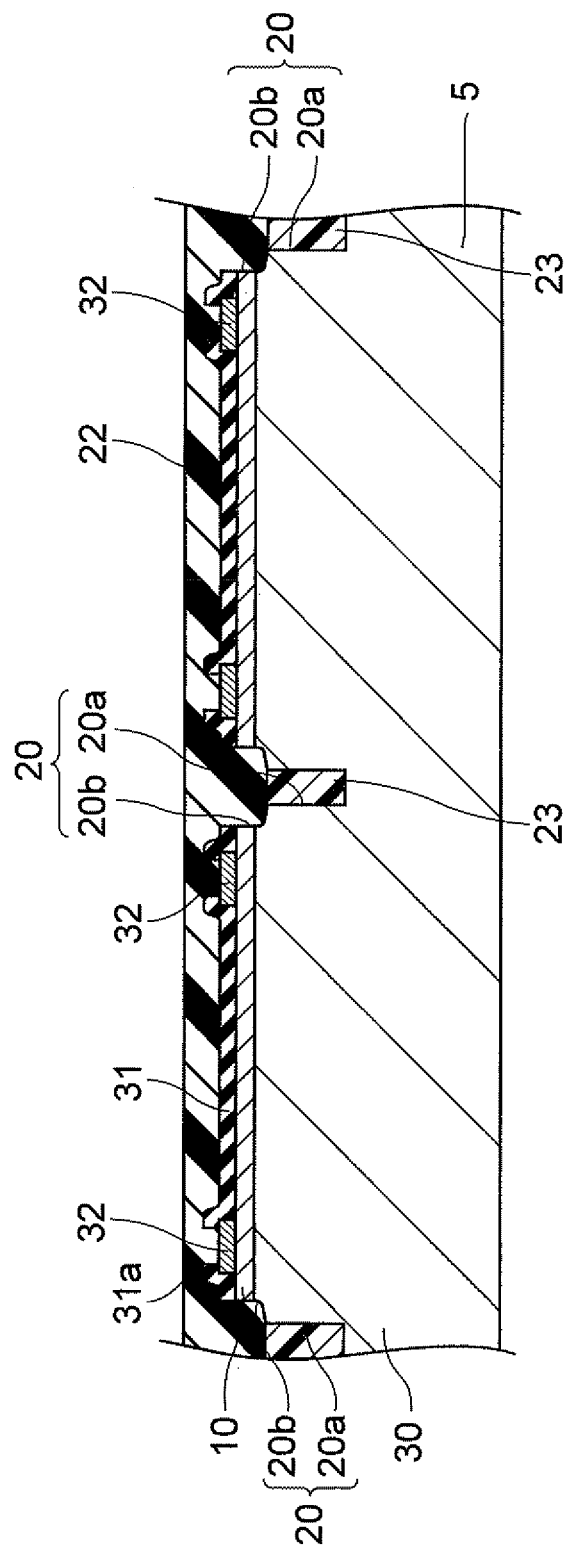
FIG. 17 is a sectional view taken along the line 17-17 in FIG. 10.

Next, a resin for surface layer is applied to the entire first surface 1a as illustrated in FIG. 10, FIG. 13(B), and FIG. 17. Then, the applied resin for surface layer is uniformly spread over the first surface 1a using the not-shown spin coater. The resin for surface layer is, for example, epoxy resin, polyimide resin or the like and is higher in viscosity and lower in flowability than the low-viscosity resin. Therefore, the resin for surface layer hardly enters the inside of a groove part having a narrower width and a deeper depth. However, the wide width parts 20b and 21b are formed at the inlet ports of the groove parts 20 and 21. Thus, the resin for surface layer easily enters the inside of the groove parts 20 and 21.

By the application of the low-viscosity resin prior to the application of the resin for surface layer, the lower insulating layer 23 has been formed in the groove lower parts 20a and the groove lower parts 21a. Therefore, when the resin for surface layer enters the inside of the groove parts 20 and 21, by the resin for surface layer, an insulating layer different from the lower insulating layer 23 is formed inside the groove parts 20 and 21. This insulating layer forms the upper insulating layer 22a. Thus, the insulating layer having the double-layer structure is formed inside the groove parts 20 and 21.

Subsequently, the surface of the unprocessed wafer 5 is polished to be planarized. Thus, the surface insulating layer 22 is formed to cover the entire surface of the unprocessed wafer 5. The parts of the applied resin for surface layer entered into the groove parts 20 and 21 form the upper insulating layer 22a, so that the surface insulating layer 22 is formed integrally with the upper insulating layer 22a.

Figure 18:
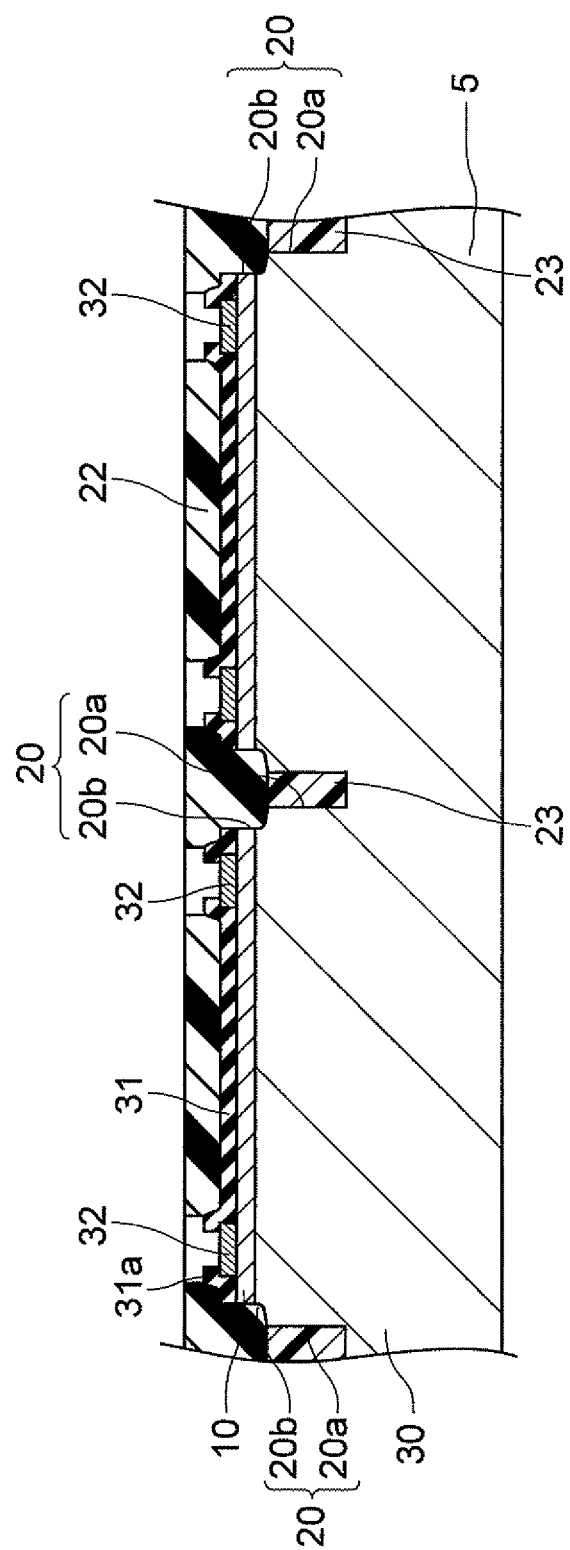
FIG. 18 is a sectional view taken along the line 18-18 in FIG. 11.

Subsequently, as illustrated in FIG. 11 and FIG. 18, the contact holes 22b are formed in the surface insulating layer 22 to expose the connecting pads 32. Thereafter, a wiring electrode forming process is performed to form the wiring electrodes 15 and 16. The wiring electrodes 15 and 16 are formed in a shape having the above-described protruding structure and including the extended terminal parts 15a and 16a respectively. The extended terminal parts 15a and 16a are formed in a shape extending from the device regions 10 to the inside of the groove parts 20. The wiring electrodes 15 and 16 can be formed, for example, in the procedure as follows.

First, a not-shown seed layer for plating is formed on the surface insulating layer 22. Next, a frame (not shown) including groove potions is formed on the seed layer. The frame is formed, for example, by patterning a photoresist by the photolithography. Further, a plating layer which will be parts of the wiring electrodes 15 and 16 is formed within the groove parts of the formed frame and on the seed layer. Subsequently, the frame is removed, and a part of the seed layer other than the part which exists under the plating layer is removed by etching. By the above processing, the wiring electrodes 15 and 16 can be formed of the plating layer and the seed layer under the plating layer.

Because, the wiring electrodes 15 and 16 are formed after the formation of the surface insulating layer 22, the extended terminal parts 15a and 16a are formed in a manner that they are wholly disposed on the surface 22c of the surface insulating layer 22. The electrode pads 15b and 16b are formed such that their peripheral parts are disposed upper side of the surface 22c and their center parts are embedded inward from the surface 22c to connect with the connecting pads 32.

After the wiring electrodes 15, 16 are formed by executing the wiring electrode forming process, an electromagnetic shielding layer forming process is executed. In the electromagnetic shielding layer forming process, regarding all of the eight unprocessed substrates 5, the electrode insulating layer 24 and the electromagnetic shielding layer 19 are formed respectively. For example, the electrode insulating layer 24 is formed on the device regions 10 as follows.

First, a resist pattern in a lattice form covering the surface of the groove parts 20, 21, the extending zone 10b and the pad zone 10c is formed using a photoresist. Then, an insulating resin such as epoxy resin, polyimide resin or the like is applied to the entire first surface 1a of the unprocessed substrate 5. Thereafter, planarization of the surface of the resin is performed to form the electrode insulating layer 24. Subsequently, the electromagnetic shielding layer 19 is formed on the electrode insulating layer 24. The electromagnetic shielding layer 19 is able to be formed, for example, by sputtering using a soft magnetic material. The electromagnetic shielding layer 19 may be formed by the plating method.

Then, by removing the resist pattern, the electrode insulating layer 24 and the electromagnetic shielding layer 19 are formed on the device regions 10. Thus, the electromagnetic shielding layers 19 are formed in the shielding regions 10d of the respective device regions 10. The shielding regions 10d are set in the regions excluding the extending zone 10b and the pad zone 10c in the device regions 10. By executing the electromagnetic shielding layer forming process, all of the eight unprocessed substrates 5 become the substrates with shielding layer in the present invention, so that all of the eight unprocessed substrates 5 have the configuration as the substrates with shielding layer. Besides, the unprocessed substrates 5 become the above-described semiconductor wafer 1 by the formation of the electrode insulating layer 24 and the electromagnetic shielding layer 19. Note that the substrate with shielding layer means the substrate with groove having the electromagnetic shielding layer.

Subsequently, laminating process is performed. In the laminating process, a plurality of semiconductor wafers 1 (eight, in this embodiment) manufactured by the above-described process are laminated.

First, as illustrated in FIG. 19, an insulating adhesive is applied on the first surface 1a of the semiconductor wafer 1 to fix it to the base 34. In FIG. 19, the adhesive layer 33 made of the adhesive applied at this time is shown. Since the semiconductor wafer 1 is laminated in the top side of the laminated semiconductor wafer 98, the semiconductor wafer 1 becomes an uppermost substrate. The base 34 is a member for supporting the semiconductor wafer 1, and a glass plate is used for the base 34 in FIG. 19. By applying the adhesive, the adhesive layer 33 is formed on the side of the first surface 1a of the semiconductor wafer 1.

Subsequently, the second surface 1b of the semiconductor wafer 1 is polished until the groove parts 20 and 21 appear so that the thickness of the semiconductor wafer 1 is decreased as illustrated in FIG. 19.

Next, another semiconductor wafer 1A having the same structure as that of the semiconductor wafer 1 is prepared and bonded to the second surface 1b side of the semiconductor wafer 1 as illustrated in FIG. 20 using an adhesive. In this event, position adjustment of the semiconductor wafer 1 and the semiconductor wafer 1A is performed such that the positions of the groove parts 20 and 21 of both of them coincide with each other. Then, the second surface 1b of the semiconductor wafer 1A is polished until the groove parts 20 and 21 appear.

Further, as illustrated in FIG. 21, other semiconductor wafers 1B and 1C having the same structure as that of the semiconductor wafer 1 are prepared. Then, for each of the semiconductor wafers 1B and 1C, a process of bonding it to the second surface 1b side of the laminated body and polishing it (a bonding and polishing process) is performed.

Continuously, the bonding and polishing process is repeatedly performed and then the base 34 and the adhesive layer 33 are removed, whereby the above-described laminated semiconductor wafer 98 is manufactured. In the laminated semiconductor wafer 98, the semiconductor wafer 1 and the semiconductor wafers 1A, 1B, 1C, 1D, 1E, 1F, and 1G are stacked so that eight semiconductor wafers in total are laminated.

(Operation and Effect of Laminated Semiconductor Wafer 98)

As described above, in the laminated semiconductor wafer 98, all of the eight semiconductor wafers 1, 1A to 1G has the electromagnetic shielding layer 19 respectively. The electromagnetic shielding layer 19 is formed using the soft magnetic material and therefore has an extremely high magnetic permeability and allows lines of magnetic force to pass therethrough more easily incommensurable with other material. Therefore, most of the lines of magnetic force existing near the laminated semiconductor wafer 98 pass through the electromagnetic shielding layers 19. Accordingly, the electromagnetic shielding layers 19 have an effect of detouring the lines of magnetic force to prevent the lines of magnetic force from passing through a part to be protected. Further, the electromagnetic shielding layer 19 has a remarkably low resistivity so that electric current much more easily flows the electromagnetic shielding layer 19 than through the silicon substrate 30 or the in-groove insulating layer 22.

Figure 42:
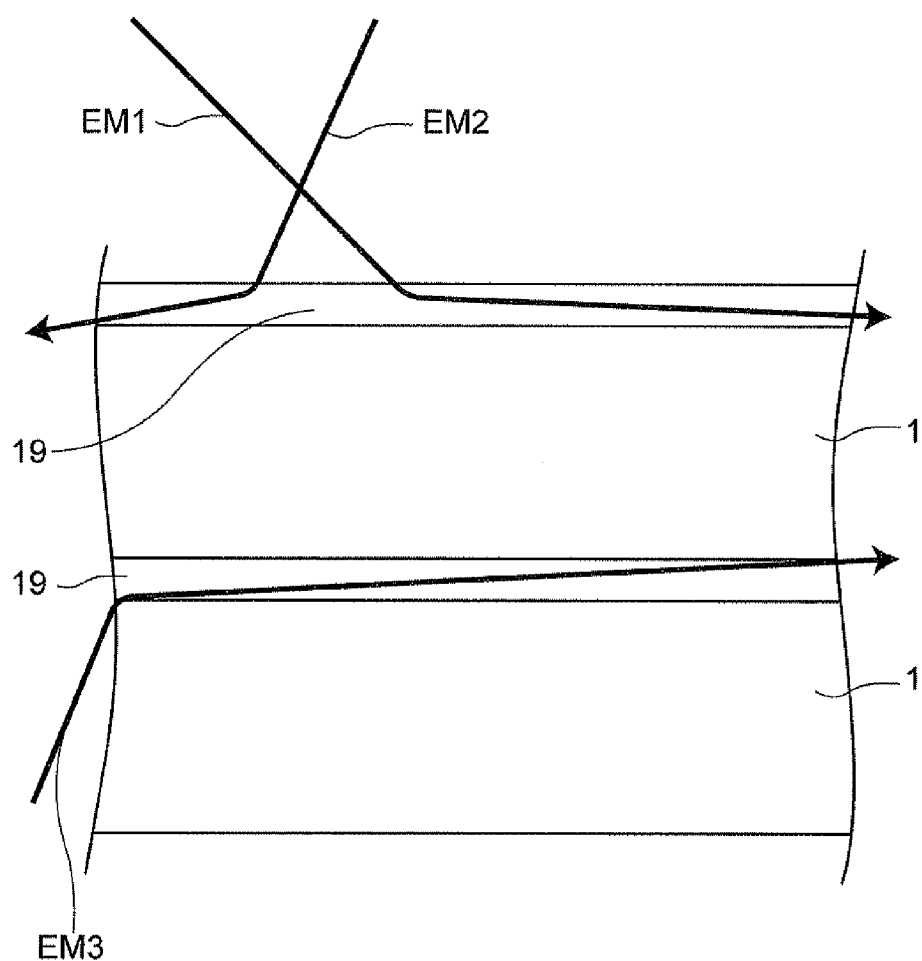
FIG. 42 is a view schematically illustrating the passages of the electromagnetic waves passing through electromagnetic shielding layers.

Accordingly, in the laminated semiconductor wafer 98, for example, when electromagnetic waves EM1, EM2, EM3 exist under the external environment as illustrated in FIG. 42, the respective magnetic field components will pass through the electromagnetic shielding layers 19. Further, the electromagnetic shielding layers 19 exist on the routes along which the electromagnetic waves EM1, EM2, EM3 propagate, and the electromagnetic shielding layers 19 are formed of a metal through which electric current easily flows. Therefore, the electric currents according to the electric field energies of the electromagnetic waves EM1, EM2, EM3 flow through the electromagnetic shielding layers 19. Then, the electric field components of the electromagnetic waves EM1, EM2, EM3 are cancelled, whereby the electric field components of the electromagnetic waves EM1, EM2, EM3 attenuate.

The electromagnetic shielding layers 19 detour the electromagnetic waves EM1, EM2, EM3 and attenuate them as described above, thereby making it possible to prevent the electromagnetic waves EM1, EM2, EM3 from affecting the device regions 10.

Further, the conductive material such as copper or aluminum has a remarkably low resistivity and allows electric current to easily flow therethrough, but exhibits no or little magnetism and has a magnetic permeability much lower than that of the soft magnetic material because the conductive material is a paramagnetic material. For this reason, the layer for shielding against the electromagnetic waves that is formed of the conductive material such as copper, aluminum or the like cannot detour the magnetic fields, unlike the electromagnetic shielding layer 19. Since the electromagnetic waves proceed through a space by changes in the electric field and the magnetic field being propagated like a chain reaction, it is preferable to shield against both of the electric field and the magnetic field in order to enhance the effect of shielding against the electromagnetic waves. In this regard, the laminated semiconductor wafer 98 has the electromagnetic shielding layers 19 and thus is able to enhance the effect of shielding against the electromagnetic waves and achieve the special shielding effect that cannot be achieved by the shielding layer made of the conductive material such as copper or aluminum.

Meanwhile, the laminated semiconductor wafer 98 is manufactured by sequentially laminating the eight semiconductor wafers 1, 1A to 1G as will be described later in detail.

By cutting the laminated semiconductor wafer 98 along the groove parts 20, 21, later-described laminated chip packages 100 are manufactured.

In the laminated semiconductor wafer 98, each of the semiconductor wafers 1, 1A to 1G has the electromagnetic shielding layer 19 and has the effect of shielding against the electromagnetic waves. As well as the laminated semiconductor wafer 98 before the laminated chip packages 100 are cut out of it, the individual semiconductor wafers 1, 1A to 1G that are the materials of the laminated semiconductor wafer 98 have the respective electromagnetic shielding layers 19. Accordingly, the effect of shielding against the electromagnetic waves can be achieved for a long time from the wafer stage corresponding to a comparatively preceding stage in the manufacturing process of the laminated chip package 100 to the post-completion stage of the laminated semiconductor wafer 98. Further, each of the eight semiconductor wafers 1, 1A to 1G has the electromagnetic shielding layer 19 and thereby more surely shield against the electromagnetic waves. Accordingly, the laminated semiconductor wafer 98 has an effect of highly shielding against the electromagnetic waves existing under the external environment and is configured to be capable of sufficiently avoiding the influence of the electromagnetic waves.

Further, in the laminated semiconductor wafer 98, the electromagnetic shielding layer 19 is not formed in the extending zone 10b and the pad zone 10c but formed in the shielding region 10d in each of the device regions 10 in the individual semiconductor wafers 1, 1A to 1G. The shielding region 10d is set to be a region in each device region 10 except the extending zone 10b and the pad zone 10c. The extending zone 10b is a part including the cross boundary 10Aa of the peripheral edge part 10A as illustrated in FIG. 5, which is a part that the extended terminal part 15a and the extended terminal part 16a cross.

It is assumed here that when the laminated chip package 100 is manufactured, the laminated semiconductor wafer 98 is cut along the groove part 20 using a blade having the same width as that of the groove part 20. Then, the extended terminal parts 15a and the extended terminal parts 16a extend from the device region 10 to the inside of the groove part 20, so that the extended terminal parts 15a and the extended terminal parts 16a are cut, and parts of the extended terminal parts 15a and the extended terminal parts 16a extending to the inside of the groove part 20 more than the cross boundary 10Aa are removed. Then, the cross sections of the extended terminal parts 15a and the extended terminal parts 16a appear just on the cross boundary 10Aa.

However, since the electromagnetic shielding layer 19 is formed in the shielding region 10d except the extending zone 10b, the electromagnetic shielding layer 19 is free from the above-described cutting by the blade. Therefore, the section of the electromagnetic shielding layer 19 never appears at the cut surface. Accordingly, even when later-described connection electrodes 60 are formed, the electromagnetic shielding layer 19 is never connected to the connection electrodes 60.

In the laminated semiconductor wafer 98, to make the wiring electrodes 15, 16 appear at the cut surface when the laminated semiconductor wafer 98 is cut along the groove parts 20, 21, the extended terminal parts 15a and the extended terminal parts 16a extend to the inside of the groove part 20 from the device region 10. In such structure, a part which the extended terminal parts 15a and the extended terminal parts 16a cross is formed in the peripheral edge part 10A of the device region 10. Exclusion of this part from the target of shielding will prevent the electromagnetic shielding layer 19 from appearing at the cut surface. Therefore, that part is excluded from the target of shielding by the electromagnetic shielding layer 19, as the extending zone 10b, to avoid connection of the connection electrodes 60 to the electromagnetic shielding layer 19, which is the concept of this embodiment.

As described above, the laminated semiconductor wafer 98 is configured such that even when the connection electrodes 60 are formed at the cut surface when the laminated semiconductor wafer 98 is cut along the groove parts 20, 21, the electromagnetic shielding layer 19 is never connected to the connection electrodes 60 so that the electromagnetic shielding layer 19 and the connection electrodes 60 are surely insulated from each other.

Figure 43:
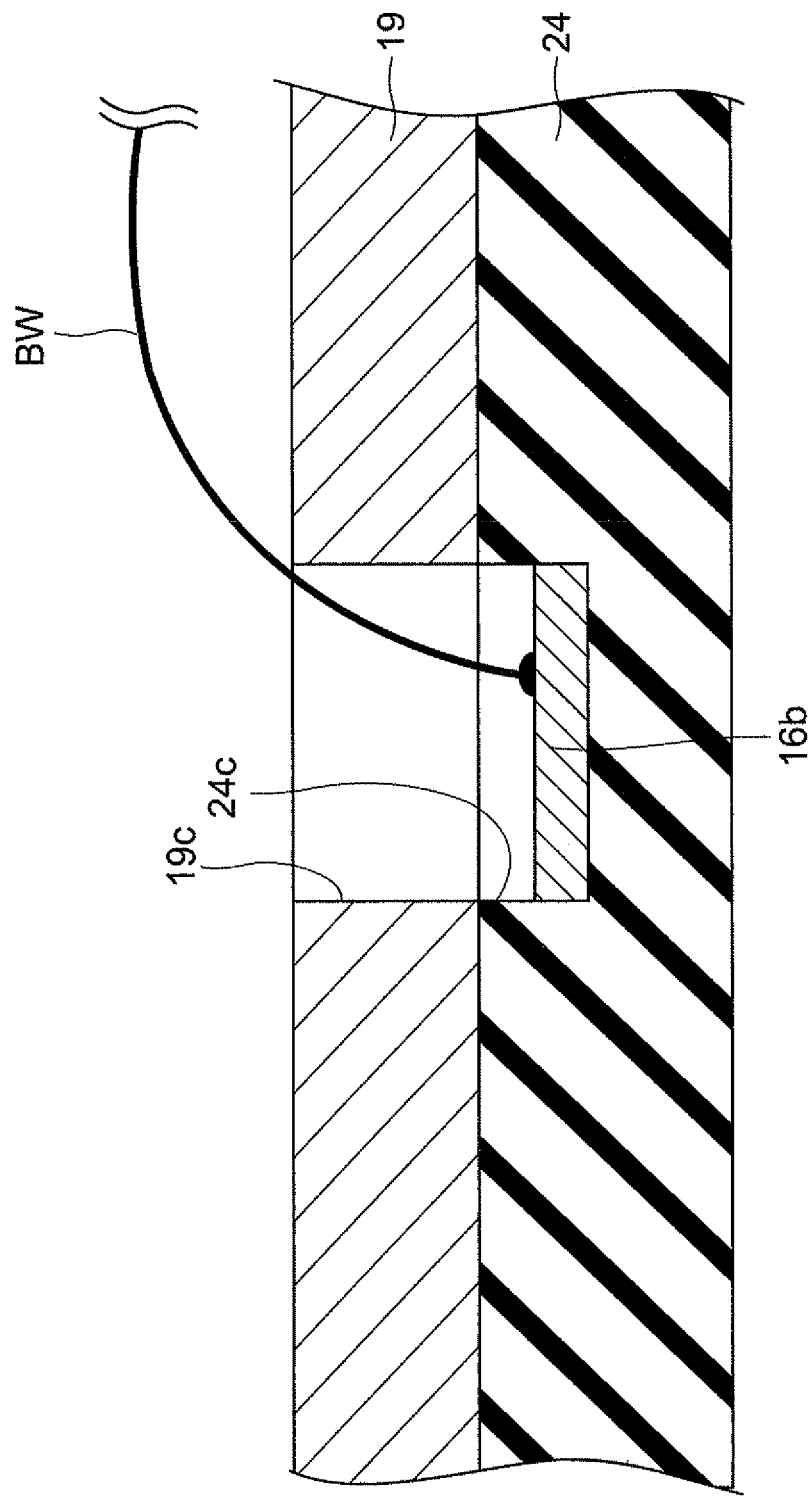
FIG. 43 is a sectional view illustrating connecting holes of an electromagnetic shielding layer and an electrode insulating layer.

Further, in the laminated semiconductor wafer 98, the region except the pad zone 10c together with the extending zone 10b is set to be the shielding region 10d. In the pad zone 10c, the electrode pads 16b are arranged. A not-shown bonding wire is connected to the electrode pad 16b, so that when the electrode insulating layer 24 and the electromagnetic shielding layer 19 are formed in the pad zone 10c, connecting holes 19c, 24c need to be formed in the electromagnetic shielding layer 19 and the electrode insulating layer 24 respectively as illustrated in FIG. 43. However, when a bonding wire BW is connected to the electrode pad 16b, the bonding wire BW is undesirably likely to contact with the electromagnetic shielding layer 19. To avoid such situation, the region except the pad zone 10c is set to be the shielding region 10d in this embodiment.

Meanwhile, when cutting the laminated semiconductor wafer 98 along the groove parts 20, 21, the groove parts 20, 21 are cut along cut lines CL illustrated in FIG. 6. However, the groove parts 20, 21 can be cut along wide width parts 20b, 21b depending on the width of the blade in some case. Even in this case, the section of the electromagnetic shielding layer 19 never appears at the cut surface because the electromagnetic shielding layer 19 is formed in the shielding region 10d. In the laminated semiconductor wafer 98, the electromagnetic shielding layer 19 which is formed in the shielding region 10d allows use of various blades.

Further, the electromagnetic shielding layer 19 can be formed for each of the semiconductor wafers 1, 1A to 1G. Though many semiconductor chips are included only in the semiconductor wafer 1, the electromagnetic shielding layer 19 can be formed not only for the individual semiconductor chips but for all of the semiconductor chips in block. Thus, less burden is required for forming the electromagnetic shielding layer 19, so that the electromagnetic shielding layer 19 can be formed easily and in a short time.

Since all of the eight semiconductor wafers 1, 1A to 1G each have the electromagnetic shielding layer 19, the shielding effect is able to be obtained in each of the semiconductor wafers 1, 1A to 1G, resulting in a higher shielding effect. For example, when there are electromagnetic waves proceeding toward the side surface of the laminated semiconductor wafer 98, the electromagnetic shielding layers 19 that are the passage for the electromagnetic waves are provided at eight locations. This easily makes the magnetic field components of the electromagnetic waves to detour and attenuate the electric field components. Accordingly, in the laminated semiconductor wafer 98, the shielding effect is able to be enhanced.

Further, the electromagnetic shielding layer 19 is formed covering all of the plurality of device regions 10 from the outside and thus is able to effectively protect all of the plurality of device regions 10 from the electromagnetic waves. Since the respective electromagnetic shielding layers 19 are evenly arranged along the laminated direction, uniform shielding effect can be expected in each of the semiconductor wafers 1, 1A to 1G. The electromagnetic shielding layers 19 are formed in the shielding region 10d, so that the electromagnetic shielding layer 19 is formed at parts where the effect of electromagnetic shielding layer are effectively exhibited. This configuration makes it possible to cut the waste of the soft magnetic material for forming the electromagnetic shielding layer 19 while the electromagnetic shielding layer 19 more effectively exhibits the shielding effect, and reduce the manufacturing cost of the laminated semiconductor wafer 98 and the laminated chip package 100. Since the adjacent individual electromagnetic shielding layers 19 are insulated from one another without contact, the individual electromagnetic shielding layers 19 individually shield all of the plurality of device regions 10 while keeping the respective insulating states.

In the laminated semiconductor wafer 98, the lowermost semiconductor wafer 1G also has the electromagnetic shielding layer 19. Therefore, if there are electromagnetic waves entering from the rear surface side, the electromagnetic waves reach the electromagnetic shielding layer 19 of the semiconductor wafer 1G before entering deep in the laminated semiconductor wafer 98, and thus the electromagnetic waves do not affect the semiconductor wafers 1, 1A to 1F. Accordingly, it is possible to shield against the electromagnetic waves entering from the rear surface side in the laminated semiconductor wafer 98, so that the shielding effect is enhanced.

In the laminated semiconductor wafer 98, the eight semiconductor wafers 1, 1A to 1G each having the electromagnetic shielding layer 19 are laminated. Therefore, for example, regarding the semiconductor wafer 1, the electromagnetic shielding layer 19 of the semiconductor wafer 1 is disposed on the upper side of the device region 10 and the electromagnetic shielding layer 19 of the semiconductor wafer 1A is disposed on the lower side of the device region 10.

In other words, the device region 10 of each of the semiconductor wafers 1, 1A to 1F is sandwiched between the two upper and lower electromagnetic shielding layers 19. Accordingly, the effect of shielding against the electromagnetic waves is more effective in the laminated semiconductor wafer 98. Further, the electromagnetic shielding layer 19 is formed to cover the wiring electrode 16 and thus extremely reduces the possibility that the noise caused from the electromagnetic waves mixes into the signal passing through the wiring electrode 16.

In the semiconductor wafer 1, the groove parts 20 and 21 have the wide-port structure so that a liquid resin easily enters the inside of the groove parts 20 and 21. Therefore, when forming an insulating layer inside of the groove parts 20 and 21 using a liquid resin, the resin surely enters the inside of the groove parts 20 and 21. This eliminates a situation that an unfilled part (air gap) that is not filled with the resin is formed inside the groove parts 20 and 21. In short, the whole inside of the groove parts 20 and 21 is filled with the resin.

In the semiconductor wafer 1, the lower insulating layer 23 and the upper insulating layer 22a are formed of the resin filled without forming such an air gap. More specifically, the semiconductor wafer 1 has the groove parts 20 and 21 having a structure in which the inside of the groove parts 20 and 21 is filled with the insulating layer composed of a plurality of resins such as the low-viscosity resin and the resin for surface layer with no space (this structure is referred to as a "filled structure").

Incidentally, when manufacturing the laminated semiconductor wafer 98 using the semiconductor wafer 1, a plurality of semiconductor wafers 1 are laminated. For this reason, the load caused by the semiconductor wafers 1 laminated at the upper part acts on the semiconductor wafer 1 laminated at the lower part, and the load also acts on the extended terminal parts 15a and 16a. Parts on the tip end side of the extended terminal parts 15a and 16a are extended from the device region 10 and located on the upper side of the groove part 20. Therefore, when the load from above acts on the extended terminal parts 15a and 16a, the tip end side of the extended terminal parts 15a and the tip end side of the extended terminal parts 16a, extending from the inlet port 20d of the groove part 20, are likely to bow downward.

In the semiconductor wafer 1, however, the groove parts 20 and 21 have the filled structure, so that the lower insulating layer 23 and the upper insulating layer 22a never move inside the groove parts 20 and 21, and therefore the position of the surface 22c of the surface insulating layer 22 never shifts. The surface insulating layer 22, the upper insulating layer 22a, and the lower insulating layer 23 are supporting members supporting the extended terminal parts 15a and 16a, and their positions never shift so that the extended terminal parts 15a and 16a are surely supported by the surface insulating layer 22, the upper insulating layer 22a, and the lower insulating layer 23 (see FIG. 6). Accordingly, the extended terminal parts 15a and 16a are never deformed and can surely keep their original shapes even when the load from above acts thereon. Thus, by using the semiconductor wafer 1, the electrical connection of the laminated chip package can be surely established (described later for detail).

Further, in the groove parts 20 and 21, the wide width parts 20b and 21b are formed over the entire length direction of their inlet ports 20d. Therefore, the resin easily enters the inside of the whole groove parts 20 and 21. Thus, the extended terminal parts 15a and 16a which are not deformed can be formed at any part of the groove parts 20 and 21.

Since the groove lower parts 20a and 21a of the groove parts and 21 are located closer to the bottom parts, a resin relatively hardly enters them as compared to other parts. Hence, in the semiconductor wafer 1, the lower insulating layer 23 is formed inside the groove lower parts 20a and 21a using the low-viscosity resin. The low-viscosity resin has a high flowability and therefore surely enters even a part hard to enter. Accordingly, the low-viscosity resin is very suitable for making the groove parts 20 and 21 in the filled structure. As described above, by using the low-viscosity resin in the semiconductor wafer 1, the filled structure of the groove parts 20 and 21 is more surely formed.

On the other hand, the resin for surface layer is higher in viscosity and lower in flowability than the low-viscosity resin. Therefore, if the groove parts 20 and 21 are composed only of the groove lower parts 20a and 21a and not in the wide-port structure, the resin for surface layer stays near the inlet port of the groove part 20 (21) and hardly enters the inside thereof. Then, an air gap in which no resin exists appears inside the groove parts 20 and 21 to cause the surface insulating layer 22 on the upper side of the groove parts 20 and 21 to bend. Further, since the resin for surface layer has a low flowability, it is difficult to make the groove part 20 (21) in the filled structure even if the groove part 20 (21) is widened about the width. Accordingly, it is difficult to avoid the situation that the air gap appears inside the groove part 20 (21) as well as to avoid the deformation of the extended terminal parts 15a and 16a by using only the resin for surface layer.

Hence, when manufacturing the semiconductor wafer 1, the low-viscosity resin is applied to the first surface 1a prior to the application of the rein for surface layer. This makes it possible to fill the inside of the groove lower parts 20a and 21a which a resin relatively hardly enters and the resin for surface layer is difficult to enter, with the low-viscosity resin before the inlet ports 20d of the groove parts 20 and 21 are closed with the resin for surface layer. Thus, occurrence of the air gap is completely eliminated, so that the filled structure of the groove parts 20 and 21 can be more surely obtained.

Furthermore, the upper insulating layer 22a and the surface insulating layer 22 can be formed using the same resin in the same one step, and therefore the semiconductor wafer 1 can be easily manufactured.

(Structure of Laminated Chip Package)

Figure 24:
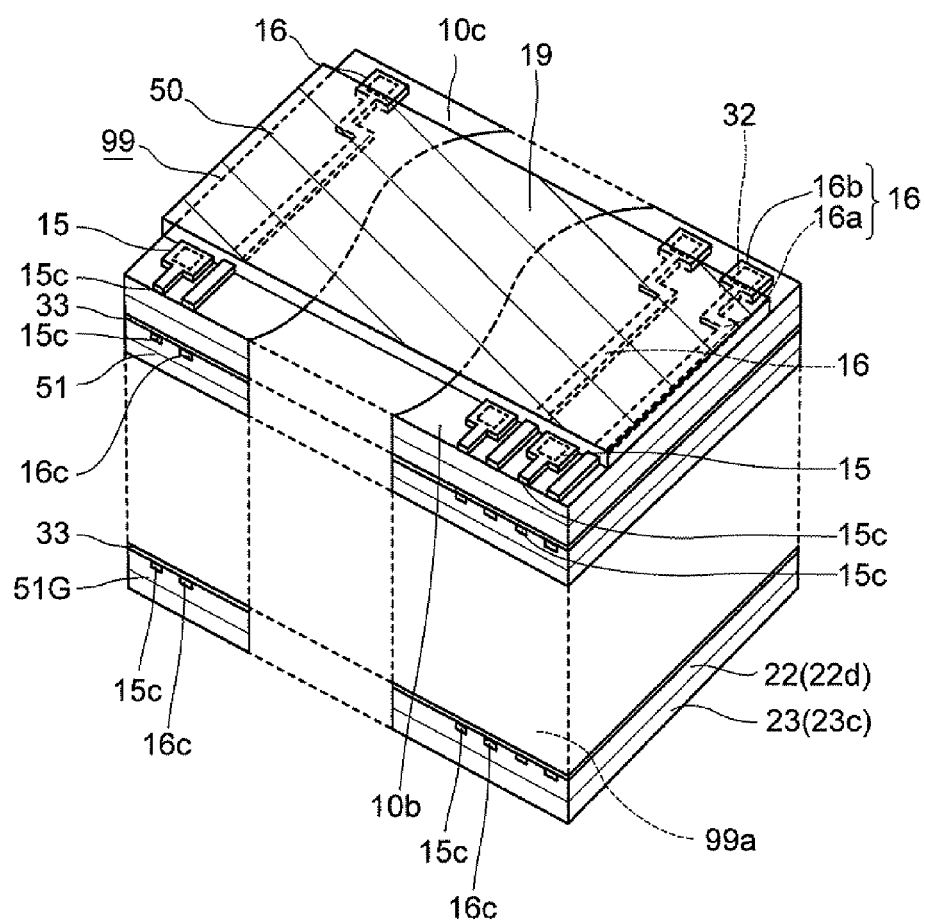
FIG. 24 is a perspective view illustrating an example of a device block.
Figure 25:
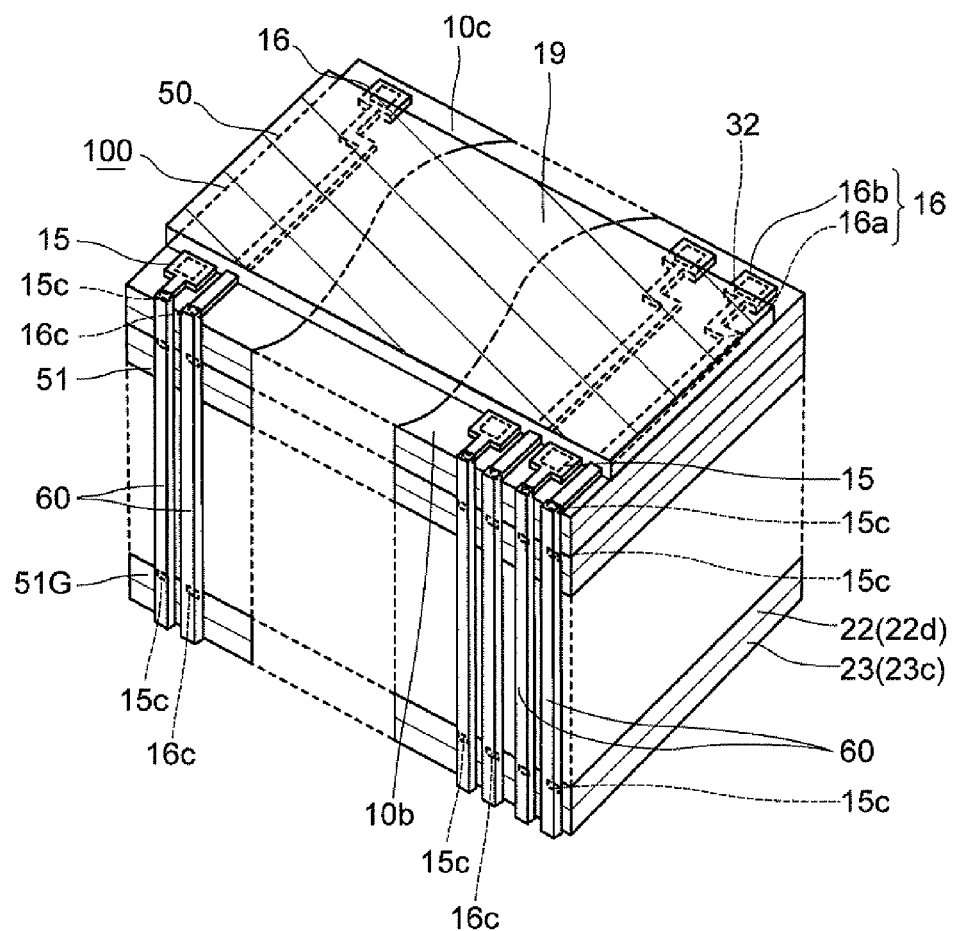
FIG. 25 is a perspective view illustrating an example of the laminated chip package with a part thereof omitted.
Figure 26:
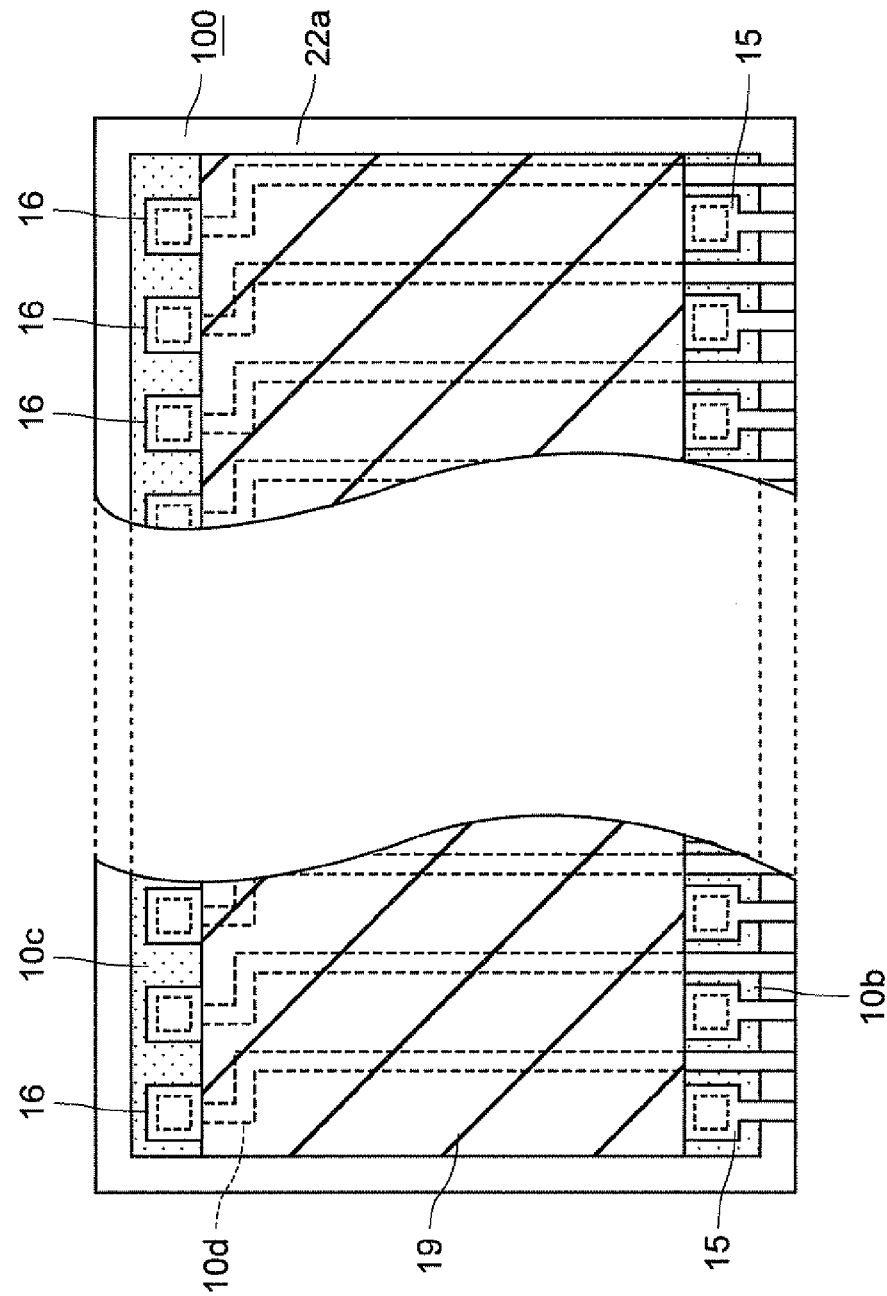
FIG. 26 is a plan view illustrating the laminated chip package similar to FIG. 25.

The structure of the laminated chip package 100 will be described as follows referring to FIG. 23 to FIG. 26. Here, FIG. 23 is a perspective view of a semiconductor chip 50 constituting the laminated chip package 100. FIG. 24 is a perspective view illustrating a device block 99. FIG. 25 is a perspective view illustrating the laminated chip package 100. FIG. 26 is a plan view illustrating the laminated chip package 100.

In the laminated chip package 100, the eight semiconductor chips 50 illustrated in FIG. 23 are laminated. In the laminated chip package 100, the semiconductor chip 50 (50A) as an uppermost chip is laminated in the top side. Under the semiconductor chip 50 (50A), seven semiconductor chips 51 are laminated. The semiconductor chip 51G as an undermost chip is laminated in the bottom side. The respective semiconductor chips 50, 51 are bonded together by the adhesive layers 33.

A plurality of wiring electrodes 15, 16 are formed on the front side of the laminated chip package 100. Besides, the laminated chip package 100 has an insulating layer of the double-layer structure in which the upper insulating layer 22 is laminated on the lower insulating layer 23. This insulating layer of the double-layer structure is formed so as to surround a periphery of the semiconductor chip 50, 51. Since the insulating layer is formed using an insulating resin, the insulating layer has a constitution as a resin insulating layer according to the present invention.

Further, as illustrated in FIG. 25, the laminated chip package 100 has a plurality of connection electrodes 60. In the laminated chip package 100, all of the connection electrodes 60 are formed only on the one wiring side surface 99a in four side surfaces. The connection electrodes 60 are not formed on another side surface. The wiring side surface 99a is illustrated in FIG. 24.

In the wiring side surface 99a, the end faces 15c, 16c in all of the eight semiconductor chips 50, 51 are also formed. The end faces 15c, 16c are sections of the extended terminal parts 15a, 16a when the laminated semiconductor wafer 98 is cut along the groove part 20. The end faces 15c of the extended terminal parts 15a or the end faces 16c of the extended terminal parts 16a are connected to one another by the connection electrodes 60. The connection electrode 60 is formed in a band shape along the laminated direction. The connection electrode 60 connects the end faces 15c or the end faces 16c across all of the eight semiconductor chips 50, 51.

In the laminated chip package 100, each of the eight semiconductor ships 50, 51 has the electromagnetic shielding layer 19 and the electrode insulating layer 24. The electromagnetic shielding layer 19 and the electrode insulating layer 24 are formed in the shielding region 10d as in the laminated semiconductor wafer 98.

Further, all of the eight semiconductor chips 50, 51 are arranged such that their extending zones 10b face the wiring side surface 99a. However, since the electromagnetic shielding layers 19 are formed in the shielding regions 10d in the laminated semiconductor wafer 98, the electromagnetic shielding layers 19 are separated (recessed) from the wiring side surface 99a. Therefore, the sections of the electromagnetic shielding layers 19 do not appear in the wiring side surface 99a. Thus, in the laminated chip package 100, the situation that the connection electrodes 60 are connected to the electromagnetic shielding layers 19 is avoided.

Consequently, in the laminate chip package 100, passing electric current through, for example, one of the connection electrodes 60 never causes a situation that the connection electrode 60 is electrically connected to another connection electrode 60 via the electromagnetic shielding layer 19. The influence when the connection electrodes 60 are connected to each other is never exerted on the semiconductor device in the device region 10. The situation that the connection electrodes 60 are electrically connected to each other via the electromagnetic shielding layer 19 is surely avoided.

Further, since the electromagnetic shielding layer 19 is formed in the shielding region 10d in the laminated semiconductor wafer 98, the electrode pads 16b are not covered by the electromagnetic shielding layer 19 in the semiconductor chip 50. Therefore, even when a bonding wire is connected to the electrode pad 16b, the contact between the bonding wire and the electromagnetic shielding layer 19 is never made.

The laminated chip package 100 can realize memories with various storage capacities such as 64 GB (gigabyte), 128 GB, and 256 GB by varying the memory parts in the semiconductor wafer 1. Note that eight semiconductor chips are laminated in the laminated chip package 100. However, it is sufficient that a plurality of semiconductor chips are laminated, and the number of the semiconductor chips which are laminated within the laminated chip package 100 is not limited to eight.

The laminated chip package 100 having the above-described structure is manufactured using the laminated semiconductor wafer 98, and is thus manufactured under the environment in which the influence of the electromagnetic waves can be sufficiently avoided. Further, since all of the eight semiconductor chips 50, 51 have the electromagnetic shielding layer 19, the laminated chip package 100 itself has the effect of highly shielding against the electromagnetic waves, and has a structure rarely affected by the electromagnetic waves existing under the external environment. Therefore, the noise caused from the electromagnetic waves rarely mixes into the signal passing through the wiring electrode 15.

(Method of Manufacturing Laminated Chip Package)

When the laminated chip package 100 is manufactured, the laminated semiconductor wafer 98 is cut along the groove parts 20 and 21. Thus, a device block 99 in a rectangular parallelepiped shape is obtained as illustrated in FIG. 24.

On the other hand, when cutting the laminated semiconductor wafer 98 along the groove parts 20 and 21, the groove parts 20 and 21 are cut along the cut lines CL as illustrated in FIG. 6. Then, the extended terminal parts 16a (also the extended terminal parts 15a) are cut along the cut lines CL. Further, as described above, the insulating layer of the double-layer structure has been formed inside the groove parts 20 and 21 in each semiconductor wafer 1. Therefore, the section of the insulating layer of the double-layer structure (the section of the insulating layer is referred also to as an "insulating section") appears in a cut surface when the laminated semiconductor wafer 98 is cut along the groove parts 20 and 21. The insulating section is in the double-layer structure in which the section of the upper insulating layer 22a is laminated on the section of the lower insulating layer 23.

Further, the wide width parts 20b and 21b are formed wider than the groove lower parts 20a and 21a in each semiconductor wafer 1. Therefore, the upper insulating layer 22a has a depth larger than that of the lower insulating layer 23 at four side surfaces of the device block 99. This depth means a distance d11 between the insulating section and the inner side surface of the wide width part 20b (21b) and a distance d12 between the insulating section and the inner side surface of the groove lower part 20a (21a) in the device block 99 (also in the laminated chip packaged 100 and later-described device plates 50 and 51) as illustrated in FIG. 6. The distance d11 is larger than the distance d12 and therefore d11>d12.

Subsequently, by forming connection electrodes 60 on the wiring side surface 99a as illustrated in FIG. 25, the laminated chip package 100 is manufactured. The connection electrodes 60 are formed in a band shape to connect the plural vertically arranged end faces 15c or the plural vertically arranged end faces 16c.

The laminated chip package 100 is manufactured by forming the connection electrodes 60 on the wiring side surface 99a. The end faces 15c and 16c connected by the connection electrodes 60 are formed in a manner to project upward from the surface 22c.

At the time of forming the connection electrodes 60, the mask pattern for forming the connection electrodes 60 needs to be accurately placed, but the laminated chip package 100 can be manufactured even if the position adjustment of the mask pattern is roughly performed. Even with the rough position adjustment, the connection electrodes 60 connecting the vertically arranged plural end faces 15c or the vertically arranged plural end faces 16c can be formed.

More specifically, in the laminated chip package 100, since the extended terminal parts 15a and the extended terminal parts 16a are formed in the protruding shape, the end faces 15c and 16c appear as projecting end faces projecting upward from the surface 22c. Accordingly, in the laminated chip package 100, the alignment does not need to be performed with high accuracy when forming the connection electrodes 60. Therefore, the process after the device block 99 in the rectangular parallelepiped shape is obtained can be simplified, thereby simplifying the whole manufacturing process of the laminated chip package 100. Accordingly, the manufacturing time of the laminated chip package 100 can be reduced. This can increase the number of laminated chip packages 100 manufacturable in a unit time, resulting in a reduced manufacturing cost of the laminated chip package 100.

Further, because the semiconductor wafer 1 has the extended terminal parts 15a and 16a extending inside the groove parts 20, the end faces 15c and 16c are able to appear at the cut surfaces when the laminated semiconductor wafer 98 is cut along the groove parts 20. In other words, by cutting the laminated device wafer 98, in which the semiconductor wafers 1 are laminated, along the groove parts 20, the end faces 15c and 16c can be obtained.

Therefore, in case of using the semiconductor wafer 1, it is unnecessary to separately provide another process in order to make the wirings connecting to the device regions 10 appear at the cut surfaces. If the wiring electrodes 15 and 16 do not have the extended terminal parts 15a and 16a, the wiring electrodes 15 and 16 cannot be cut even by cutting the laminated semiconductor wafer 98 along the groove parts 20. Therefore, only by cutting the laminated semiconductor wafer 98 along the groove parts 20, the wirings connecting to the device regions 10 cannot be made to appear at the cut surfaces. Thus, in order to make such wirings appear at the cut surfaces, another process needs to be performed.

In contrast, in the case of using the semiconductor wafer 1, the end faces of the wiring electrodes 15 and 16 can be made to appear at the cut surfaces when the laminated semiconductor wafer 98 is cut along the groove parts 20, and therefore it is unnecessary to separately perform a process for making the wirings appear at the cut surfaces. Consequently, the manufacturing process of the laminated chip package can be further simplified by using the semiconductor wafer 1.

Further, the wiring electrodes 15 and 16 are formed to rise above the surface insulating layer 22. Therefore, when the end faces 15c and 16c appear at the cut surface, the end faces 15c located one above the other are arranged via the surface insulating layer 22 and the end faces 16c located one above the other are arranged via the surface insulating layer 22. Accordingly, a situation that the semiconductor chips located one on the other short-circuit can be prevented.

Consequently, the semiconductor wafer 1 is suitable for manufacturing the laminated chip package 100 which can realize the single side surface wiring. Further, an inspection to examine presence or absence of a defective device needs to be performed only on part of the cut surfaces of the semiconductor wafer 1. Accordingly, the process of manufacturing the laminated chip package could be further simplified by using the semiconductor wafer 1.

(Modified Example)

Continuously, the laminated semiconductor wafer 98A according to the modified example will be described. The above-described laminated semiconductor wafer 98, all of the eight semiconductor wafers 1, 1A to 1G have the electromagnetic shielding layer 19. However, as illustrated in FIG. 22, regarding the semiconductor wafer 1G in the rear side, since the device regions 10 are arranged in the outside more than the electromagnetic shielding layer 19, the device regions 10 are likely to take the influence of electromagnetic waves.

Figure 34:
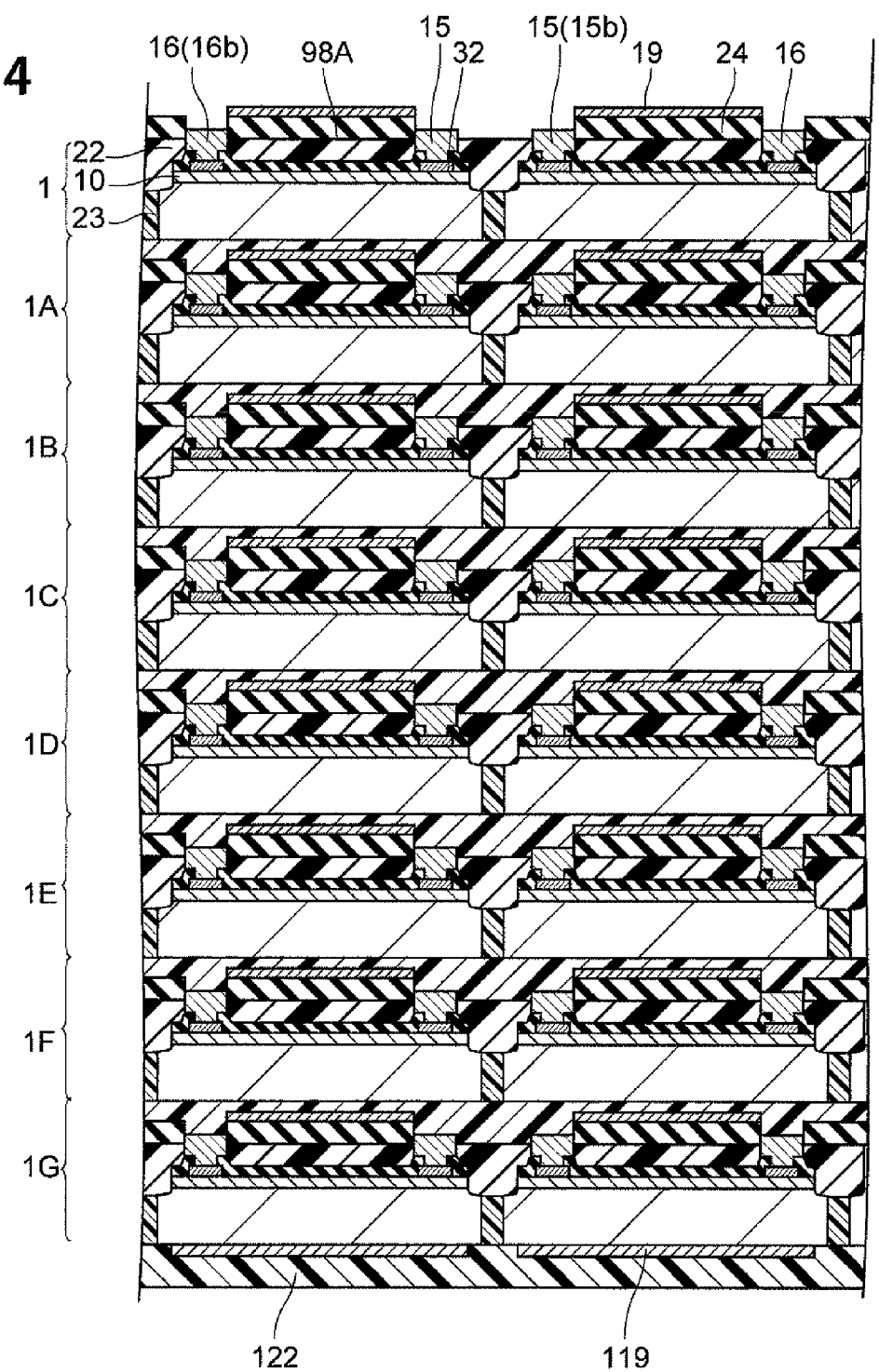
FIG. 34 is a sectional view illustrating a laminated semiconductor wafer according to a modified example, similar to FIG. 3.

Hence, when the electromagnetic shielding layer 19 is formed on the first surface 1a in all of eight semiconductor wafers 1, 1A to 1G as in the laminated semiconductor wafer 98, it is preferable to use a laminated semiconductor 98A illustrated in FIG. 34. The laminated semiconductor wafer 98A is different in that an electromagnetic shielding layer 119 and cover insulating layer 122 are added, as compared with the laminated semiconductor wafer 98. The electromagnetic shielding layer 119 is formed on the second surface 1b of the semiconductor wafer 1G as the lowermost substrate, and has the configuration as an added electromagnetic shielding layer in the present invention. In this laminated semiconductor wafer 98A, the electromagnetic shielding layer 119 is disposed outside more than the device regions 10. Therefore, it is possible to effectively shield against the electromagnetic waves entering from the rear surface side by the electromagnetic shielding layer 119 so that the effect of shielding against the electromagnetic waves is further enhanced.

Second Embodiment (Structures of Laminated Semiconductor Wafer 198)

Figure 35:
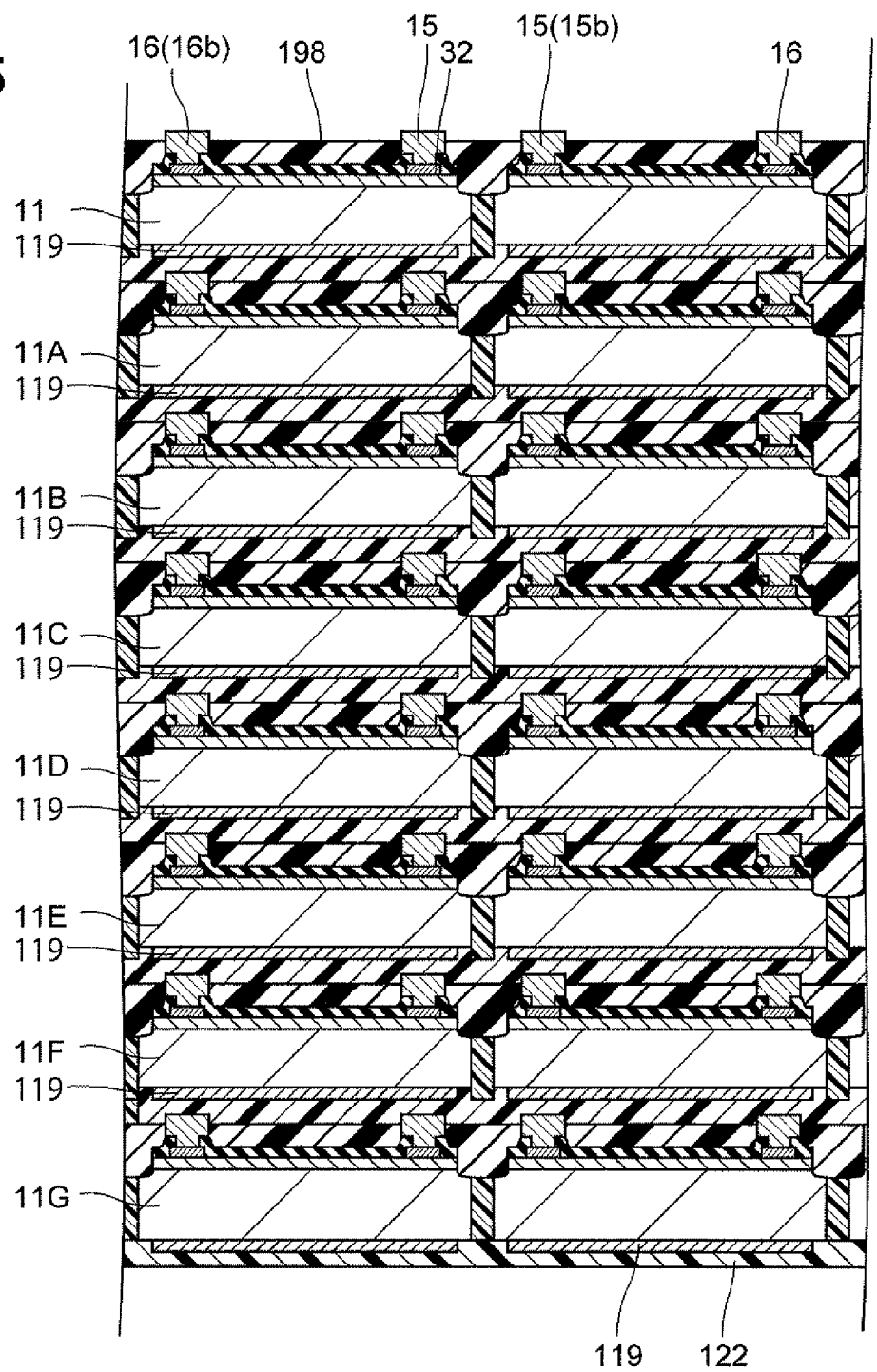
FIG. 35 is a sectional view illustrating a laminated semiconductor wafer according to a second embodiment of the present invention, similar to FIG. 3.

Continuously, a laminated semiconductor wafer 198 according to a second embodiment of the present invention will be described with reference to FIG. 35. Here, FIG. 35 is a sectional view illustrating a laminated semiconductor wafer 198, similar to FIG. 22.

The laminated semiconductor wafer 198 is different in that it is manufactured by using a semiconductor wafer 11, as compared with the laminated semiconductor wafer 98. A plurality of semiconductor wafers 11 are laminated in the laminated semiconductor wafer 198.

The semiconductor wafer 11 is different in that it has an electromagnetic shielding layer 119 in place of the electromagnetic shielding layer 19 and the electrode insulating layer 24, as compared with the semiconductor wafer 1. The electromagnetic shielding layer 119 is different in that it is formed on the second surface 1b, as compared with the electromagnetic shielding layer 19. The electromagnetic shielding layer 119 is also different in that it is formed not covering the plurality of device regions 10 from the outside but formed at corresponding positions corresponding to the plurality of device regions 10 of the second surface 1b, respectively. Further, as illustrated in FIG. 4, the groove parts 20 and 21 of the semiconductor wafer 11 have a wide-port structure similar to the semiconductor wafer 1.

In the laminated semiconductor wafer 98 according to the first embodiment, the semiconductor wafers 1 each including the electromagnetic shielding layer 19 on the first surface 1a (front side) are laminated. In contrast, in the laminated semiconductor wafer 198 according to the second embodiment, the semiconductor wafers 11 each including the electromagnetic shielding layer 119 on the second surface 1b (rear side) are laminated.

The locations, where the electromagnetic shielding layer 19 of the laminated semiconductor wafer 98 is formed, is different from the locations where the electromagnetic shielding layer 119 of the laminated semiconductor wafer 198 is formed. However, the laminated semiconductor wafer 98 and the laminated semiconductor wafer 198 are in common as a whole in that eight electromagnetic shielding layers 19 or 119 are formed at regular intervals. Therefore, the effects of shielding against the electromagnetic waves in both cases are equivalent. Further, in the semiconductor wafers 11A~11G, the device region 10 is sandwiched between two electromagnetic shielding layers 19, 119 so that the shielding effect is more effective. Also in this point, the laminated semiconductor wafer 198 is equivalent to the laminated semiconductor wafer 98. The electromagnetic shielding layers 119 have sizes corresponding to the respective device regions 10s and are formed at regions other than the corresponding parts corresponding to the wide width part 20b in the second surface 1b.

Figure 41:
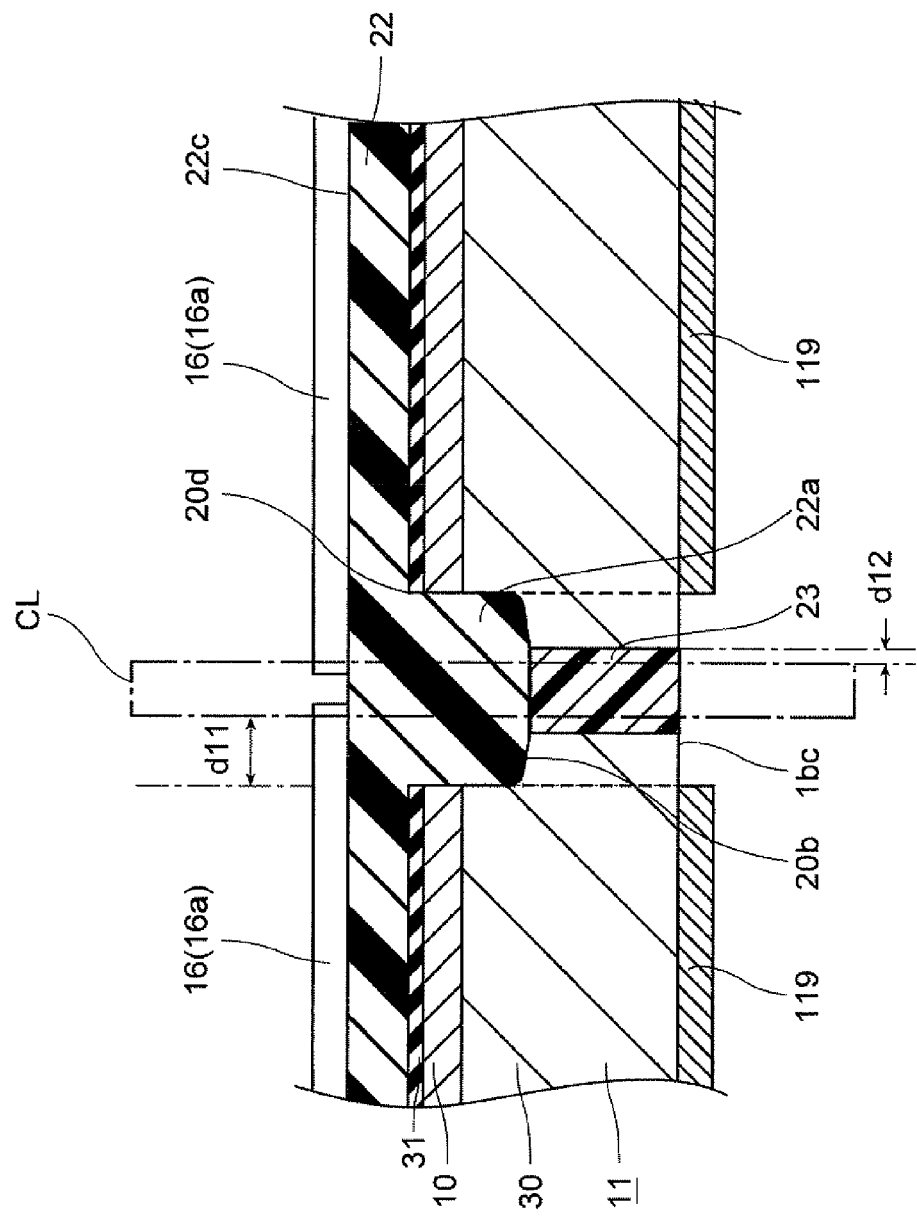
FIG. 41 is a sectional view illustrating a laminated semiconductor wafer in FIG. 35, similar to FIG. 6.

In the laminated semiconductor wafer 198, the electromagnetic shielding layer 119 is formed at the corresponding positions corresponding to the device regions 10. However, since the groove parts 20, 21 have the wide-width structure as illustrated also in FIG. 41, a space according to the above-described distance d11 can be secured between the cut surface and the device region 10 on the first surface 1a side when the laminated semiconductor wafer 198 is cut along the groove parts 20, 21. Therefore, the device region 10 never appears at the cut surface when the laminated semiconductor wafer 198 is cut along the groove parts 20, 21. Accordingly, the electromagnetic shielding layer 119 never appears at the cut surface even if the electromagnetic shielding layer 119 is formed at the corresponding position corresponding to the device region 10.

Accordingly, the laminated semiconductor wafer 198 can achieve, like the laminated semiconductor wafer 98, the effect of shielding against the electromagnetic waves for a long time from the wafer stage to the post-completion stage while avoiding the situation that the connection electrode is connected to the electromagnetic shielding layer 119.

(Method of Manufacturing Laminated Semiconductor Wafer 198)

Figure 36:
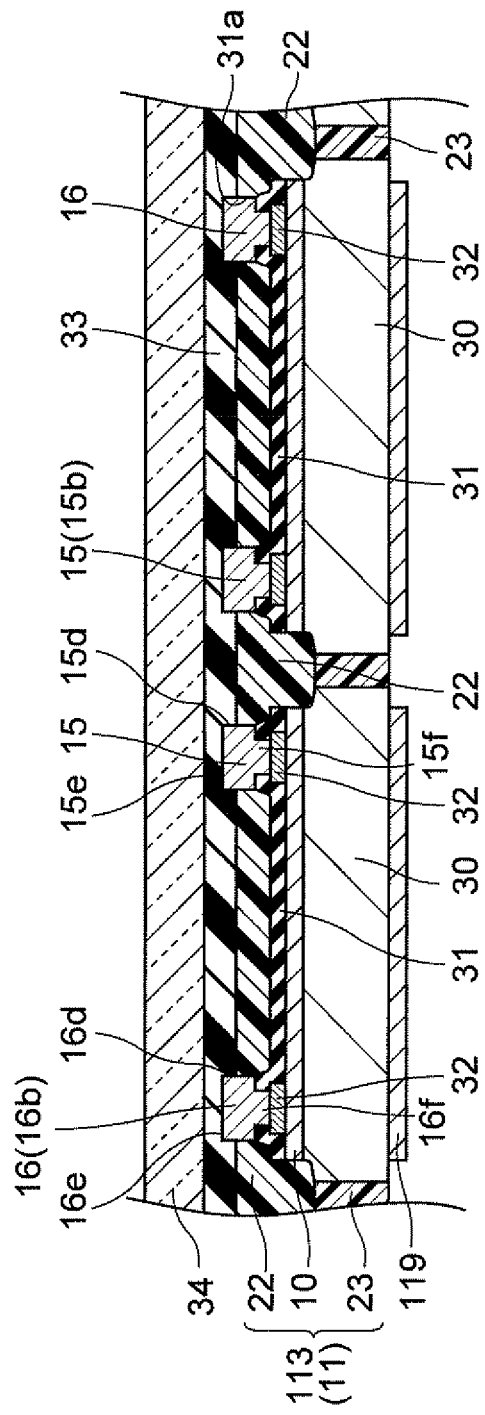
FIG. 36 is a sectional view similar to FIG. 3, illustrating the partially manufactured laminated semiconductor wafer and a base.

Subsequently, the method of manufacturing the laminated semiconductor wafer 198 will be described as follows. The groove part forming process, the insulating layer forming process, and the wiring electrode forming process are executed in the same procedure as that in manufacturing the laminated semiconductor wafer 98. Then, a unprocessed substrate 113 as illustrated in FIG. 36 is manufactured. This unprocessed substrate 113 is different in that it does not have the electrode insulating layer 24 and the electromagnetic shielding layer 19, as compared with the unprocessed substrate 5.

After the wiring electrode forming process is executed, the electromagnetic shielding layer forming process is executed. In this case, an insulating adhesive is first applied to the first surface 1a of the unprocessed substrate 113 to fix the unprocessed substrate 113 to the base 34. Then, the second surface 1b of the unprocessed substrate 113 is polished until the groove parts 20, 21 appear to reduce the thickness of the unprocessed substrate 113 as illustrated in FIG. 36.

After the second surface 1b is polished, the electromagnetic shielding layer 119 is formed in the regions corresponding to the device region 10 in the second surface 1b of the unprocessed substrate 113. The electromagnetic shielding layer 119 is formed, for example, by sputtering or the plating method using a soft magnetic material similarly to the electromagnetic shielding layer 19. By forming the electromagnetic shielding layer 119, the unprocessed substrate 113 becomes the semiconductor wafer 11. Since the semiconductor wafer 11 has the electromagnetic shielding layer 119, the semiconductor wafer 11 is a substrate with shielding layer.

Figure 37:
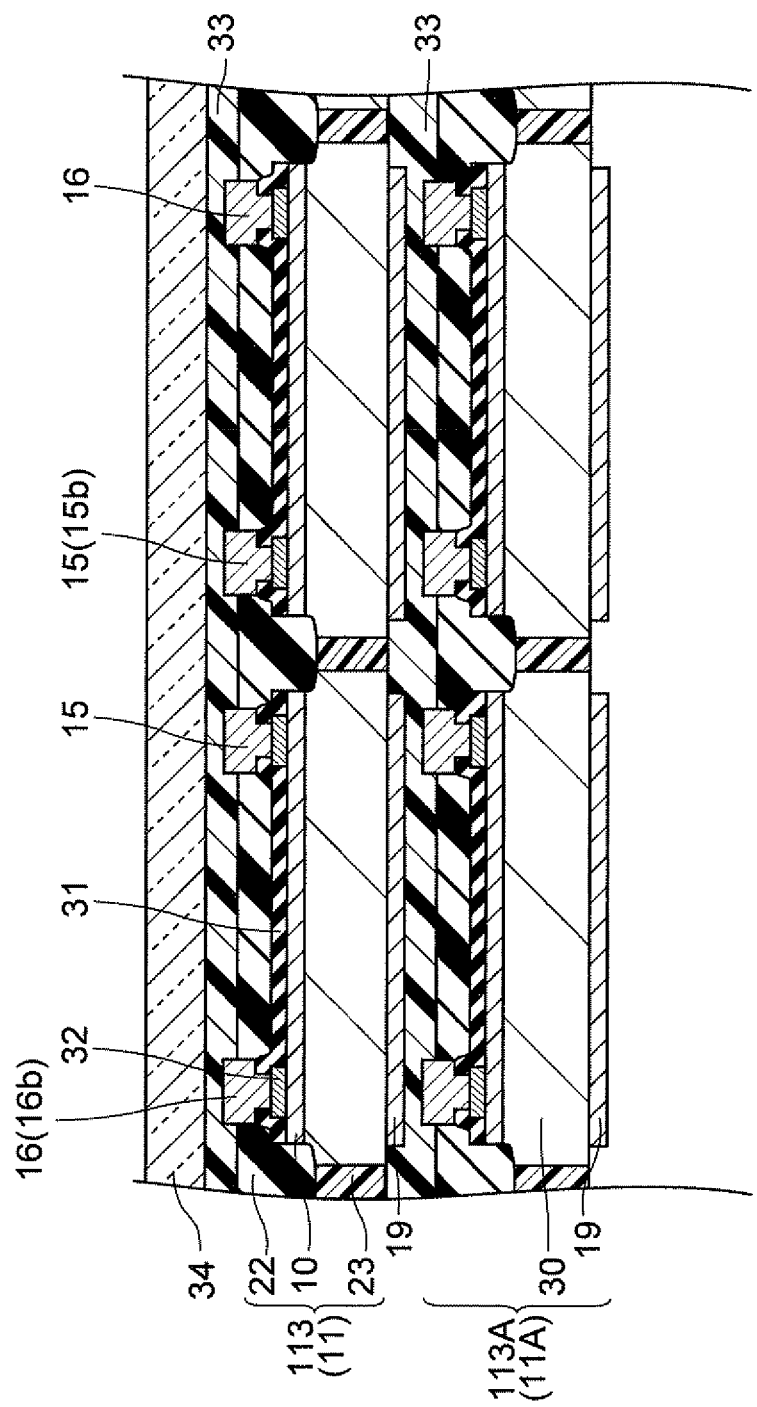
FIG. 37 is a sectional view similar to FIG. 3, illustrating the process subsequent to that in FIG. 36.

Subsequently, laminating process is performed. In the laminating process, another unprocessed wafer 113A is bonded to the second surface 1b side of the unprocessed wafer 113 as illustrated in FIG. 37 using an adhesive. In this event, position adjustment of the unprocessed wafer 113 and the unprocessed wafer 113A is performed such that the positions of the groove parts 20, 21 and the wiring electrodes 15, 16 of both of them coincide with each other. Then, the second surface 1b of the unprocessed wafer 113A is polished until the groove parts 20 and 21 appear. After that, the electromagnetic shielding layer 119 is formed on the second surface 1b of the unprocessed wafer 113A. Then, the unprocessed wafer 113A becomes to the semiconductor wafer 11A.

Further, another unprocessed wafers 113B to 113G are prepared. Then, for each of the unprocessed wafers 113B to 113G, a process of bonding it to the second surface 1b side of the laminated body and polishing it, further forming the electromagnetic shielding layer 119 is performed. Thereafter, when the base 34 and the adhesive layer 33 are removed about the semiconductor wafer 11, the laminated semiconductor wafer 198 is manufactured.

By cutting the laminated semiconductor wafer 198 along the groove parts 20, 21, laminated chip packages can be manufactured though not illustrated. This laminated chip package is different in that the electromagnetic shielding layer 119 is formed at the corresponding position corresponding to the device region 10 on the rear surface side of each semiconductor chip, as compared with the laminated chip package 100. The electromagnetic shielding layer 119 is formed in the region other than a corresponding part corresponding to the upper insulating layer 22a.

Further, in the laminated chip package 198, the end faces of the extended terminal parts 15a, 16a of all of the semiconductor chips are formed only in one wiring side surface of the four side surfaces as in the laminated chip package 100. Further, the connection electrodes are formed on the wiring side surface. The connection electrode connects the end faces of the extended terminal parts 15a or 16a across all of the semiconductor chips.

(Modified Example)

Continuously, the laminated semiconductor wafer 198A according to the modified example will be described. In the above-described laminated semiconductor wafer 198, all of the eight semiconductor wafers 11, 11A to 11G have the electromagnetic shielding layer 119. However, as illustrated in FIG. 35, regarding the semiconductor wafer 11 in the front side, since the device regions 10 are arranged in the outside more than the electromagnetic shielding layer 119, the device regions 10 are likely to take the influence of electromagnetic waves.

Figure 38:
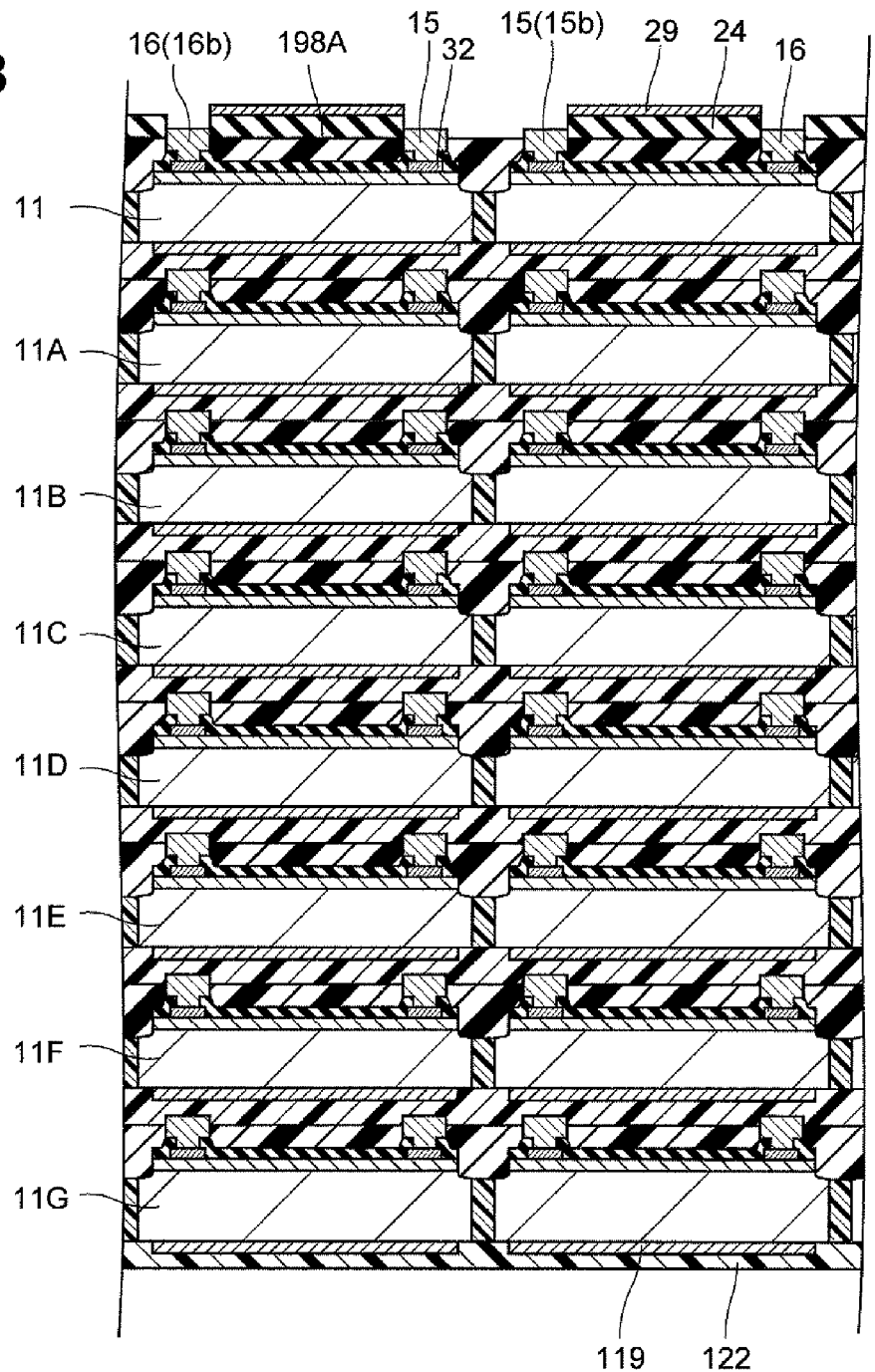
FIG. 38 is a sectional view illustrating a laminated semiconductor wafer according to a modified example, similar to FIG. 3.

Hence, when the electromagnetic shielding layer 119 is formed on the second surface 1b in all of the eight semiconductor wafers 11, 11A to 1G as in the laminated semiconductor wafer 198, it is preferable to use a laminated semiconductor wafer 198A illustrated in FIG. 38. The laminated semiconductor wafer 198A is different in that an electromagnetic shielding layer 29 is added, as compared with the laminated semiconductor wafer 198. The electromagnetic shielding layer 29 is formed on the first surface 1a of the semiconductor wafer 11 as the uppermost substrate, and has the configuration as an added electromagnetic shielding layer in the present invention. In this laminated semiconductor wafer 198A, the electromagnetic shielding layer 29 is disposed outside more than the device regions 10. Therefore, it is possible to effectively shield against the electromagnetic waves entering from the front surface side by the electromagnetic shielding layer 29 so that the effect of shielding against the electromagnetic waves is further enhanced.

Other Embodiments

In the above-described laminated semiconductor wafers 98, 198, the electromagnetic shielding layer 19 or the electromagnetic shielding layer 119 is formed on one of the first surface 1a and the second surface 1b of each of the semiconductor wafers. In short, a single surface shielding-type semiconductor wafers in each of which the shielding layer is formed on the single surface are laminated.

Figure 39:
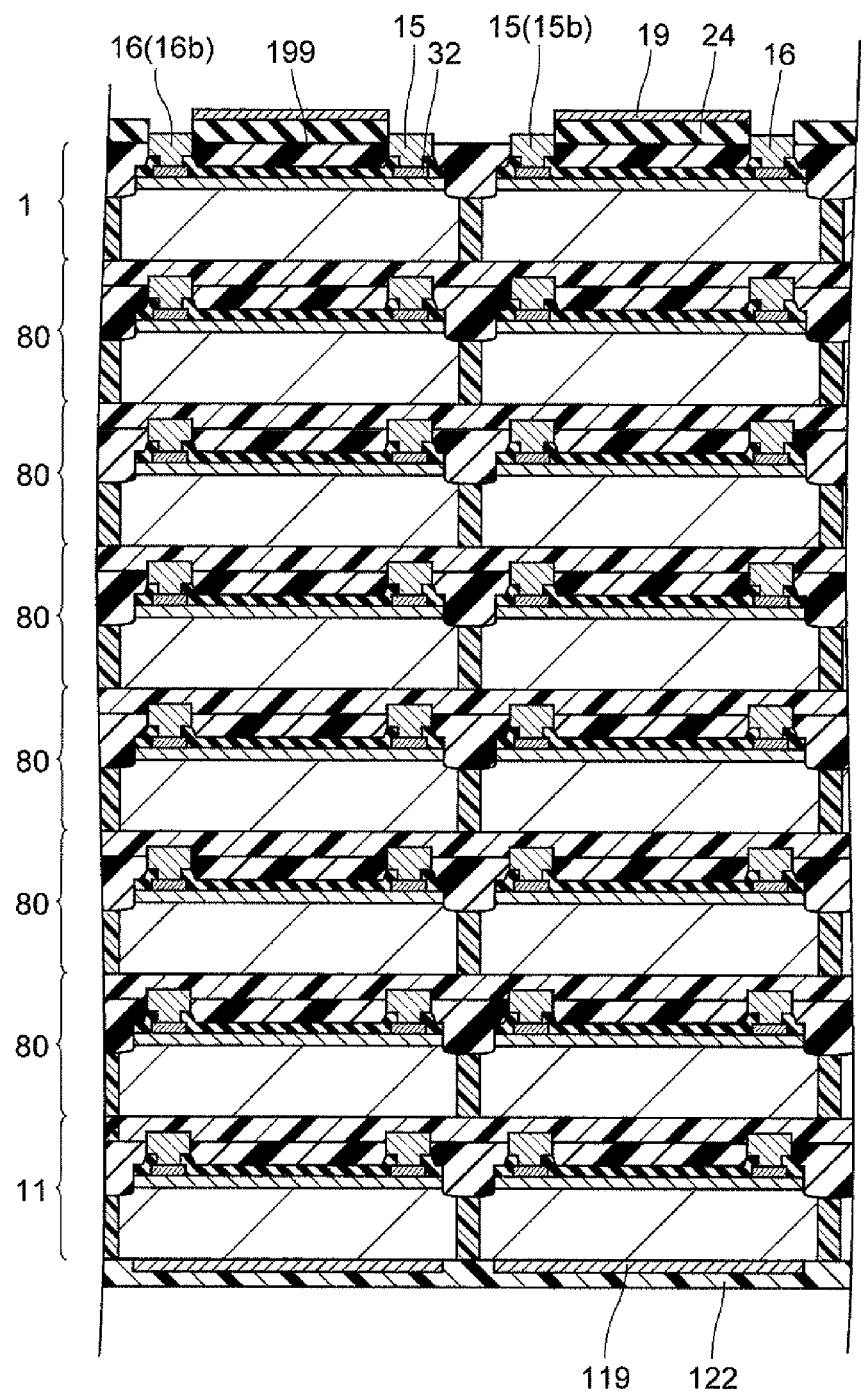
FIG. 39 is a sectional view illustrating a laminated semiconductor wafer according to another embodiment, similar to FIG. 3.

In a laminated semiconductor wafer 199 illustrated in FIG. 39, the uppermost substrate placed on the top side is the semiconductor wafer 1 and the lowermost substrate placed on the bottom side is the semiconductor wafer 11, between the semiconductor wafer 1 and the semiconductor wafer 11, substrates without shielding layer 80 are laminated. In the laminated semiconductor wafer 199, only two of eight semiconductor wafers are the substrates with shielding layer, and the remaining substrates between them are the substrates without shielding layer 80. In the laminated semiconductor wafer 199, the semiconductor wafers 1, 11 as the substrates with shielding layer are placed on the outermost sides.

In manufacturing the laminated semiconductor wafer 199, the semiconductor wafer 1 is manufactured first. The semiconductor wafer 1 has the electromagnetic shielding layer 19. Therefore, even if the substrate without shielding layer 80 is laminated under the semiconductor wafer 1, the shielding effect during the manufacture can be achieved by the electromagnetic shielding layer 19 of the semiconductor wafer 1. Further, since the semiconductor wafer 11 laminated last has the electromagnetic shielding layer 119, the electromagnetic shielding layers 19, 119 are placed on both of top and bottom sides of the laminated semiconductor wafer 199. Therefore, it is possible to shield against the electromagnetic waves which can enter from the outside. The electromagnetic shielding layer 19 and the electromagnetic shielding layer 119 are formed on both of top and bottom sides respectively so that the shielding effect is enhanced. It is conceivable that a sufficient shielding effect can be achieved as long as the uppermost substrate and the lowermost substrate are the substrates with shielding layer, as in the laminated semiconductor wafer 199.

Figure 40:
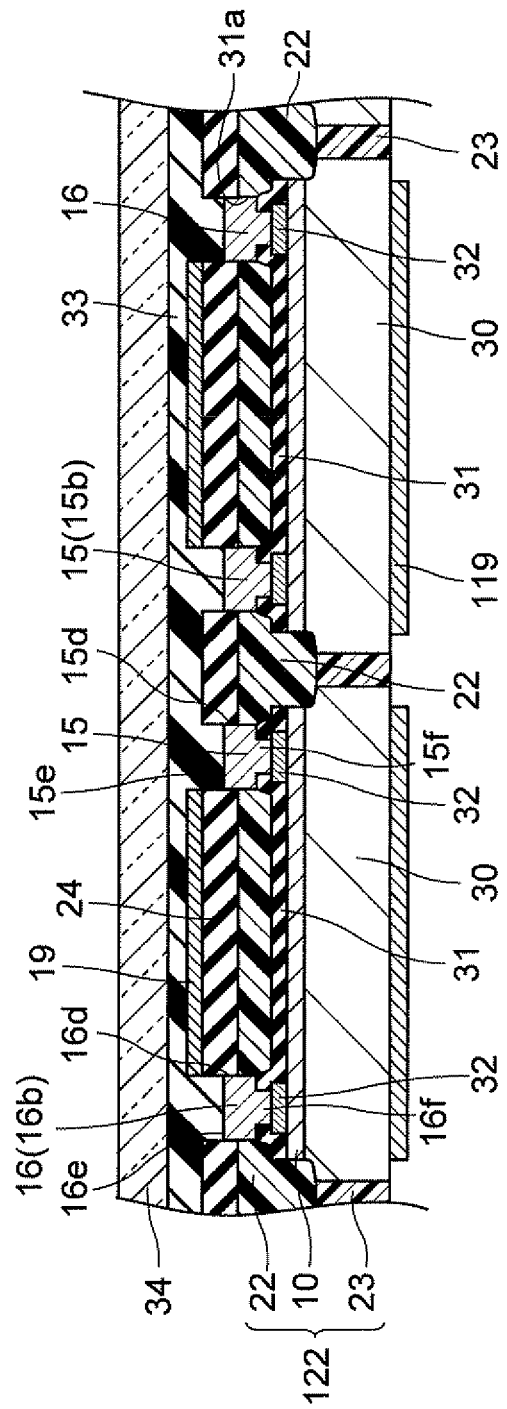
FIG. 40 is a sectional view similar to FIG. 3, illustrating the partially manufactured another laminated semiconductor wafer and a base.

Alternatively, the electromagnetic shielding layer 19 and the electromagnetic shielding layer 119 may be formed on the first surface 1a and the second surface 1b respectively as in a semiconductor wafer 122 illustrated in FIG. 40. By laminating both surface shielding-type semiconductor wafers in each of which the shielding layers are formed on both surfaces as in the semiconductor wafer 122, a laminated semiconductor wafer is able to also be formed. With this configuration, the effect of shielding against the electromagnetic waves can be further enhanced.

Other Embodiments

Figure 27:
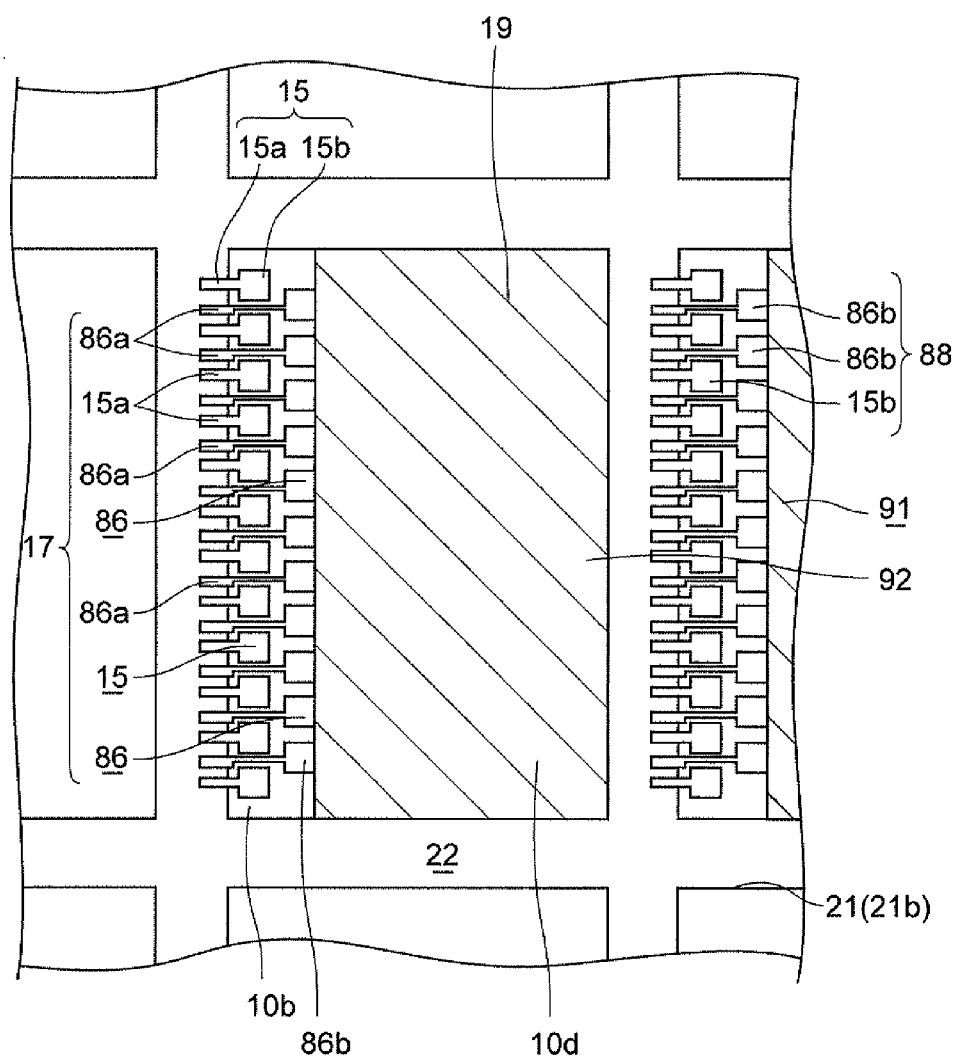
FIG. 27 is a plan view illustrating a device region and a region surrounding it formed in the laminated semiconductor wafer having a wiring electrode different from a wiring electrode in FIG. 2.

A laminated semiconductor wafer is able to be formed by laminating a semiconductor wafer 91 illustrated in FIG. 27 in place of the semiconductor wafer 1.

The semiconductor wafer 91 is different in that it has a device region 92 in place of the device region 10 and that it has wiring electrodes 86 in place of the wiring electrodes 16, as compared with the semiconductor wafer 1. Besides, the semiconductor wafer 91 is also different in that it is not set the pad-zone 10c, as compared with the semiconductor wafer 1. In case of semiconductor wafer 91, the shielding region 10d is set on a region which only the extending zone 10b is excluded.

The device region 92 is different from the device region 10 in that the wiring electrodes 86 are formed as well as the wiring electrodes 15.

The wiring electrode 86 is made of a conductive material such as Cu or the like, and has an extended terminal portion 86a and a rectangular electrode pad 86b. The extended terminal portion 86a and the electrode pad 86b of the wiring electrode 86 are formed along a part of the outer periphery of the device region 92, similarly to the wiring electrode 15. Thus, in the device region 92, the wiring electrodes 15 and 86 form the same wiring electrode group 17 as in the device region 10, and additionally, all of their electrode pads 15b and 86b are gathered to a single side of the device region 92. In such a manner, the wiring electrodes 15 and 86 form a gathered pad group 88 in the device region 92.

In the semiconductor wafer 1 according to the first embodiment, the extended terminal portion 16a of the wiring electrode 16 is formed across the device region 10. Therefore, a certain length of the extended terminal portion 16a needs to be secured in the semiconductor wafer 1.

On the other hand, in the semiconductor wafer 91, the extended terminal portions 86a are formed along a part of the outer periphery of the device region 92, so that the length of the extended terminal portion 86a can be made smaller than that of the extended terminal portion 16a. In the semiconductor wafer 91, the length of the extended terminal portion 86a is reduced to allow more quick access to the device region 92. Further, the amount of plating or the like required for forming the wiring electrodes 86 can be reduced as compared to the case of forming the wiring electrodes 16, resulting in a reduced cost.

In addition, the semiconductor wafer 91 can be used to simplify the manufacturing process of the laminated chip package which can realize the single side surface wiring, as with the semiconductor wafer 1. Further, the respective semiconductor wafers 91 have the electromagnetic shielding layer 19. Therefore, the laminated semiconductor wafer manufactured using the respective semiconductor wafers 91 can also achieve the effect of shielding against the electromagnetic waves for a long time while avoiding the situation that the electromagnetic shielding layer 19 is connected to the connection electrode 60. The laminated semiconductor wafer sufficiently avoid the influence of the electromagnetic waves.

Figure 31:
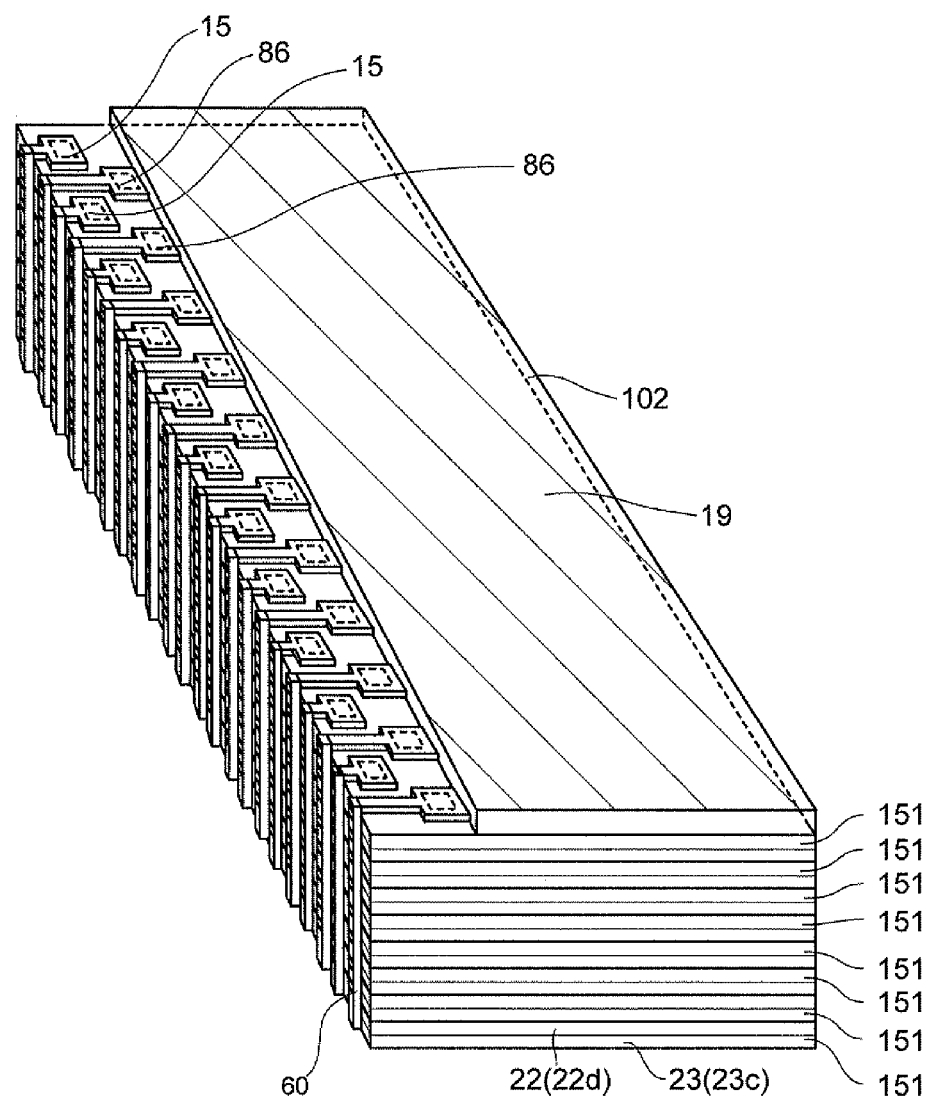
FIG. 31 is a perspective view illustrating another laminated chip package.

A laminated chip package 102 as illustrated in FIG. 31 is able to be manufactured by using the semiconductor wafer 91. In the laminated chip package 102, a plurality of semiconductor chips 151 are laminated. The respective semiconductor chips 151 have the electromagnetic shielding layer 19.

(Method of Manufacturing Semiconductor Wafer)

When the semiconductor wafer 91 is manufactured, before the formation of the wiring electrodes 15 and 86, process similar to the manufacturing the semiconductor wafer 1 are performed. Thereafter, the wiring electrodes 15 and 86 are formed in shapes including the above-described extended terminal portions 15a and 86a. The wiring electrodes 15 and 86 can be formed by the procedure similar to that of the semiconductor wafer 1. The electromagnetic shielding layer 19 also can be formed by the procedure similar to that of the semiconductor wafer 1.

Other Embodiments

Figure 28:
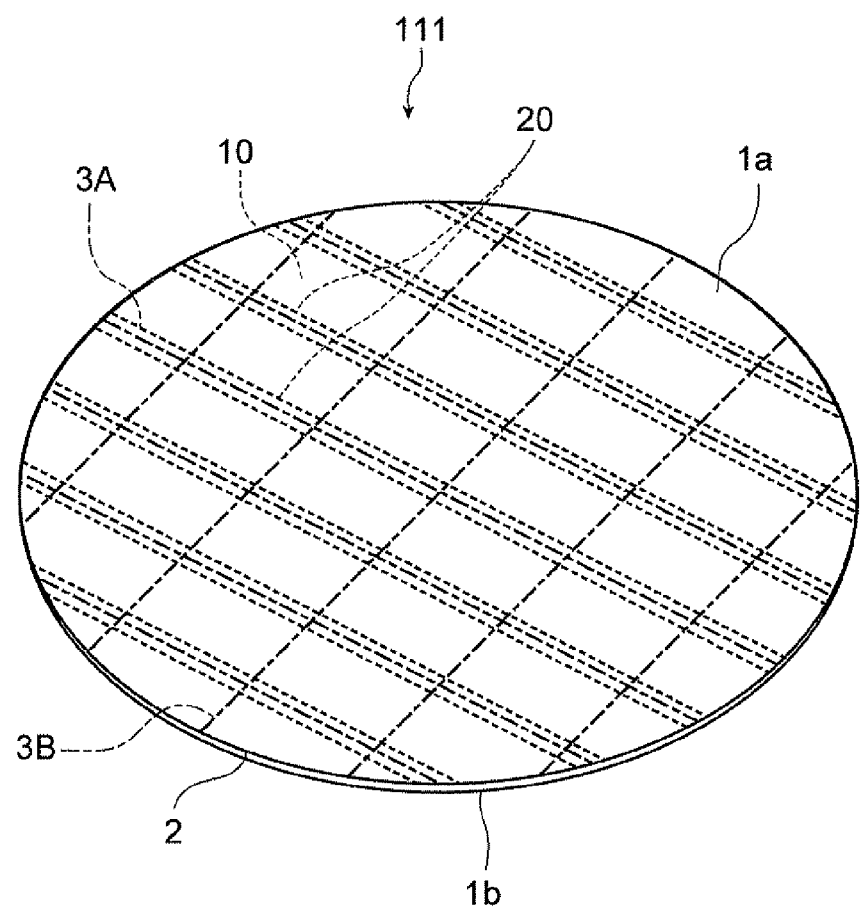
FIG. 28 is a perspective view illustrating the entire another semiconductor wafer.
Figure 29:
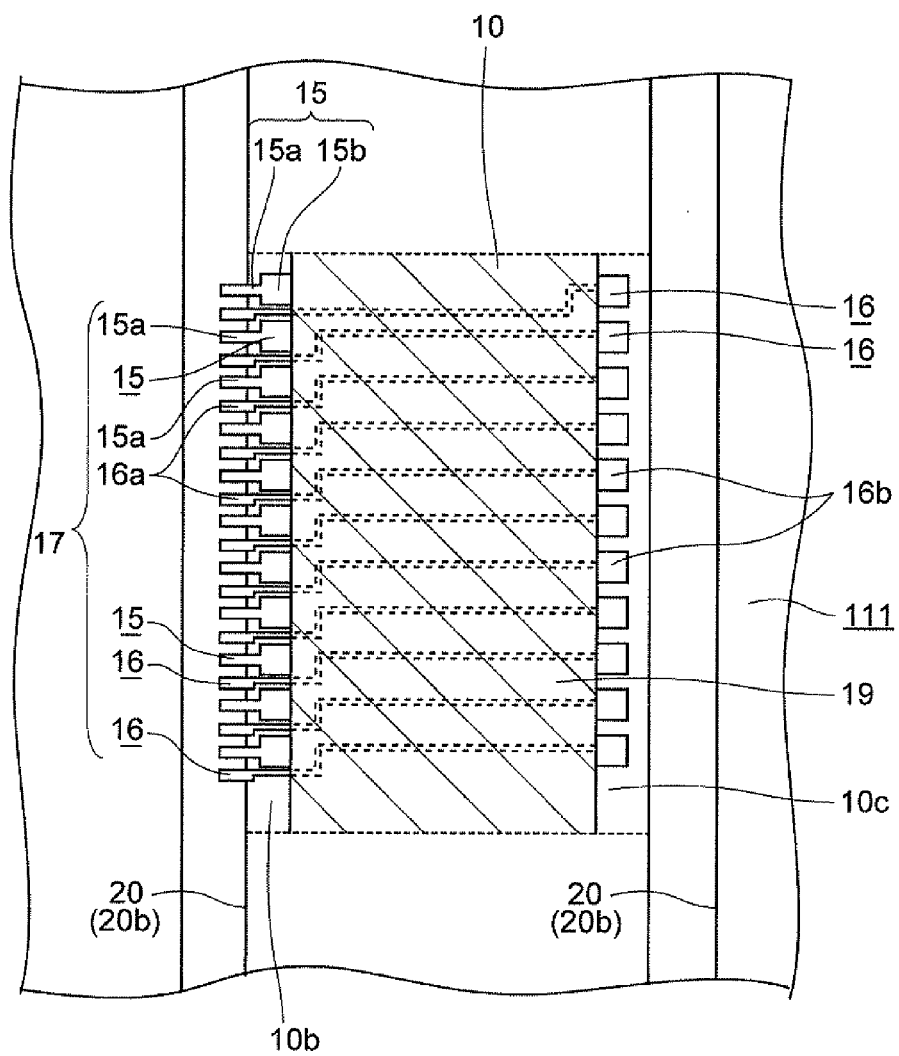
FIG. 29 is a plan view illustrating a device region and a region surrounding it formed in a semiconductor wafer in FIG. 28.

A semiconductor wafer 111 will be described with reference to FIG. 28 and FIG. 29. In the semiconductor wafer 1 according to the first embodiment, the groove parts 20 and 21 are formed. The semiconductor wafer 111 is different from the semiconductor wafer 1 in that groove parts 21 are not formed but only groove parts 20 are formed. Accordingly, the semiconductor wafer 111 is formed such that a plurality of groove parts 20 are arranged at regular intervals and the groove parts are formed in the shape of stripes not intersecting with each other.

Figure 30:
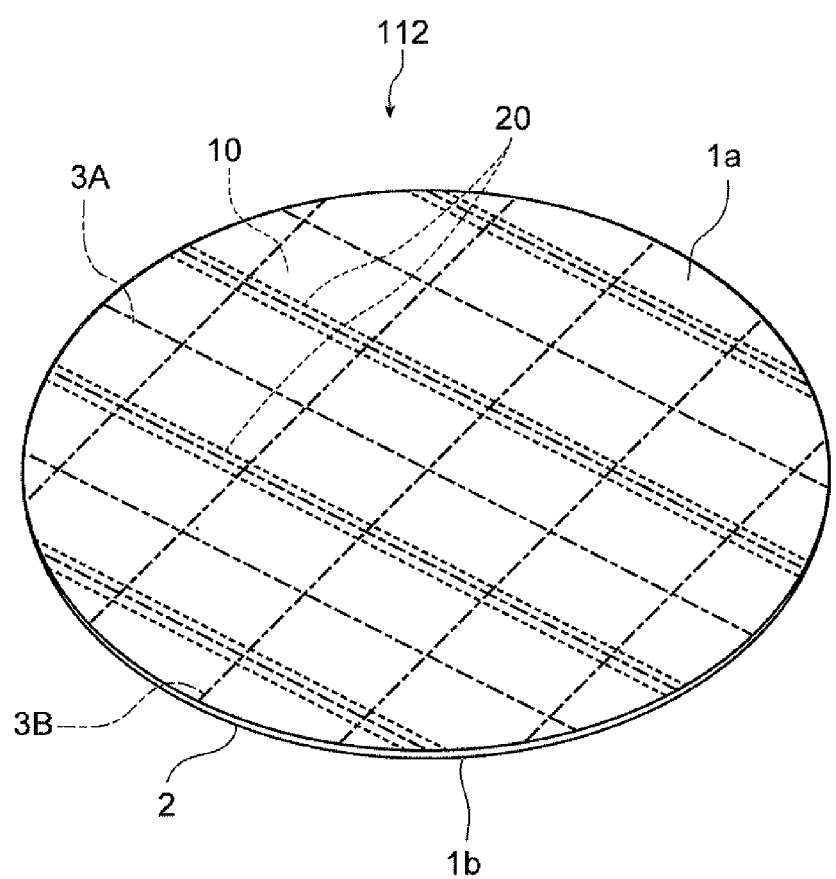
FIG. 30 is a perspective view illustrating the entire still another semiconductor wafer.

Next, a semiconductor wafer 112 illustrated in FIG. 30 is the same as the semiconductor wafer 111 in that only groove parts 20 are formed, but the groove part 20 is formed along every other scribe line 3A.

In the semiconductor wafer 1, the device region 10 is in contact with the four groove parts 20 and 21, so that the device region 10 is in contact with the groove parts 20 and 21 in the four directions, that is, upper, lower, right and left directions. Accordingly, as illustrated in FIG. 23, the semiconductor chip 50 manufactured from the semiconductor wafer 1 is covered by an insulating layer of double-layer structure at the four side surfaces.

Figure 32:
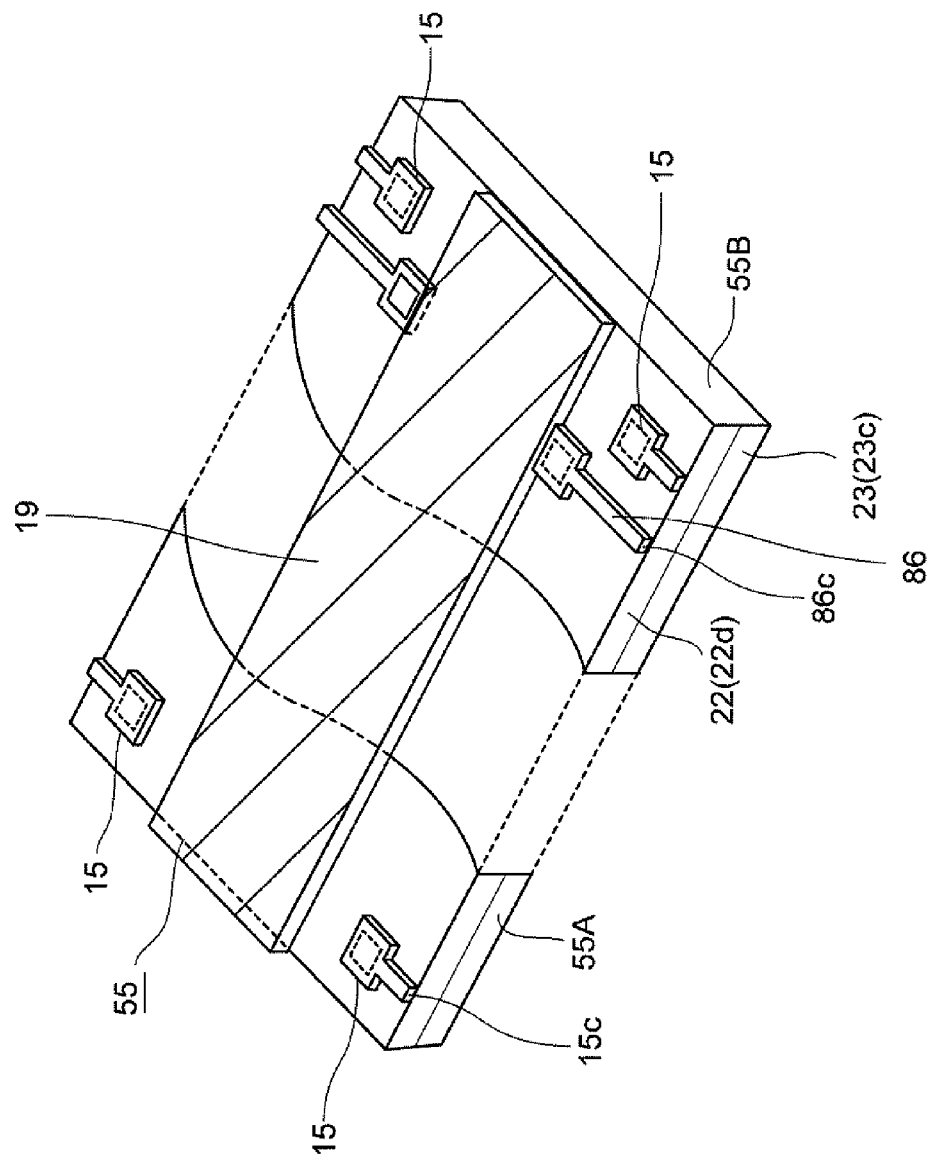
FIG. 32 is a perspective view illustrating another semiconductor chip.

In contrast, in the semiconductor wafer 111, the device region 10 is in contact with the groove parts 20 only in the two, that is, right and left directions. Accordingly, a semiconductor chip 55 using the semiconductor wafer in which the groove parts are formed in the shape of stripes as in the semiconductor wafer 111 is as illustrated in FIG. 32. The semiconductor chip has two sets of opposite side surfaces, that is, a side surface 55A and a side opposite thereto and a side surface 55B and a side opposite thereto, which are structured such that only the side surface 55A and the side opposite thereto are covered by the insulating layer of double-layer structure but the side surface 55B and the side opposite thereto are not covered by the insulating layer of double-layer structure.

Further, the semiconductor chip 55 is formed such that the wiring end faces 15c and 86c of the wiring electrodes 15 and 86 are formed in both of two opposite side surfaces 55A. Though not illustrated, when the semiconductor chip 55 are laminated, the laminated chip package can be obtained by forming connection electrodes on the opposite two side surfaces. This laminated chip package has a both-side wiring structure in which the connection electrodes are formed on both of the opposite faces. However, the electromagnetic shielding layers 19 do not appear on the both side surfaces.

In the semiconductor wafer 112, the device region 10 is in contact with the groove part 20 only in any one of right and left directions. Therefore, when the semiconductor wafer in which the groove part is formed along every other scribe line as in the semiconductor wafer 112 is used, the end faces of the wiring electrodes and the insulating layer of double-layer structure appear only one of the side surfaces in the semiconductor chip. The other side surfaces are not covered by the insulating layer of double-layer structure.

Though the wiring electrodes 15, 16 have the protruding structure in the above embodiments. The present invention is also applicable to a semiconductor substrate including wiring electrodes that do not have the protruding structure. Further, terminal parts in a structure across the groove part may be formed in adjacent two device regions 10 in place of the extended terminal parts 15*a*, 16*a*. Furthermore, the scribe-groove part may not have the wide-port structure, unlike the groove part 20, 21.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A laminated semiconductor wafer, comprising:
a plurality of semiconductor substrates having a plurality of scribe-groove parts formed along scribe lines,
each of the plurality of semiconductor substrates including:
a plurality of device regions insulated from each other, each of which is in contact with at least one of the plurality of scribe-groove parts and has a semiconductor device formed therein;
a wiring electrode connected to the semiconductor device formed in each of the device regions and extending from the device region to the inside of the scribe-groove part,
wherein when a part, in a peripheral edge part of the device region along the scribe-groove part, which the wiring electrode crosses is an extending zone, each of an uppermost substrate laminated on the top side and a lowermost substrate laminated on the bottom side in the plurality of semiconductor substrates has an electromagnetic shielding layer formed using a ferromagnetic body, and the electromagnetic shielding layer is formed in a shielding region except the extending zone on a first surface, in surfaces of the semiconductor substrate, where the plurality of device regions are formed.

2. The laminated semiconductor wafer according to claim 1,
wherein the wiring electrode has an extended terminal part extending from the device region to the inside of the scribe-groove part, and an electrode pad wider in width than the extended terminal part disposed in the device region and formed at a part of the extended terminal part, and
wherein when a part, in the peripheral edge part, where the electrode pad is disposed is a pad zone, a region of the first surface except the extending zones and the pad zones are set to be the shielding regions.

3. The laminated semiconductor wafer according to claim 1,
wherein all of the plurality of semiconductor substrates including the uppermost substrate and the lowermost substrate each have the electromagnetic shielding layer, and
wherein in all of the plurality of semiconductor substrate, the electromagnetic shielding layer has individual structures individually covering all of the plurality of device regions from the outside and separated from one another.

4. The laminated semiconductor wafer according to claim 3, further comprising:
an added electromagnetic shielding layer formed using a ferromagnetic body on a second surface on the rear surface side of the first surface in the lowermost substrate.

5. The laminated semiconductor wafer according to claim 1,
wherein the plurality of scribe-groove parts have a wide-port structure in which a wide width part wider in width than a groove lower part including a bottom part is formed at an inlet port thereof,
wherein the plurality of semiconductor substrates each comprising: an insulating layer formed by filling the plurality of scribe-groove parts with a resin with no space, wherein the insulating layer has a double-layer structure in which a lower insulating layer formed inside the groove lower part and an upper insulating layer formed inside the wide width part are laminated, and the lower insulating layer is formed using a low-viscosity resin lower in viscosity than the resin forming the upper insulating layer.

6. The laminated semiconductor wafer according to claim 1,
wherein the electromagnetic shielding layer is formed using a soft magnetic material.

7. A laminated semiconductor wafer, comprising:
a plurality of semiconductor substrates having a plurality of scribe-groove parts formed along scribe lines,
each of the plurality of semiconductor substrates including:
a plurality of device regions insulated from each other, each of which is in contact with at least one of the plurality of scribe-groove parts and has a semiconductor device formed therein;
a wiring electrode connected to the semiconductor device formed in each of the device regions and extending from the device region to the inside of the scribe-groove part,
wherein each of an uppermost substrate laminated on the top side and a lowermost substrate laminated on the bottom side in the plurality of semiconductor substrates has an electromagnetic shielding layer formed using a ferromagnetic body, and the electromagnetic shielding layer is formed at corresponding positions respectively corresponding to the plurality of device regions in a second surface in surfaces of the semiconductor substrate, the second surface is a surface of the rear surface side of a first surface where the plurality of device regions are formed.

8. The laminated semiconductor wafer according to claim 7,
wherein the plurality of scribe-groove parts have a wide-port structure in which a wide width part wider in width than a groove lower part including a bottom part is formed at an inlet port thereof.

9. The laminated semiconductor wafer according to claim 8, wherein the electromagnetic shielding layer has a size according to the respective plurality of device regions and is formed in regions other than corresponding parts of the second surface, the corresponding parts is corresponding to the wide width parts of the scribe-groove parts.

10. A laminated chip package, comprising:
a plurality of semiconductor chips having a semiconductor device,
each of the plurality of semiconductor chips including:
a resin insulating layer made of an insulating resin formed to surround the semiconductor chip;
a device region inside the resin insulating layer having the semiconductor device formed therein; and
a wiring electrode connected to the semiconductor device and extending from the device region to the upside of the resin insulating layer,
wherein when a part, in a peripheral edge part of the device region along the resin insulating layer, which the wiring electrode crosses is an extending zone, each of an uppermost chip laminated on the top side and a lowermost chip laminated on the bottom side of the plurality of semiconductor chips has an electromagnetic shielding layer formed using a ferromagnetic body, and the electromagnetic shielding layer is formed in a shielding region except the extending zone on a first surface, in surfaces of the semiconductor chip, where the device region is formed.

11. The laminated chip package according to claim 10,
wherein the wiring electrode has an extended terminal part extending from the device region to the inside of the scribe-groove part, and an electrode pad wider in width than the extended terminal part disposed in the device region and formed at a part of the extended terminal part, and
wherein when a part, in the peripheral edge part, where the electrode pad is disposed is a pad zone, a region on the first surface except the extending zones and the pad zones are set to be the shielding regions.

12. The laminated chip package according to claim 10,
wherein all of the plurality of semiconductor chips including the uppermost chip and the lowermost chip each have the electromagnetic shielding layer, and
wherein in all of the plurality of semiconductor chip, the electromagnetic shielding layer has individual structures individually covering all of the plurality of device regions from the outside and separated from one another.

13. The laminated chip package according to claim 10,
wherein all of the plurality of semiconductor chips are arranged such that the extending zones face at least one wiring side surface of a plurality of side surfaces, end faces of the extended terminal parts in all of the plurality of semiconductor chips are formed in the wiring side surface, and the laminated chip package further comprises a connection electrode connecting the end faces arranged in a laminated direction in which the plurality of semiconductor chips are laminated, across all of the plurality of semiconductor chips.

14. A laminated chip package, comprising:
a plurality of semiconductor chips having a semiconductor device,
each of the plurality of semiconductor chips including:
a resin insulating layer made of an insulating resin formed to surround the semiconductor chip;
a device region inside the resin insulating layer having the semiconductor device formed therein; and
a wiring electrode connected to the semiconductor device and extending from the device region to the upside of the resin insulating layer,
wherein each of an uppermost chip laminated on the top side and a lowermost chip laminated on the bottom side of the plurality of semiconductor chips has an electromagnetic shielding layer formed using a ferromagnetic body, and the electromagnetic shielding layer is formed at a corresponding position corresponding to the device region in a second surface in surfaces of the semiconductor chip, the second surface is a surface of the rear surface side of a first surface where the device region is formed.

15. The laminated chip package according to claim 14,
wherein the resin insulating layer has a double-layer structure in which an upper insulating layer is laminated on a lower insulating layer, and the lower insulating layer is formed using a low-viscosity resin lower in viscosity than the resin forming the upper insulating layer.

16. The laminated chip package according to claim 15,
wherein the electromagnetic shielding layer has a size according to the device region and is formed in a region other than a corresponding part corresponding to the upper insulating layer on the second surface.

17. The laminated chip package according to claim 14,
wherein end faces of the extended terminal parts in all of the plurality of semiconductor chips are formed in at least one wiring side surface of a plurality of side surfaces, and the laminated chip package further comprises a connection electrode connecting the end faces arranged in a laminated direction in which the plurality of semiconductor chips are laminated, across all of the plurality of semiconductor chips.

18. A method of manufacturing a laminated semiconductor substrate, comprising:
a groove part forming step of forming a plurality of scribe-groove parts along scribe lines in a first surface where semiconductor devices are formed, in all of a plurality of unprocessed substrates having the semiconductor devices formed thereon;
a wiring electrode forming step of forming a wiring electrode connected to the semiconductor device and extending from the device region in contact with at least one of the plurality of scribe-groove parts to the inside of the scribe-groove part;
an electromagnetic shielding layer forming step of forming,
when a part, in a peripheral edge part of the device region along the scribe-groove part, which the wiring electrode crosses is an extending zone,
an electromagnetic shielding layer in surfaces of the unprocessed substrate where the plurality of device regions are formed using a ferromagnetic body in shielding regions,
wherein the electromagnetic shielding layer is formed in at least two of the plurality of unprocessed substrates, and
the electromagnetic shielding layer is not formed on the extending zones on the first region; and
a lamination step of laminating the plurality of unprocessed substrates such that substrates with shielding layer having the electromagnetic shielding layer in the unprocessed substrates are arranged on the top and the bottom respectively.

19. The method of manufacturing a laminated semiconductor substrate according to claim 18, wherein in the wiring electrode forming step, the wiring electrode is formed such that an extended terminal part extending from the device region to the inside of the scribe-groove part and an electrode pad wider in width than the extended terminal part are arranged within the device region, and wherein in the electromagnetic shielding layer forming step, the electromagnetic shielding layer is formed so that a region except a pad zone and the extending zone, the pad zone is a part of the peripheral edge part where the electrode pad is formed, is set the shielding regions.

20. A method of manufacturing a laminated semiconductor substrate, comprising:
- a groove part forming step of forming a plurality of scribe-groove parts along scribe lines in a first surface where semiconductor devices are formed, in all of a plurality of unprocessed substrates having the semiconductor devices formed thereon;
- a wiring electrode forming step of forming a wiring electrode connected to the semiconductor device and extending from the device region in contact with at least one of the plurality of scribe-groove parts to the inside of the scribe-groove part;
- an electromagnetic shielding layer forming step of polishing a second surface on the rear surface side of the first surface where the device regions are formed until the scribe-groove parts appear, and then forming an electromagnetic shielding layer using a ferromagnetic body at corresponding positions respectively corresponding to the plurality of device regions in the second surface, in at least two of the plurality of unprocessed substrates; and
- a lamination step of laminating the plurality of unprocessed substrates such that substrates with shielding layer having the electromagnetic shielding layer in the plurality of unprocessed substrates are arranged on the top and the bottom respectively.

21. The method of manufacturing a laminated semiconductor substrate according to claim 20,
wherein in the groove part forming step, when the plurality of scribe-groove parts are formed, a plurality of first groove parts each having a first width and a first depth are formed along the scribe lines, and then a second groove parts each having a second width larger than the first width and a second depth smaller than the first depth are formed at inlet ports of the plurality of first groove parts.

22. A method of manufacturing a laminated chip package, comprising:
- a cutting step of cutting the laminated semiconductor substrate manufactured by the manufacturing method according to claim 18 along the scribe-groove parts to cause resin insulating layers made of an insulating resin and the wiring electrode to appear in a cut surface; and
- a connection electrode forming step of forming a connection electrode connecting the wiring electrodes arranged in a laminated direction in which the plurality of unprocessed substrates are laminated, across all of the plurality of unprocessed substrates.

* * * * *